United States Patent
Khosravan et al.

(10) Patent No.: US 11,830,135 B1
(45) Date of Patent: Nov. 28, 2023

(54) AUTOMATED BUILDING IDENTIFICATION USING FLOOR PLANS AND ACQUIRED BUILDING IMAGES

(71) Applicant: MFTB Holdco, Inc., Seattle, WA (US)

(72) Inventors: Naji Khosravan, Seattle, WA (US); Lichen Wang, Bellevue, WA (US); Sing Bing Kang, Redmond, WA (US)

(73) Assignee: MFTB Holdco, Inc., Seattle, WA (US)

( * ) Notice: Subject to any disclaimer, the term of this patent is extended or adjusted under 35 U.S.C. 154(b) by 0 days.

(21) Appl. No.: 17/864,234

(22) Filed: Jul. 13, 2022

(51) Int. Cl.
*G06T 17/05* (2011.01)
*G06V 30/422* (2022.01)
*G06V 10/75* (2022.01)

(52) U.S. Cl.
CPC .............. *G06T 17/05* (2013.01); *G06V 10/75* (2022.01); *G06V 30/422* (2022.01); *G06T 2210/04* (2013.01)

(58) Field of Classification Search
CPC ..... G06T 17/05; G06T 2210/04; G06V 10/75; G06V 30/422
See application file for complete search history.

(56) References Cited

U.S. PATENT DOCUMENTS

| | | |
|---|---|---|
| 5,140,352 A | 8/1992 | Moore et al. |
| 6,031,540 A | 2/2000 | Golin et al. |
| 6,141,034 A | 10/2000 | McCutchen |
| 6,317,166 B1 | 11/2001 | McCutchen |
| 6,320,584 B1 | 11/2001 | Golin et al. |
| 6,323,858 B1 | 11/2001 | Gilbert et al. |

(Continued)

FOREIGN PATENT DOCUMENTS

| | | |
|---|---|---|
| EP | 2413097 A2 | 2/2012 |
| EP | 2505961 A2 | 10/2012 |

(Continued)

OTHER PUBLICATIONS

CubiCasa | From video to floor plan in under 5 minutes, retrieved on Mar. 26, 2019, from https://www.cubi.casa/, 6 pages.

(Continued)

*Primary Examiner* — Grant Sitta
(74) *Attorney, Agent, or Firm* — VLP Law Group LLP; James A. D. White

(57) ABSTRACT

Techniques are described for using computing devices to perform automated operations for determining matching buildings and using corresponding information in further automated manners, such as by determining buildings having similarities to other indicated buildings based at least in part on building floor plans and/or other attributes, and by automatically generating descriptions of the similarities. In some situations, such matching building determinations are based on generating and using adjacency graphs for floor plans that represent inter-connections between rooms and other attributes of the buildings, and further generating and comparing vector-based embeddings that concisely represent the information of the adjacency graphs for use in performing inter-building comparisons and generating the descriptions. Information about such determined buildings may be used in various automated manners, including for controlling device navigation (e.g., autonomous vehicles), for display on client devices in corresponding graphical user interfaces, for further analysis to identify shared and/or aggregate characteristics, etc.

29 Claims, 18 Drawing Sheets

(56) References Cited

U.S. PATENT DOCUMENTS

| | | |
|---|---|---|
| 6,337,683 B1 | 1/2002 | Gilbert et al. |
| 6,654,019 B2 | 11/2003 | Gilbert et al. |
| 6,683,608 B2 | 1/2004 | Golin et al. |
| 6,690,374 B2 | 2/2004 | Park et al. |
| 6,731,305 B1 | 5/2004 | Park et al. |
| 6,738,073 B2 | 5/2004 | Park et al. |
| 7,050,085 B1 | 5/2006 | Park et al. |
| 7,129,971 B2 | 10/2006 | McCutchen |
| 7,196,722 B2 | 3/2007 | White et al. |
| 7,525,567 B2 | 4/2009 | McCutchen |
| 7,620,909 B2 | 11/2009 | Park et al. |
| 7,627,235 B2 | 12/2009 | McCutchen et al. |
| 7,782,319 B2 | 8/2010 | Ghosh et al. |
| 7,791,638 B2 | 9/2010 | McCutchen |
| 7,909,241 B2 | 3/2011 | Stone et al. |
| 7,973,838 B2 | 7/2011 | McCutchen |
| 8,072,455 B2 | 12/2011 | Temesvari et al. |
| 8,094,182 B2 | 1/2012 | Park et al. |
| RE43,786 E | 11/2012 | Cooper |
| 8,463,020 B1 | 6/2013 | Schuckmann et al. |
| 8,517,256 B2 | 8/2013 | Stone et al. |
| 8,520,060 B2 | 8/2013 | Zomet et al. |
| 8,523,066 B2 | 9/2013 | Stone et al. |
| 8,523,067 B2 | 9/2013 | Stone et al. |
| 8,528,816 B2 | 9/2013 | Stone et al. |
| 8,540,153 B2 | 9/2013 | Stone et al. |
| 8,594,428 B2 | 11/2013 | Aharoni et al. |
| 8,654,180 B2 | 2/2014 | Zomet et al. |
| 8,666,815 B1 | 3/2014 | Chau |
| 8,699,005 B2 | 4/2014 | Likholyot |
| 8,705,892 B2 | 4/2014 | Aguilera et al. |
| RE44,924 E | 6/2014 | Cooper et al. |
| 8,854,684 B2 | 10/2014 | Zomet |
| 8,861,840 B2 | 10/2014 | Bell et al. |
| 8,861,841 B2 | 10/2014 | Bell et al. |
| 8,879,828 B2 | 11/2014 | Bell et al. |
| 8,953,871 B2 | 2/2015 | Zomet |
| 8,989,440 B2 | 3/2015 | Klusza et al. |
| 8,996,336 B2 | 3/2015 | Malka et al. |
| 9,021,947 B2 | 5/2015 | Landa |
| 9,026,947 B2 | 5/2015 | Lee et al. |
| 9,035,968 B2 | 5/2015 | Zomet |
| 9,041,796 B2 | 5/2015 | Malka et al. |
| 9,071,714 B2 | 6/2015 | Zomet |
| 9,129,438 B2 | 9/2015 | Aarts et al. |
| 9,151,608 B2 | 10/2015 | Malka et al. |
| 9,165,410 B1 | 10/2015 | Bell et al. |
| 9,171,405 B1 | 10/2015 | Bell et al. |
| 9,324,190 B2 | 4/2016 | Bell et al. |
| 9,361,717 B2 | 6/2016 | Zomet |
| 9,396,586 B2 | 7/2016 | Bell et al. |
| 9,438,759 B2 | 9/2016 | Zomet |
| 9,438,775 B2 | 9/2016 | Powers et al. |
| 9,489,775 B1 | 11/2016 | Bell et al. |
| 9,495,783 B1 | 11/2016 | Samarasekera et al. |
| 9,576,401 B2 | 2/2017 | Zomet |
| 9,619,933 B2 | 4/2017 | Spinella-Marno et al. |
| 9,635,252 B2 | 4/2017 | Accardo et al. |
| 9,641,702 B2 | 5/2017 | Bin-Nun et al. |
| 9,760,994 B1 | 9/2017 | Bell et al. |
| 9,786,097 B2 | 10/2017 | Bell et al. |
| 9,787,904 B2 | 10/2017 | Birkler et al. |
| 9,836,885 B1 | 12/2017 | Eraker et al. |
| 9,852,351 B2 | 12/2017 | Aguilera Perez et al. |
| 9,953,111 B2 | 4/2018 | Bell et al. |
| 9,953,430 B1 | 4/2018 | Zakhor |
| 9,990,760 B2 | 6/2018 | Aguilera Perez et al. |
| 9,990,767 B1 | 6/2018 | Sheffield et al. |
| 10,026,224 B2 | 7/2018 | Bell et al. |
| 10,030,979 B2 | 7/2018 | Bjorke et al. |
| 10,055,876 B2 | 8/2018 | Ford et al. |
| 10,068,344 B2 | 9/2018 | Jovanovic et al. |
| 10,083,522 B2 | 9/2018 | Jovanovic et al. |
| 10,102,639 B2 | 10/2018 | Bell et al. |
| 10,102,673 B2 | 10/2018 | Eraker et al. |
| 10,120,397 B1 | 11/2018 | Zakhor et al. |
| 10,122,997 B1 | 11/2018 | Sheffield et al. |
| 10,127,718 B2 | 11/2018 | Zakhor et al. |
| 10,127,722 B2 | 11/2018 | Shakib et al. |
| 10,139,985 B2 | 11/2018 | Mildrew et al. |
| 10,163,261 B2 | 12/2018 | Bell et al. |
| 10,163,271 B1 | 12/2018 | Powers et al. |
| 10,181,215 B2 | 1/2019 | Sedeffow |
| 10,192,115 B1 | 1/2019 | Sheffield et al. |
| 10,204,185 B2 | 2/2019 | Mrowca et al. |
| 10,210,285 B2 | 2/2019 | Wong et al. |
| 10,235,797 B1 | 3/2019 | Sheffield et al. |
| 10,242,400 B1 | 3/2019 | Eraker et al. |
| 10,339,716 B1 | 7/2019 | Powers et al. |
| 10,366,531 B2 * | 7/2019 | Sheffield ................. G06T 15/04 |
| 10,375,306 B2 | 8/2019 | Shan et al. |
| 10,395,435 B2 * | 8/2019 | Powers ............. G06Q 30/0643 |
| 10,521,466 B2 * | 12/2019 | Bellegarda ................ G06F 3/16 |
| 10,530,997 B2 | 1/2020 | Shan et al. |
| 10,643,386 B2 | 5/2020 | Li et al. |
| 10,708,507 B1 | 7/2020 | Dawson et al. |
| 10,809,066 B2 | 10/2020 | Colburn et al. |
| 10,825,247 B1 | 11/2020 | Vincent et al. |
| 10,834,317 B2 | 11/2020 | Shan et al. |
| 10,990,619 B1 * | 4/2021 | Kuyda .................... G06F 16/31 |
| 11,057,561 B2 | 7/2021 | Shan et al. |
| 11,164,361 B2 | 11/2021 | Moulon et al. |
| 11,164,368 B2 | 11/2021 | Vincent et al. |
| 11,165,959 B2 | 11/2021 | Shan et al. |
| 11,217,019 B2 | 1/2022 | Li et al. |
| 11,238,652 B2 | 2/2022 | Impas et al. |
| 11,243,656 B2 | 2/2022 | Li et al. |
| 11,252,329 B1 | 2/2022 | Cier et al. |
| 11,284,006 B2 | 3/2022 | Dawson et al. |
| 11,574,283 B2 * | 2/2023 | Tennent ............... G06Q 10/087 |
| 11,592,969 B2 * | 2/2023 | Li ............................ G06T 19/00 |
| 11,676,344 B2 * | 6/2023 | Li ........................... G06Q 10/20 |
| | | 345/419 |
| 2006/0256109 A1 | 11/2006 | Acker et al. |
| 2010/0232709 A1 | 9/2010 | Zhang et al. |
| 2012/0075414 A1 | 3/2012 | Park et al. |
| 2012/0293613 A1 | 11/2012 | Powers et al. |
| 2013/0050407 A1 | 2/2013 | Brinda et al. |
| 2013/0342533 A1 | 12/2013 | Bell et al. |
| 2014/0043436 A1 | 2/2014 | Bell et al. |
| 2014/0044343 A1 | 2/2014 | Bell et al. |
| 2014/0044344 A1 | 2/2014 | Bell et al. |
| 2014/0125658 A1 | 5/2014 | Bell et al. |
| 2014/0125767 A1 | 5/2014 | Bell et al. |
| 2014/0125768 A1 | 5/2014 | Bell et al. |
| 2014/0125769 A1 | 5/2014 | Bell et al. |
| 2014/0125770 A1 | 5/2014 | Bell et al. |
| 2014/0236482 A1 | 8/2014 | Dorum et al. |
| 2014/0267631 A1 | 9/2014 | Powers et al. |
| 2014/0307100 A1 | 10/2014 | Myllykoski et al. |
| 2014/0320674 A1 | 10/2014 | Kuang |
| 2015/0116691 A1 | 4/2015 | Likholyot |
| 2015/0189165 A1 | 7/2015 | Milosevski et al. |
| 2015/0262421 A1 | 9/2015 | Bell et al. |
| 2015/0269785 A1 | 9/2015 | Bell et al. |
| 2015/0302636 A1 | 10/2015 | Arnoldus et al. |
| 2015/0310596 A1 | 10/2015 | Sheridan et al. |
| 2015/0332464 A1 | 11/2015 | O'Keefe et al. |
| 2016/0055268 A1 | 2/2016 | Bell et al. |
| 2016/0134860 A1 | 5/2016 | Jovanovic et al. |
| 2016/0140676 A1 | 5/2016 | Fritze et al. |
| 2016/0217225 A1 | 7/2016 | Bell et al. |
| 2016/0260250 A1 | 9/2016 | Jovanovic et al. |
| 2016/0286119 A1 | 9/2016 | Rondinelli |
| 2016/0300385 A1 | 10/2016 | Bell et al. |
| 2017/0034430 A1 | 2/2017 | Fu et al. |
| 2017/0067739 A1 | 3/2017 | Siercks et al. |
| 2017/0194768 A1 | 7/2017 | Powers et al. |
| 2017/0195654 A1 | 7/2017 | Powers et al. |
| 2017/0263050 A1 | 9/2017 | Ha et al. |
| 2017/0324941 A1 | 11/2017 | Birkler |
| 2017/0330273 A1 | 11/2017 | Holt et al. |
| 2017/0337737 A1 | 11/2017 | Edwards et al. |
| 2018/0007340 A1 | 1/2018 | Stachowski |

(56) References Cited

U.S. PATENT DOCUMENTS

| | | |
|---|---|---|
| 2018/0025536 A1 | 1/2018 | Bell et al. |
| 2018/0075168 A1 | 3/2018 | Tiwari et al. |
| 2018/0120793 A1* | 5/2018 | Tiwari .................. G06Q 10/06 |
| 2018/0121571 A1* | 5/2018 | Tiwari .................. G06F 30/13 |
| 2018/0139431 A1 | 5/2018 | Simek et al. |
| 2018/0143023 A1 | 5/2018 | Bjorke et al. |
| 2018/0143756 A1 | 5/2018 | Mildrew et al. |
| 2018/0144487 A1 | 5/2018 | Bell et al. |
| 2018/0144535 A1 | 5/2018 | Ford et al. |
| 2018/0144547 A1 | 5/2018 | Shakib et al. |
| 2018/0144555 A1 | 5/2018 | Ford et al. |
| 2018/0146121 A1 | 5/2018 | Hensler et al. |
| 2018/0146193 A1 | 5/2018 | Safreed et al. |
| 2018/0146212 A1 | 5/2018 | Hensler et al. |
| 2018/0165871 A1 | 6/2018 | Mrowca |
| 2018/0203955 A1 | 7/2018 | Bell et al. |
| 2018/0241985 A1 | 8/2018 | O'Keefe et al. |
| 2018/0293793 A1 | 10/2018 | Bell et al. |
| 2018/0300936 A1 | 10/2018 | Ford et al. |
| 2018/0306588 A1 | 10/2018 | Bjorke et al. |
| 2018/0348854 A1 | 12/2018 | Powers et al. |
| 2018/0365496 A1 | 12/2018 | Hovden et al. |
| 2019/0012833 A1 | 1/2019 | Eraker et al. |
| 2019/0026956 A1 | 1/2019 | Gausebeck et al. |
| 2019/0026957 A1 | 1/2019 | Gausebeck |
| 2019/0026958 A1 | 1/2019 | Gausebeck et al. |
| 2019/0035165 A1 | 1/2019 | Gausebeck |
| 2019/0041972 A1 | 2/2019 | Bae |
| 2019/0050137 A1 | 2/2019 | Mildrew et al. |
| 2019/0051050 A1 | 2/2019 | Bell et al. |
| 2019/0051054 A1 | 2/2019 | Jovanovic et al. |
| 2019/0087067 A1 | 3/2019 | Hovden et al. |
| 2019/0122422 A1 | 4/2019 | Sheffield et al. |
| 2019/0164335 A1 | 5/2019 | Sheffield et al. |
| 2019/0180104 A1 | 6/2019 | Sheffield et al. |
| 2019/0251645 A1* | 8/2019 | Winans .................. G06V 20/64 |
| 2019/0287164 A1 | 9/2019 | Eraker et al. |
| 2020/0336675 A1 | 10/2020 | Dawson et al. |
| 2020/0389602 A1 | 12/2020 | Dawson et al. |
| 2020/0408532 A1 | 12/2020 | Colburn et al. |
| 2021/0044760 A1 | 2/2021 | Dawson et al. |
| 2021/0243564 A1* | 8/2021 | Hollar .................. G01S 5/0278 |
| 2021/0377442 A1 | 12/2021 | Boyadzhiev et al. |
| 2021/0385378 A1 | 12/2021 | Cier et al. |
| 2022/0003555 A1 | 1/2022 | Colburn et al. |
| 2022/0028156 A1 | 1/2022 | Boyadzhiev et al. |
| 2022/0028159 A1 | 1/2022 | Vincent et al. |
| 2022/0076019 A1 | 3/2022 | Moulon et al. |
| 2022/0092227 A1* | 3/2022 | Yin .......................... G06T 17/00 |
| 2022/0114291 A1 | 4/2022 | Li et al. |
| 2022/0164493 A1 | 5/2022 | Li et al. |
| 2022/0189122 A1 | 6/2022 | Li et al. |
| 2023/0003546 A1* | 1/2023 | Brenner .................. G01S 17/42 |
| 2023/0004689 A1* | 1/2023 | Santarone ............... G01S 19/48 |
| 2023/0093087 A1* | 3/2023 | Babinowich .......... G06V 10/774 |
| | | 345/423 |

FOREIGN PATENT DOCUMENTS

| | | |
|---|---|---|
| EP | 2506170 A2 | 10/2012 |
| KR | 101770648 B1 | 8/2017 |
| KR | 101930796 B1 | 12/2018 |
| NO | 2019104049 A1 | 5/2019 |
| WO | 2005091894 A2 | 10/2005 |
| WO | 2016154306 A1 | 9/2016 |
| WO | 2018204279 A1 | 11/2018 |
| WO | 2019083832 A1 | 5/2019 |
| WO | 2019118599 A2 | 6/2019 |

OTHER PUBLICATIONS

CubiCasa FAQ & Manual, retrieved on Mar. 26, 2019, from https://www.cubi.casa/faq/, 5 pages.

Cupix Home, retrieved on Mar. 26, 2019, from https://www.cupix.com/, 1 page.

Cupix—FAQ, retrieved on Mar. 26, 2019, from https://www.cupix.com/faq.html, 3 pages.

IGuide: 3D Virtual Tours, retrieved on Mar. 26, 2019, from https://goiguide.com/, 6 pages.

immoviewer.com | Automated Video Creation & Simple Affordable 3D 360 Tours, retrieved on Mar. 26, 2019, from https://www.immoviewer.com/, 5 pages.

MagicPlan | #1 Floor Plan App, Construction & Surveying Samples, retrieved on Mar. 26, 2019, from https://www.magicplan.app/, 9 pages.

EyeSpy360 Virtual Tours | Virtual Tour with any 360 camera, retrieved on Mar. 27, 2019, from https://www.eyespy360.com/en-us/, 15 pages.

Indoor Reality, retrieved on Mar. 27, 2019, from https://www.indoorreality.com/, 9 pages.

InsideMaps, retrieved on Mar. 27, 2019, from https://www.insidemaps.com/, 7 pages.

IStaging | Augmented & Virtual Reality Platform For Business, retrieved on Mar. 27, 2019, from https://www.istaging.com/en/, 7 pages.

Metareal, retrieved on Mar. 27, 2019, from https://www.metareal.com/, 4 pages.

PLNAR—The AR 3D Measuring / Modeling Platform, retrieved on Mar. 27, 2019, from https://www.plnar.co, 6 pages.

YouVR Global, retrieved on Mar. 27, 2019, from https://global.youvr.io/, 9 pages.

GeoCV, retrieved on Mar. 28, 2019, from https://geocv.com/, 4 pages.

Biersdorfer, J.D., "How To Make A 3-D Model Of Your Home Renovation Vision," in The New York Times, Feb. 13, 2019, retrieved Mar. 28, 2019, 6 pages.

Chen et al. "Rise of the indoor crowd: Reconstruction of building interior view via mobile crowdsourcing." In: Proceedings of the 13th ACM Conference on Embedded Networked Sensor Systems. Nov. 4, 2015, 13 pages.

Immersive 3D for the Real World, retrieved from https://matterport.com/, on Mar. 27, 2017, 5 pages.

Learn About Our Complete 3D System, retrieved from https://matterport.com/how-it-works/, on Mar. 27, 2017, 6 pages.

Surefield FAQ, retrieved from https://surefield.com/faq, on Mar. 27, 2017, 1 page.

Why Surefield, retrieved from https://surefield.com/why-surefield, on Mar. 27, 2017, 7 pages.

Schneider, V., "Create immersive photo experiences with Google Photo Sphere," retrieved from http://geojournalism.org/2015/02/create-immersive-photo-experiences-with-google-photo-sphere/, on Mar. 27, 2017, 7 pages.

Tango (platform), Wikipedia, retrieved from https://en.wikipedia.org/wiki/Tango_(platform), on Jun. 12, 2018, 5 pages.

Zou et al. "LayoutNet: Reconstructing the 3D Room Layout from a Single RGB Image" in arXiv:1803.08999, submitted Mar. 23, 2018, 9 pages.

Lee et al. "RoomNet: End-to-End Room Layout Estimation" in arXiv:1703.00241v2, submitted Aug. 7, 2017, 10 pages.

Time-of-flight camera, Wikipedia, retrieved from https://en.wikipedia.org/wiki/Time-of-flight_camera, on Aug. 30, 2018, 8 pages.

Magicplan—Android Apps on Go . . . , retrieved from https://play.google.com/store/apps/details?id=com.sensopia.magicplan, on Feb. 21, 2018, 5 pages.

Pintore et al., "AtlantaNet: Inferring the 3D Indoor Layout from a Single 360 Image beyond the Manhattan World Assumption", ECCV 2020, 16 pages.

Cowles, Jeremy, "Differentiable Rendering", Aug. 19, 2018, accessed Dec. 7, 2020 at https://towardsdatascience.com/differentiable-rendering-d00a4b0f14be, 3 pages.

Yang et al., "DuLa-Net: A Dual-Projection Network for Estimating Room Layouts from a Single RGB Panorama", in arXiv:1811.11977[cs.v2], submitted Apr. 2, 2019, 14 pages.

Sun et al., "HoHoNet: 360 Indoor Holistic Understanding with Latent Horizontal Features", in arXiv:2011.11498[cs.v2], submitted Nov. 24, 2020, 15 pages.

(56) References Cited

OTHER PUBLICATIONS

Nguyen-Phuoc et al., "RenderNet: A deep convolutional network for differentiable rendering from 3D shapes", in arXiv:1806.06575[cs.v3], submitted Apr. 1, 2019, 17 pages.
Convolutional neural network, Wikipedia, retrieved from https://en.wikipedia.org/wiki/Convolutional_neural_network, on Dec. 7, 2020, 25 pages.
Hamilton et al., "Inductive Representation Learning on Large Graphs", in 31st Conference on Neural Information Processing Systems (NIPS 2017), 2017, 19 pages.
Kipf et al., "Variational Graph Auto-Encoders", in arXiv:1611.07308v1 [stat.ML], submitted Nov. 21, 2016, 3 pages.
Cao et al., "MolGAN: An Implicit Generative Model For Small Molecular Graphs", in arXiv:1805.11973v1 [stat.ML], submitted May 30, 2018, 11 pages.
Chen et al., "Intelligent Home 3D: Automatic 3D-House Design from Linguistic Descriptions Only", in arXiv:2003.00397v1 [cs.CV], submitted Mar. 1, 2020, 14 pages.
Cucurull et al., "Context-Aware Visual Compatibility Prediction", in arXiv:1902.03646v2 [cs.CV], submitted Feb. 12, 2019, 10 pages.
Fan et al., "Labeled Graph Generative Adversarial Networks", in arXiv:1906.03220v1 [cs.LG], submitted Jun. 7, 2019, 14 pages.
Gong et al., "Exploiting Edge Features in Graph Neural Networks", in arXiv:1809.02709v2 [cs.LG], submitted Jan. 28, 2019, 10 pages.
Genghis Goodman, "A Machine Learning Approach to Artificial Floorplan Generation", University of Kentucky Theses and Dissertations-Computer Science, 2019, accessible at https://uknowledge.uky.edu/cs_etds/89, 40 pages.
Grover et al., "node2vec: Scalable Feature Learning for Networks", in arXiv:1607.00653v1 [cs.SI], submitted Jul. 3, 2016, 10 pages.
Nauata et al., "House-GAN: Relational Generative Adversarial Networks for Graph-constrained House Layout Generation", in arXiv:2003.06988v1 [cs.CV], submitted Mar. 16, 2020, 17 pages.
Kang et al., "A Review of Techniques for 3D Reconstruction of Indoor Environments", in ISPRS International Journal Of Geo-Information 2020, May 19, 2020, 31 pages.
Kipf et al., "Semi-Supervised Classification With Graph Convolutional Networks", in arXiv:1609.02907v4 [cs.LG], submitted Feb. 22, 2017, 14 pages.
Li et al., "Graph Matching Networks for Learning the Similarity of Graph Structured Objects", in Proceedings of the 36th International Conference on Machine Learning (PMLR 97), 2019, 18 pages.
Liu et al., "Hyperbolic Graph Neural Networks", in 33rd Conference on Neural Information Processing Systems (NeurIPS 2019), 2019, 12 pages.
Merrell et al., "Computer-Generated Residential Building Layouts", in ACM Transactions on Graphics, Dec. 2010, 13 pages.

* cited by examiner

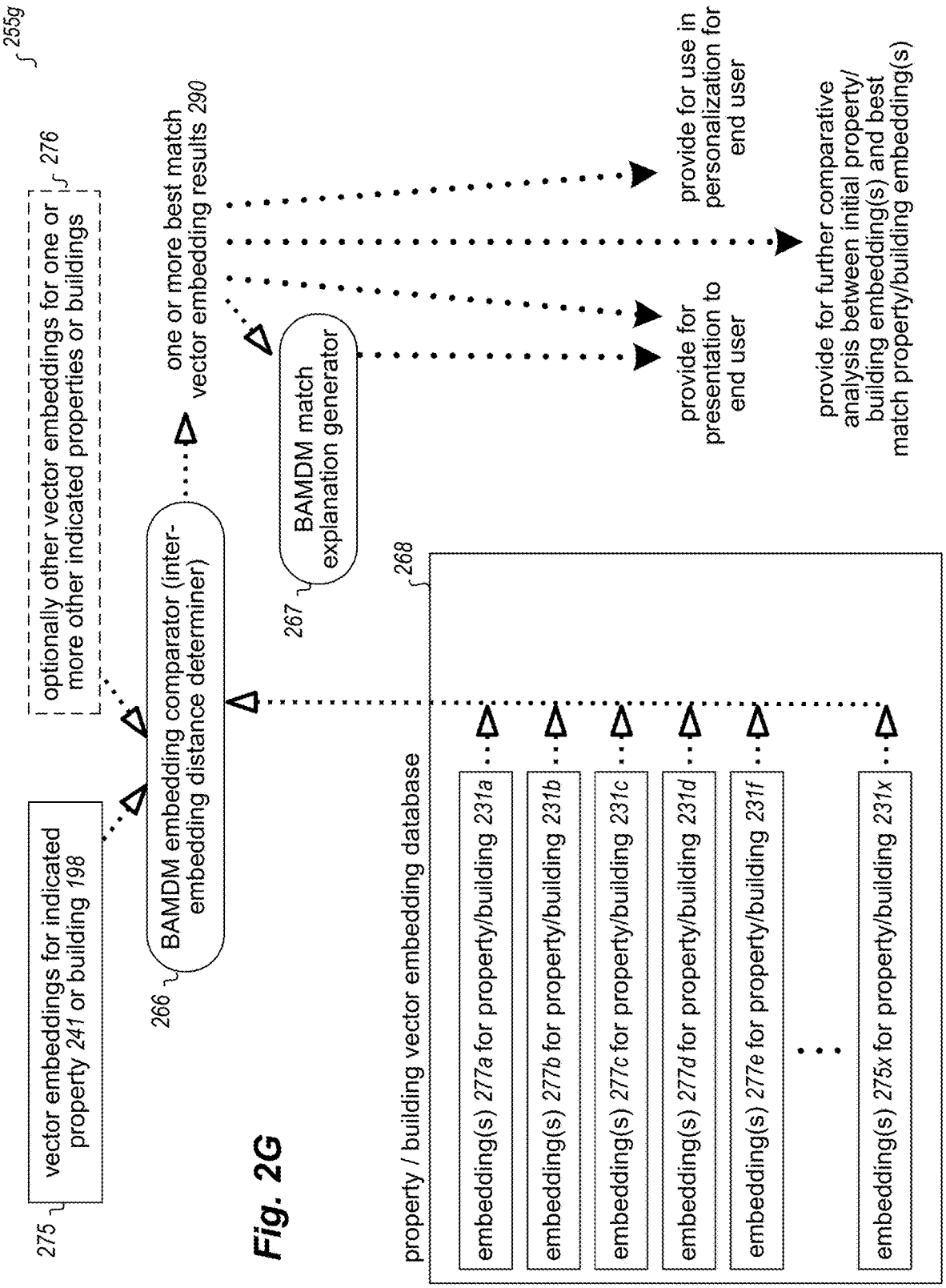

AUTOMATED BUILDING IDENTIFICATION USING FLOOR PLANS AND ACQUIRED BUILDING IMAGES

TECHNICAL FIELD

The following disclosure relates generally to techniques for automatically determining and using information about building floor plans and other building information to identify buildings that match each other or other indicated criteria and for subsequently using information for determined buildings in one or more automated manners, such as to use floor plans for determined buildings for navigation purposes, and such as by automatically determining one or more buildings having similarities to those of one or more other indicated buildings based at least in part on floor plans and other attributes of the buildings.

BACKGROUND

In various fields and circumstances, such as architectural analysis, property inspection, real estate acquisition and development, general contracting, improvement cost estimation, etc., it may be desirable to know the interior of a house, office, or other building without having to physically travel to and enter the building. However, it can be difficult to effectively capture, represent and use such building interior information, including to identify buildings that satisfy criteria of interest, and including to display visual information captured within building interiors to users at remote locations (e.g., to enable a user to fully understand the layout and other details of the interior, including to control the display in a user-selected manner). In addition, while a floor plan of a building may provide some information about layout and other details of a building interior, such use of floor plans has some drawbacks, including that floor plans can be difficult to construct and maintain, to accurately scale and populate with information about room interiors, to visualize and otherwise use, etc.

BRIEF DESCRIPTION OF THE DRAWINGS

FIGS. 2A-2J illustrate examples of automatically identifying building floor plans that have attributes satisfying target criteria and subsequently using the identified floor plans in one or more automated manners.

DETAILED DESCRIPTION

Figure 1:
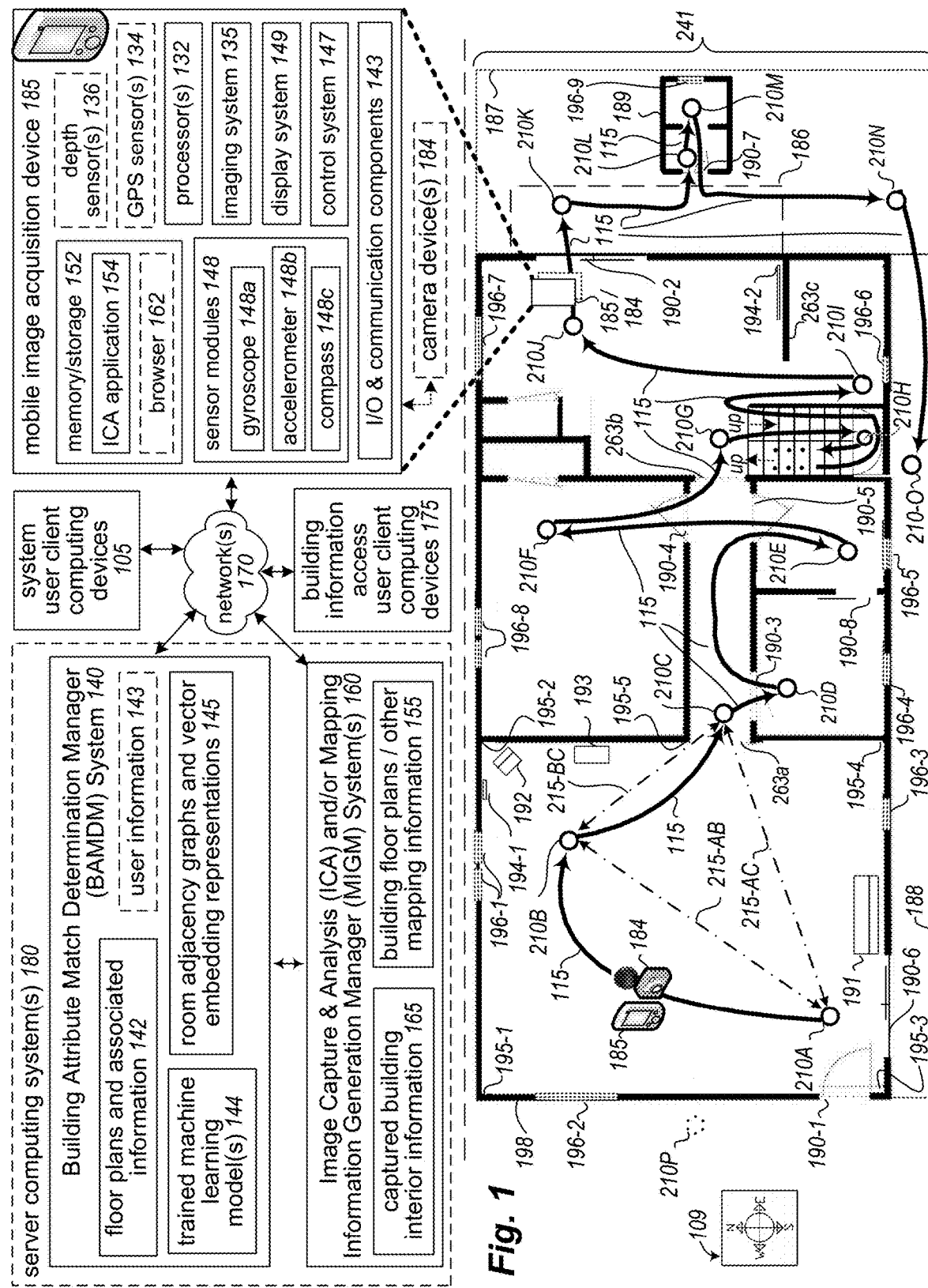
FIG. 1 includes diagrams depicting an exemplary building interior environment and computing system(s) for use in embodiments of the present disclosure, including to generate and present information representing an interior of the building, and/or to determine and further use information about attribute-based assessments of buildings' floor plans.

The present disclosure describes techniques for using computing devices to perform automated operations related to identifying buildings that match each other or other indicated criteria and to subsequently using floor plans and other information about the buildings in one or more further automated manners, such as for controlling navigation of mobile devices (e.g., autonomous vehicles) in the buildings or in other manners. The automated identification of matching buildings may include determining one or more buildings that have similarities to one or more other indicated buildings or building descriptions based at least in part on those buildings' floor plans and other attributes, such as by generating and comparing hierarchical vector-based embedding representations of building floor plan information and other attributes, as well as automatically generating explanations and other descriptions of the similarities based at least in part on the hierarchical vector-based embeddings. In at least some embodiments, such identification of matching buildings includes generating adjacency graphs from building floor plans that represent room inter-connections and optionally other adjacencies between rooms of the buildings and that further store other attributes of the buildings, and generating the vector-based embeddings to concisely represent information of the adjacency graphs and other attributes of the building—such a floor plan may, in at least some embodiments, be for an as-built multi-room building (e.g., a house, office building, etc.) that is generated from or otherwise associated with panorama images or other images (e.g., rectilinear perspective images) acquired at acquisition locations in and around the building (e.g., without having or using information from any depth sensors or other distance-measuring devices about distances from an image's acquisition location to walls or other objects in the surrounding building). Information about a matching building for one or more other indicated buildings may be further used in various manners, such as for display or other presentation on one or more client devices in corresponding GUIs (graphical user interfaces) to enable virtual navigation of the matching building. Additional details are included below regarding automated determination and use of information about matching buildings, and some or all techniques described herein may, in at least some embodiments, be performed via automated operations of a Building Attribute Match Determination Manager ("BAMDM") system, as discussed further below.

As noted above, automated operations of a BAMDM system may include generating and using an adjacency graph for a building floor plan in at least some embodiments, while otherwise generating building adjacency information in other formats in other embodiments. Such a floor plan of a building may include a 2D (two-dimensional) representation of various information about the building (e.g., the rooms, doorways between rooms and other inter-room connections, exterior doorways, windows, etc.), and may be further associated with various types of supplemental or otherwise additional information (about the building (e.g., data for a plurality of other building-related attributes)— such additional building information may, for example, include one or more of the following: a 3D, or three-dimensional, model of the building that includes height information (e.g., for building walls and other vertical areas); a 2.5D, or two-and-a-half dimensional, model of the building that when rendered includes visual representations of walls and/or other vertical surfaces without explicitly modeling measured heights of those walls and/or other vertical surfaces; images and/or other types of data captured in rooms of the building, including panoramic images (e.g., 360° panorama images); etc., as discussed in greater detail below. Such an adjacency graph may store or otherwise include some or all such data for the building, such as with at least some such data stored in or otherwise associated with nodes of the adjacency graph that represent some or all rooms of the floor plan (e.g., with each node containing information about attributes of the room represented by the node), and/or with at least some such attribute data stored in or otherwise associated with edges between nodes that represent connections between adjacent rooms via doorways or other inter-room wall openings, or in some situations further represent adjacent rooms that share at least a portion of at least one wall and optionally a full wall without any direct inter-room opening connecting those two rooms (e.g., with each edge containing information about connectivity status between the rooms represented by the nodes that the edge inter-connects, such as whether an inter-room opening exists between the two rooms, and/or a type of inter-room opening or other type of adjacency between the two rooms such as without any direct inter-room wall opening connection). In some embodiments and situations, the adjacency graph may further represent at least some information external to the building, such as exterior areas adjacent to doorways or other wall openings between the building and the exterior and/or other accessory structures on the same property as the building (e.g., a garage, shed, pool house, separate guest quarters, mother-in-law unit or other accessory dwelling unit, pool, patio, deck, sidewalk, garden, yard, etc.), or more generally some or all external areas of a property that includes one or more buildings (e.g., a house and one or more outbuildings or other accessory structures)—such exterior areas and/or other structures may be represented in various manners in the adjacency graph, such as via separate nodes for each such exterior area or other structure, or instead as attribute information associated with corresponding nodes or edges or instead with the adjacency graph as a whole (for the building as a whole). The adjacency graph may further have associated attribute information for the corresponding rooms and inter-room connections in at least some embodiments, such as to represent within the adjacency graph some or all of the information available on a floor plan and otherwise associated with the floor plan (or in some embodiments and situations, information in and associated with a 3D model of the building)—for example, if there are images associated with particular rooms of the floor plan or other associated areas (e.g., external areas), corresponding visual attributes may be included within the adjacency graph, whether as part of the associated rooms or other areas, or instead as a separate layer of nodes within the graph that represent the images. In embodiments with adjacency information in a form other than an adjacency graph, some or all of the above-indicated types of information may be stored in or otherwise associated with the adjacency information, including information about rooms, about adjacencies between rooms, about connectivity status between adjacent rooms, about attributes of the building, etc. Additional details are included below regarding the generation and use of adjacency graphs, including with respect to the examples of FIGS. 2D-2J and their associated descriptions.

As is also noted above, automated operations of a BAMDM system may further include generating and using one or more vector-based embeddings (also referred to herein as a "vector embedding") to concisely represent information in an adjacency graph for a floor plan of a building, such as to summarize the semantic meaning and spatial relationships of the floor plan in a manner that enables reconstruction of some or all of the floor plan from the vector embedding. Such a vector embedding may be generated in various manners in various embodiments, such as via the use of representation learning and one or more trained machine learning models, and in at least some such embodiments may be encoded in a format that is not easily discernible to a human reader. Non-exclusive examples of techniques for generating such vector embeddings are included in the following documents, which are incorporated herein by reference in their entirety: "Symmetric Graph Convolution Autoencoder For Unsupervised Graph Representation Learning" by Jiwoong Park et al., 2019 International Conference On Computer Vision, Aug. 7, 2019; "Inductive Representation Learning On Large Graphs" by William L Hamilton et al., $31^{st}$ Conference On Neural Information Processing Systems 2017, Jun. 7, 2017; and "Variational Graph Auto-Encoders" by Thomas N. Kipf et al., $30^{th}$ Conference On Neural Information Processing Systems 2017 (Bayesian Deep Learning Workshop), Nov. 21, 2016. Additional details are included below regarding the generation and use of vector embeddings, including with respect to the examples of FIGS. 2D-2J and their associated descriptions.

In addition, as noted above, a floor plan may have various information that is associated with individual rooms and/or with inter-room connections and/or with a corresponding building and/or encompassing property as a whole, and the corresponding adjacency graph and/or vector embedding(s) for such a floor plan may include some or all such associated information (e.g., represented as attributes of nodes for rooms in an adjacency graph and/or attributes of edges for inter-room connections in an adjacency graph and/or represented as attributes of the adjacency graph as a whole, such as in a node representing the overall building, and with corresponding information encoded in the associated vector embedding(s)). Such associated information may include a variety of types of data, including information about one or more of the following non-exclusive examples: room types, room dimensions, locations of windows and doors and other inter-room openings in a room, room shape, a view type for each exterior window, information about and/or copies of images taken in a room, information about and/or copies of audio or other data captured in a room, information of various types about features of one or more rooms (e.g., as automatically identified from analysis of images, as supplied by operator users of the BAMDM system and/or by end-users viewing information about the floor plan and/or by operator users of ICA and/or MIGM systems as part of capturing information about a building and generating a floor plan for the building, etc.), types of inter-room connections, dimensions of inter-room connections, etc. Furthermore, in at least some embodiments, one or more additional subjective attributes may be determined for and associated with the floor plan, such as via analysis of the floor plan information (e.g., an adjacency graph for the floor plan) by one or more trained machine learning models (e.g., classification neural network models) to identify floor plan characteristics for a building as a whole or a particular building floor (e.g., an open floor plan; a typical/normal versus atypical/odd/unusual floor plan; a standard versus nonstandard floor plan; a floor plan that is accessibility friendly, such as by being accessible with respect to one or more characteristics such as disability and/or advanced age; etc.)—in at least some such embodiments, the one or more classification neural network models are part of the BAMDM system and are trained via supervised learning using labeled data that identifies floor plans having each of the possible characteristics, while in other embodiments such classification neural network models may instead use unsupervised clustering. Additional details are included below regarding the determination and use of attribute information for floor plans, including with respect to the examples of FIGS. 2D-2J and their associated description.

After an adjacency graph and one or more vector embeddings are generated for a floor plan and associated information of a building, that generated information may be used by the BAMDM system as specified criteria to automatically determine one or more other similar or otherwise matching floor plans of other buildings in various manners in various embodiments. For example, in some embodiments, an initial floor plan is identified, and one or more corresponding vector embeddings for the initial floor plan are generated and compared to generated vector embeddings for other candidate floor plans in order to determine a difference between the initial floor plan's vector embedding(s) and the vector embeddings of some or all of the candidate floor plans, with smaller differences between two vector embeddings corresponding to higher degrees of similarity between the building information represented by those vector embeddings. Differences between two such vector embeddings may be determined in various manners in various embodiments, including, as non-exclusive examples, by using one or more of the following distance metrics: Euclidean distance, cosine distance, graph edit distance, a custom distance measure specified by a user, etc.; and/or otherwise determining similarity without use of such a distance metrics. In at least some embodiments, multiple such initial floor plans may be identified and used in the described manner to determine a combined distance between a group of vector embeddings for the multiple initial floor plans and the vector embeddings for each of multiple other candidate floor plans, such as by determining individual distances for each of the initial floor plans to a given other candidate floor plan and by combining the multiple individual determined distances in one or more manners (e.g., a mean or other average, a cumulative total, etc.) to generate the combined distance for the group of vector embeddings of the multiple initial floor plans to that given other candidate floor plan. Additional details are included below regarding comparing vector embeddings for floor plans to determine similarities of the floor plans, including with respect to the examples of FIGS. 2D-2J and their associated description.

Furthermore, in some embodiments, one or more explicitly specified criteria other than one or more initial floor plans are received (whether in addition to or instead of receiving one or more initial floor plans), and the corresponding vector embedding(s) for each of multiple candidate floor plans are compared to information generated from the specified criteria in order to determine which of the candidate floor plans satisfy the specified criteria (e.g., are a match above a defined similarity threshold), such as by generating a representation of a building that corresponds to the criteria (e.g., has attributes identified in the criteria) and generating one or more vector embeddings for the building representation for use in vector embedding comparisons in the manners discussed above. The specified criteria may be of various types in various embodiments and situations, such as one or more of the following non-exclusive examples: search terms corresponding to specific attributes of rooms and/or inter-room connections and/or buildings as a whole (whether objective attributes that can be independently verified and/or replicated, and/or subjective attributes that are determined via use of corresponding classification neural networks); information identifying adjacency information between two or more rooms or other areas; information about views available from windows or other exterior openings of the building; information about directions of windows or other structural features or other elements of the building (e.g., such as to determine natural lighting information available via those windows or other structural elements, optionally at specified days and/or seasons and/or times); etc. Non-exclusive illustrative examples of such specified criteria include the following: a bathroom adjacent to bedroom (i.e., without an intervening hall or other room); a deck adjacent to a family room (optionally with a specified type of connection between them, such as French doors); 2 bedrooms facing south; a kitchen with a tile-covered island and a northward-facing view; a master bedroom with a view of the ocean or more generally of water; any combination of such specified criteria; etc. Additional details are included below regarding the specification and use of criteria to identify matching or otherwise similar floor plans, including via use of adjacency graphs and/or vector embeddings for the floor plans, including with respect to the examples of FIGS. 2D-2J and their associated description.

In addition, in some embodiments, multiple vector embeddings may be generated and used to represent a building and/or an associated property, such as in a hierarchical manner—as one non-exclusive example, a hierarchy of vector embeddings for a building and/or property may include some or all of the following: a top-level vector embedding that represents an overall property including one or more buildings and optionally one or more external areas; one or more additional vector embeddings at a next lower level of the hierarchy (or at a top-level if a property-wide vector embedding is not used) that each represents one of the buildings and optionally some or all of the external areas (e.g., a vector embedding that represents all of the external areas); one or more additional child vector embeddings at a next lower level of the hierarchy that are each associated with a parent higher-level vector embedding and represent parts of the area for the parent vector embedding (e.g., for a parent vector embedding that represents a building, to have one or more additional children vector embeddings that each represents a different floor or story or level of the building, or that groups rooms of the building in other manners, such as based on room types and/or sizes and/or functions; for a parent vector embedding that represents an overall external area of a property or outside a building, additional children vector embeddings that each represents a different sub-area, such as corresponding to geographical areas such as a front yard and back yard and side yard, and/or corresponding to types of external areas such as grass and deck and patio; etc.); one or more additional child vector embeddings at a next lower level of the hierarchy that are each associated with a parent higher-level vector embedding and represent parts of the area for the parent vector embedding (e.g., for a parent vector embedding that represents a story of a building, to have one or more additional children vector embeddings that each represents a different room of that building story; for a parent vector embedding that represents an external sub-area of a property or outside a building, additional children vector embeddings that each represents a different further sub-area within that sub-area, such as corresponding to different further sub-area types within a geographical sub-area, and/or corresponding to different geographical sub-areas within a sub-area type; etc.); one or more additional child vector embeddings at a next lower level of the hierarchy that are each associated with a parent higher-level vector embedding and represent types of information within the area for the parent vector embedding (e.g., for a parent vector embedding that represents a room of a building or external sub-area for a building or property, to have one or more additional children vector embeddings that each represents an image and/or other type of data acquired in that room or external sub-area); etc. When such hierarchical vector embeddings are used for buildings (or properties), they may be further used to determine additional degrees and/or types of matching between two buildings (or properties), such as to determine two matching buildings that have a degree of similarity between two overall building (or property) vector embeddings (e.g., that exceeds a defined threshold) and/or that have one or more degrees of similarities between one or more lower-level vector embeddings (e.g., between particular stories of the matching buildings, and/or between particular rooms or other areas for the matching buildings, and/or between particular images and/or other acquired groups of data for particular rooms, etc.). Thus, for example, two buildings may be determined to be matching based on being similar overall (e.g., above a defined threshold, and such as based at least in part on building-wide attributes such as house style and/or open floor plan and/or age), and with that overall similarity being further based primarily on having similar kitchens and/or similar features within the kitchens (e.g., countertop material types, structural features such as an island, particular types of appliances and/or features, etc.), and to a lesser degree on also having similar master bedrooms and decks. Furthermore, such hierarchical building similarities may further be used to explain or otherwise describe how and why the matching is determined, such as based on having similar kitchens and/or master bedrooms and/or decks, similar room-level or other area-level features or other attributes, similar building-wide attributes or characteristics (e.g., layout based in part or in whole on room adjacency information), similar images and other data acquired within the similar areas, etc. Additional details are included below regarding generating and using hierarchical vector embeddings, including with respect to generating explanations or other descriptions of building matching, such as in the examples of FIGS. 2D-2K and their associated descriptions.

The described techniques provide various benefits in various embodiments, including to allow floor plans of multi-room buildings and other structures to be identified and used more efficiently and rapidly and in manners not previously available, including to automatically identify building floor plans that match specified criteria (e.g., based on one or more of similarity to one or more other floor plans; similarity to adjacency information about which rooms are inter-connected and related inter-room relationship information, such as with respect to overall building layout; similarity to particular rooms or other areas and/or to features or other attributes of those rooms or other areas, such as determined from analysis of one or more images captured at the building; similarity to particular building or other area features or other attributes; similarity to subjective attributes regarding a floor plan's characteristics, etc.). In addition, the use of generated vector embeddings as described herein, including multiple hierarchical vector embeddings, further enables greater degrees and types of similarity to be determined, as well as to enable the automated generation of explanations or other descriptions of matching determinations. In addition, such automated techniques allow such identification of matching floor plans to be determined by using information acquired from the actual building environment (rather than from plans on how the building should theoretically be constructed), as well as enabling the capture of changes to structural elements and/or visual appearance elements that occur after a building is initially constructed. Such described techniques further provide benefits in allowing improved automated navigation of a building by mobile devices (e.g., semi-autonomous or fully-autonomous vehicles), based at least in part on the identification of building floor plans that match specified criteria, including to significantly reduce computing power and time used to attempt to otherwise learn a building's layout. In addition, in some embodiments the described techniques may be used to provide an improved GUI in which a user may more accurately and quickly identify one or more building floor plans matching specified criteria, and obtain information about one or more such buildings (e.g., for use in navigating an interior of the one or more buildings), including in response to search requests, as part of providing personalized information to the user, as part of providing value estimates and/or other information about a building to a user (e.g., after analysis of information about one or more target building floor plans that are similar to one or more initial floor plans or that otherwise match specified criteria), etc. Various other benefits are also provided by the described techniques, some of which are further described elsewhere herein.

In addition, in some embodiments, one or more target floor plans are identified that are similar to specified criteria associated with a particular end-user (e.g., based on one or more initial target floor plans that are selected by the end-user and/or are identified as previously being of interest to the end-user, whether based on explicit and/or implicit activities of the end-user to specify such floor plans; based on one or more search criteria specified by the end-user, whether explicitly and/or implicitly; etc.), and are used in further automated activities to personalize interactions with the end-user. Such further automated personalized interactions may be of various types in various embodiments, and in some embodiments may include displaying or otherwise presenting information to the end-user about the target floor plan(s) and/or additional information associated with those floor plans. Additional details are included below regarding the use of one or more identified target floor plans for further end-user personalization and/or presentation, including with respect to the examples of FIGS. 2D-2J and their associated descriptions.

The described techniques related to automated identification of matching buildings, such as based on building floor plans that have attributes satisfying target criteria, may further include additional operations in some embodiments. For example, in at least some embodiments, machine learning techniques may be used to learn the attributes and/or other characteristics of adjacency graphs to encode in corresponding vector embeddings that are generated, such as the attributes and/or other characteristics that best enable subsequent automated identification of building floor plans having attributes satisfying target criteria (e.g., number of bedrooms; number of bathrooms; connectivity between rooms; size and/or dimensions of each room; number of windows/doors in each room; types of views available from exterior windows, such as water, mountain, a back yard or other exterior area of the property, etc.; location of windows/doors in each room; etc.).

In addition, in at least some embodiments and situations, some or all of the images acquired for a building and associated with the building's floor plan may be panorama images that are each acquired at one of multiple acquisition locations in or around the building, such as to generate a panorama image at each such acquisition location from one or more of a video at that acquisition location (e.g., a 360° video taken from a smartphone or other mobile device held by a user turning at that acquisition location), or multiple images acquired in multiple directions from the acquisition location (e.g., from a smartphone or other mobile device held by a user turning at that acquisition location), or a simultaneous capture of all the image information (e.g., using one or more fisheye lenses), etc. Such images may include visual data, and in at least some embodiments and situations, acquisition metadata regarding the acquisition of such panorama images may be obtained and used in various manners, such as data acquired from IMU (inertial measurement unit) sensors or other sensors of a mobile device as it is carried by a user or otherwise moved between acquisition locations (e.g., compass heading data, GPS location data, etc.). It will be appreciated that such a panorama image may in some situations be represented in a spherical coordinate system and provide up to 360° coverage around horizontal and/or vertical axes, such that a user viewing a starting panorama image may move the viewing direction within the starting panorama image to different orientations to cause different images (or "views") to be rendered within the starting panorama image (including, if the panorama image is represented in a spherical coordinate system, to convert the image being rendered into a planar coordinate system). Additional details are included below related to the acquisition and usage of panorama images or other images for a building.

As noted above, automated operations of a BAMDM system may include identifying building floor plans that have attributes satisfying target criteria and subsequently using the identified floor plans in one or more further automated manners. In at least some embodiments, such an BAMDM system may operate in conjunction with one or more separate ICA (Image Capture and Analysis) systems and/or with one or more separate MIGM (Mapping Information and Generation Manager) systems, such as to obtain and use floor plan and other associated information for buildings from the ICA and/or MIGM systems, while in other embodiments such an BAMDM system may incorporate some or all functionality of such ICA and/or MIGM systems as part of the BAMDM system. In yet other embodiments, the BAMDM system may operate without using some or all functionality of the ICA and/or MIGM systems, such as if the BAMDM system obtains information about building floor plans and associated information from other sources (e.g., from manual creation or provision of such building floor plans and/or associated information by one or more users).

With respect to functionality of such an ICA system, it may perform automated operations in at least some embodiments to acquire images (e.g., panorama images) at various acquisition locations associated with a building (e.g., in the interior of multiple rooms of the building), and optionally further acquire metadata related to the image acquisition process (e.g., compass heading data, GPS location data, etc.) and/or to movement of a capture device between acquisition locations—in at least some embodiments, such acquisition and subsequent use of acquired information may occur without having or using information from depth sensors or other distance-measuring devices about distances from images' acquisition locations to walls or other objects in a surrounding building or other structure. For example, in at least some such embodiments, such techniques may include using one or more mobile devices (e.g., a camera having one or more fisheye lenses and mounted on a rotatable tripod or otherwise having an automated rotation mechanism; a camera having one or more fisheye lenses sufficient to capture 360 degrees horizontally without rotation; a smart phone held and moved by a user, such as to rotate the user's body and held smart phone in a 360° circle around a vertical axis; a camera held by or mounted on a user or the user's clothing; a camera mounted on an aerial and/or ground-based drone or other robotic device; etc.) to capture visual data from a sequence of multiple acquisition locations within multiple rooms of a house (or other building). Additional details are included elsewhere herein regarding operations of device(s) implementing an ICA system, such as to perform such automated operations, and in some cases to further interact with one or more ICA system operator user(s) in one or more manners to provide further functionality.

With respect to functionality of such an MIGM system, it may perform automated operations in at least some embodiments to analyze multiple 360° panorama images (and optionally other images) that have been acquired for a building interior (and optionally an exterior of the building), and determine room shapes and locations of passages connecting rooms for some or all of those panorama images, as well as to determine wall elements and other elements of some or all rooms of the building in at least some embodiments and situations. The types of connecting passages between two or more rooms may include one or more of doorway openings and other inter-room non-doorway wall openings, windows, stairways, non-room hallways, etc., and the automated analysis of the images may identify such elements based at least in part on identifying the outlines of the passages, identifying different content within the passages than outside them (e.g., different colors or shading), etc. The automated operations may further include using the determined information to generate a floor plan for the building and to optionally generate other mapping information for the building, such as by using the inter-room passage information and other information to determine relative positions of the associated room shapes to each other, and to optionally add distance scaling information and/or various other types of information to the generated floor plan. In addition, the MIGM system may in at least some embodiments perform further automated operations to determine and associate additional information with a building floor plan and/or specific rooms or locations within the floor plan, such as to analyze images and/or other environmental information (e.g., audio) captured within the building interior to determine particular attributes (e.g., a color and/or material type and/or other characteristics of particular features or other elements, such as a floor, wall, ceiling, countertop, furniture, fixture, appliance, cabinet, island, fireplace, etc.; the presence and/or absence of particular features or other elements; etc.), or to otherwise determine relevant attributes (e.g., directions that building features or other elements face, such as windows; views from particular windows or other locations; etc.). Additional details are included below regarding operations of computing device(s) implementing an MIGM system, such as to perform such automated operations and in some cases to further interact with one or more MIGM system operator user(s) in one or more manners to provide further functionality.

For illustrative purposes, some embodiments are described below in which specific types of information are acquired, used and/or presented in specific ways for specific types of structures and by using specific types of devices—however, it will be understood that the described techniques may be used in other manners in other embodiments, and that the invention is thus not limited to the exemplary details provided. As one non-exclusive example, while specific types of data structures (e.g., floor plans, adjacency graphs, vector embeddings, etc.) are generated and used in specific manners in some embodiments, it will be appreciated that other types of information to describe floor plans and other associated information may be similarly generated and used in other embodiments, including for buildings (or other structures or layouts) separate from houses, and that floor plans identified as matching specified criteria may be used in other manners in other embodiments. In addition, the term "building" refers herein to any partially or fully enclosed structure, typically but not necessarily encompassing one or more rooms that visually or otherwise divide the interior space of the structure—non-limiting examples of such buildings include houses, apartment buildings or individual apartments therein, condominiums, office buildings, commercial buildings or other wholesale and retail structures (e.g., shopping malls, department stores, warehouses, etc.), supplemental structures on a property with another main building (e.g., a detached garage or shed on a property with a house), etc. The term "acquire" or "capture" as used herein with reference to a building interior, acquisition location, or other location (unless context clearly indicates otherwise) may refer to any recording, storage, or logging of media, sensor data, and/or other information related to spatial characteristics and/or visual characteristics and/or otherwise perceivable characteristics of the building interior or subsets thereof, such as by a recording device or by another device that receives information from the recording device. As used herein, the term "panorama image" may refer to a visual representation that is based on, includes or is separable into multiple discrete component images originating from a substantially similar physical location in different directions and that depicts a larger field of view than any of the discrete component images depict individually, including images with a sufficiently wide-angle view from a physical location to include angles beyond that perceivable from a person's gaze in a single direction. The term "sequence" of acquisition locations, as used herein, refers generally to two or more acquisition locations that are each visited at least once in a corresponding order, whether or not other non-acquisition locations are visited between them, and whether or not the visits to the acquisition locations occur during a single continuous period of time or at multiple different times, or by a single user and/or device or by multiple different users and/or devices. In addition, various details are provided in the drawings and text for exemplary purposes, but are not intended to limit the scope of the invention. For example, sizes and relative positions of elements in the drawings are not necessarily drawn to scale, with some details omitted and/or provided with greater prominence (e.g., via size and positioning) to enhance legibility and/or clarity. Furthermore, identical reference numbers may be used in the drawings to identify the same or similar elements or acts.

FIG. 1 includes an example block diagram of various computing devices and systems that may participate in the described techniques in some embodiments, such as with respect to the example building 198 (in this example, a house) and the example Building Attribute Match Determination Manager ("BAMDM") system 140 executing on one or more server computing systems 180 in this example embodiment. In particular, an Interior Capture and Analysis ("ICA") system (e.g., an ICA system 160 executing on the one or more server computing systems 180, such as part of the BAMDM system; an ICA system application 154 executing on a mobile image acquisition device 185; etc.) captures information 165 with respect to one or more buildings or other structures (e.g., by capturing one or more 360° panorama images and/or other images for multiple acquisition locations 210 in an example house 198), and a MIGM (Mapping Information Generation Manager) system 160 executing on the one or more server computing systems 180 (e.g., as part of the BAMDM system) further uses that captured building information and optionally additional supporting information (e.g., supplied by system operator users via computing devices 105 over intervening computer network(s) 170) to generate and provide building floor plans 155 and/or other mapping-related information (not shown) for the building(s) or other structure(s). Additional details related to the automated operation of the ICA and MIGM systems are included elsewhere herein, including with respect to FIGS. 2A-2J and with respect to FIGS. 5 and 6A-6B, respectively.

In the illustrated embodiment, the ICA and MIGM systems 160 are operating as part of the BAMDM system 140 that analyzes building information 142 (e.g., images 165 acquired by the ICA system, floor plans 155 generated by the MIGM system, etc.) and generates and uses corresponding building information 145 (e.g., adjacency graphs, hierarchical vector embeddings, etc.) as part of identifying buildings that match each other or other indicated criteria and subsequently using floor plans and other information about the buildings in one or more further automated manners, optionally using supporting information supplied by system operator users via computing devices 105 over intervening computer network(s) 170, and in some embodiments and situations by using one or more trained machine learning models 144 as part of the analysis of the building information and/or generation of the hierarchical vector embeddings. In the illustrated embodiment, the BAMDM system 140 stores information 142 about floor plans (e.g., to include some or all of the floor plans 155 and/or other floor plans) and information associated with those floor plans (e.g., images and other data captured in the interiors of the buildings to which the floor plans correspond, such as with information about the locations on the floor plans at which such data is captured), and uses that information 142 to generate related adjacency graphs and vector embeddings 145 for further use in identifying building floor plans 142 that have attributes satisfying target criteria—such target criteria may in some embodiments and situations be supplied by or otherwise associated with particular users (e.g., attributes specified by users, floor plans indicated by those users, floor plans previously identified as being of interest to the users, etc.), and corresponding information 143 about various users may further be stored and used in the identifying of the building floor plans that have attributes satisfying target criteria and the subsequent use of the identified floor plans in one or more further automated manners. In addition, the BAMDM system 140 in the illustrated embodiment may further include one or more trained machine learning models 144 (e.g., one or more trained neural networks) and use the trained machine learning model(s) in various manners, including in some embodiments to generate hierarchical vector embeddings for a building based at least in part on an adjacency graph for the building, to take a building's adjacency graph and/or corresponding vector embedding as input and predict information about types of rooms and/or about types of inter-room connections or other adjacencies, etc. Furthermore, in at least some embodiments and situations, one or more users of BAMDM client computing devices 105 may further interact over the network(s) 170 with the BAMDM system 140, such as to assist with some of the automated operations of the BAMDM system for identifying building floor plans having attributes satisfying target criteria and for subsequent use of the identified floor plans in one or more further automated manners. Additional details related to the automated operation of the BAMDM system are included elsewhere herein, including with respect to FIGS. 2D-2J and FIGS. 6A-6B.

While the ICA and MIGM systems 160 are illustrated in this example embodiment as executing on the same server computing system(s) 180 as the BAMDM system (e.g., with all systems being operated by a single entity or otherwise being executed in coordination with each other, such as with some or all functionality of all the systems integrated together), in other embodiments the ICA system 160 and/or MIGM system 160 and/or BAMDM system 140 may operate on one or more other systems separate from the system(s) 180 (e.g., on mobile device 185; one or more other computing systems, not shown; etc.), whether instead of or in addition to the copies of those systems executing on the system(s) 180 (e.g., to have a copy of the MIGM system 160 executing on the device 185 to incrementally generate at least partial building floor plans as building images are acquired by the ICA system 160 executing on the device 185 and/or by that copy of the MIGM system, while another copy of the MIGM system optionally executes on one or more server computing systems to generate a final complete building floor plan after all images are acquired), and in yet other embodiments the BAMDM may instead operate without an ICA system and/or MIGM system and instead obtain panorama images (or other images) and/or building floor plans from one or more external sources.

Various components of the mobile computing device 185 are also illustrated in FIG. 1, including one or more hardware processors 132 (e.g., CPUs, GPUs, etc.) that execute software (e.g., ICA application 154, optional browser 162, etc.) using executable instructions stored and/or loaded on one or more memory/storage components 152 of the device 185, and optionally one or more imaging systems 135 of one or more types to acquire visual data of one or more panorama images 165 and/or other images (not shown, such as rectilinear perspective images)—some or all such images may in some embodiments be supplied by one or more separate associated camera devices 184 (e.g., via a wired/cabled connection, via Bluetooth or other inter-device wireless communications, etc.), whether in addition to or instead of images captured by the mobile device 185. The illustrated embodiment of mobile device 185 further includes one or more sensor modules 148 that include a gyroscope 148a, accelerometer 148b and compass 148c in this example (e.g., as part of one or more IMU units, not shown separately, on the mobile device), one or more control systems 147 managing I/O (input/output) and/or communications and/or networking for the device 185 (e.g., to receive instructions from and present information to the user) such as for other device I/O and communication components 143 (e.g., network interfaces or other connections, keyboards, mice or other pointing devices, microphones, speakers, GPS receivers, etc.), a display system 149 (e.g., with a touch-sensitive screen), optionally one or more depth-sensing sensors or other distance-measuring components 136 of one or more types, optionally a GPS (or Global Positioning System) sensor 134 or other position determination sensor (not shown in this example), etc. Other computing devices/systems 105, 175 and 180 and/or camera devices 184 may include various hardware components and stored information in a manner analogous to mobile device 185, which are not shown in this example for the sake of brevity, and as discussed in greater detail below with respect to FIG. 3.

One or more users (not shown) of one or more client computing devices 175 may further interact over one or more computer networks 170 with the BAMDM system 140 (and optionally the ICA system 160 and/or MIGM system 160), such as to assist in identifying building floor plans having attributes satisfying target criteria and in subsequently using the identified floor plans in one or more further automated manners—such interactions by the user(s) may include, for example, specifying target criteria to use in searching for corresponding floor plans or otherwise providing information about target criteria of interest to the users, or obtaining and optionally interacting with one or more particular identified floor plans and/or with additional associated information (e.g., to change between a floor plan view and a view of a particular image at an acquisition location within or near the floor plan; to change the horizontal and/or vertical viewing direction from which a corresponding view of a panorama image is displayed, such as to determine a portion of a panorama image to which a current user viewing direction is directed, etc.). In addition, a floor plan (or portion of it) may be linked to or otherwise associated with one or more other types of information, including for a floor plan of a multi-story or otherwise multi-level building to have multiple associated sub-floor plans for different stories or levels that are interlinked (e.g., via connecting stairway passages), for a two-dimensional ("2D") floor plan of a building to be linked to or otherwise associated with a three-dimensional ("3D") rendering of the building, etc. Also, while not illustrated in FIG. 1, in some embodiments the client computing devices 175 (or other devices, not shown) may receive and use information about identified floor plans and/or other mapping-related information in additional manners, such as to control or assist automated navigation activities by those devices (e.g., by autonomous vehicles or other devices), whether instead of or in addition to display of the identified information.

In the depicted computing environment of FIG. 1, the network 170 may be one or more publicly accessible linked networks, possibly operated by various distinct parties, such as the Internet. In other implementations, the network 170 may have other forms. For example, the network 170 may instead be a private network, such as a corporate or university network that is wholly or partially inaccessible to non-privileged users. In still other implementations, the network 170 may include both private and public networks, with one or more of the private networks having access to and/or from one or more of the public networks. Furthermore, the network 170 may include various types of wired and/or wireless networks in various situations. In addition, the client computing devices 175 and server computing systems 180 may include various hardware components and stored information, as discussed in greater detail below with respect to FIG. 3.

In the example of FIG. 1, the ICA system may perform automated operations involved in generating multiple 360° panorama images at multiple associated acquisition locations (e.g., in multiple rooms or other locations within a building or other structure and optionally around some or all of the exterior of the building or other structure), such as using visual data acquired via the mobile device(s) 185 and/or associated camera devices 184, and for use in generating and providing a representation of an interior of the building or other structure. For example, in at least some such embodiments, such techniques may include using one or more mobile devices (e.g., a camera having one or more fisheye lenses and mounted on a rotatable tripod or otherwise having an automated rotation mechanism, a camera having sufficient fisheye lenses to capture 360° horizontally without rotation, a smart phone held and moved by a user, a camera held by or mounted on a user or the user's clothing, etc.) to capture data from a sequence of multiple acquisition locations within multiple rooms of a house (or other building), and to optionally further capture data involved in movement of the acquisition device (e.g., movement at an acquisition location, such as rotation; movement between some or all of the acquisition locations, such as for use in linking the multiple acquisition locations together; etc.), in at least some cases without having distances between the acquisition locations being measured or having other measured depth information to objects in an environment around the acquisition locations (e.g., without using any depth-sensing sensors). After an acquisition location's information is captured, the techniques may include producing a 360° panorama image from that acquisition location with 360 degrees of horizontal information around a vertical axis (e.g., a 360° panorama image that shows the surrounding room in an equirectangular format), and then providing the panorama images for subsequent use by the MIGM and/or BAMDM systems. Additional details related to embodiments of a system providing at least some such functionality of an ICA system are included in U.S. Non-Provisional patent application Ser. No. 16/693,286, filed Nov. 23, 2019 and entitled "Connecting And Using Building Data Acquired From Mobile Devices" (which includes disclosure of an example BICA system that is generally directed to obtaining and using panorama images from within one or more buildings or other structures); in U.S. Non-Provisional patent application Ser. No. 16/236,187, filed Dec. 28, 2018 and entitled "Automated Control Of Image Acquisition Via Use Of Acquisition Device Sensors" (which includes disclosure of an example ICA system that is generally directed to obtaining and using panorama images from within one or more buildings or other structures); and in U.S. Non-Provisional patent application Ser. No. 16/190,162, filed Nov. 14, 2018 and entitled "Automated Mapping Information Generation From Inter-Connected Images"; each of which is incorporated herein by reference in its entirety.

Figure 7:
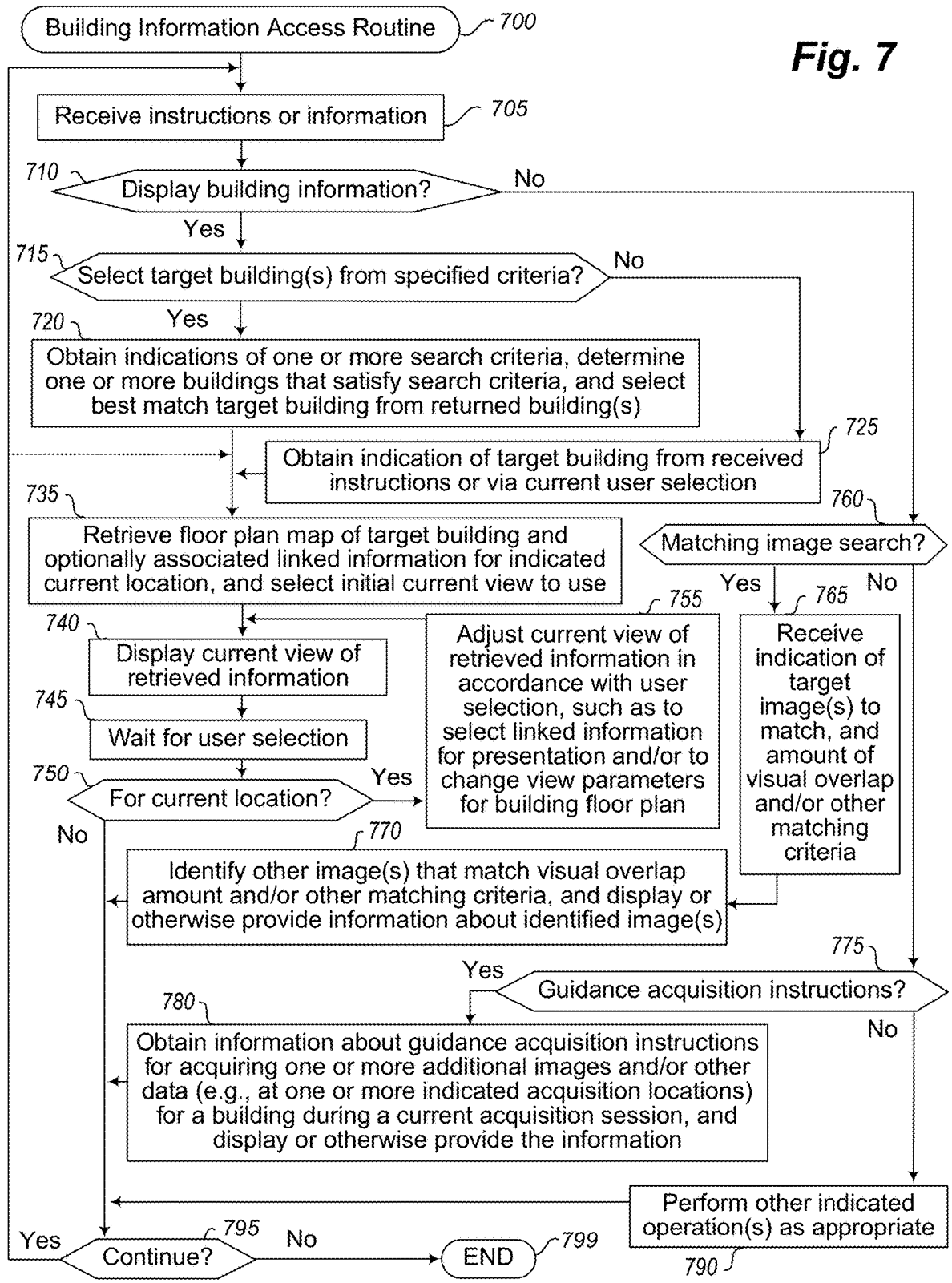
FIG. 7 illustrates an example embodiment of a flow diagram for a Building Information Access system routine in accordance with an embodiment of the present disclosure.

One or more end users (not shown) of one or more building information access client computing devices 175 may further interact over computer networks 170 with the BAMDM system 140 (and optionally the MIGM system 160 and/or ICA system 160), such as to obtain, display and interact with a generated floor plan (and/or other generated mapping information) and/or associated images (e.g., by supplying information about one or more indicated buildings of interest and/or other criteria and receiving information about one or more corresponding matching buildings), as discussed in greater detail elsewhere herein, including with respect to FIG. 7. In addition, while not illustrated in FIG. 1, a floor plan (or portion of it) may be linked to or otherwise associated with one or more additional types of information, such as one or more associated and linked images or other associated and linked information, including for a two-dimensional ("2D") floor plan of a building to be linked to or otherwise associated with a separate 2.5D model floor plan rendering of the building and/or a 3D model floor plan rendering of the building, etc., and including for a floor plan of a multi-story or otherwise multi-level building to have multiple associated sub-floor plans for different stories or levels that are interlinked (e.g., via connecting stairway passages) or are part of a common 2.5D and/or 3D model. Accordingly, non-exclusive examples of an end user's interactions with a displayed or otherwise generated 2D floor plan of a building may include one or more of the following: to change between a floor plan view and a view of a particular image at an acquisition location within or near the floor plan; to change between a 2D floor plan view and a 2.5D or 3D model view that optionally includes images texture-mapped to walls of the displayed model; to change the horizontal and/or vertical viewing direction from which a corresponding subset view of (or portal into) a panorama image is displayed, such as to determine a portion of a panorama image in a 3D coordinate system to which a current user viewing direction is directed, and to render a corresponding planar image that illustrates that portion of the panorama image without the curvature or other distortions present in the original panorama image; etc. Additional details regarding a BHP (Building Information Integrated Presentation) system and/or an ILTM (Image Locations Transition Manager) system, which are example embodiments of systems to provide or otherwise support at least some functionality of a building information access system and routine as discussed herein, are included in U.S. Non-Provisional patent application Ser. No. 16/681,787, filed Nov. 12, 2019 and entitled "Presenting Integrated Building Information Using Three-Dimensional Building Models," and in U.S. Non-Provisional patent application Ser. No. 15/950,881, filed Apr. 11, 2018 and entitled "Presenting Image Transition Sequences Between Acquisition Locations," each of which is incorporated herein by reference in its entirety. In addition, while not illustrated in FIG. 1, in some embodiments the client computing devices 175 (or other devices, not shown) may receive and use generated floor plans and/or other generated mapping-related information in additional manners, such as to control or assist automated navigation activities by those devices (e.g., by autonomous vehicles or other devices), whether instead of or in addition to display of the generated information.

FIG. 1 further depicts an exemplary building interior environment in which 360° panorama images and/or other images are acquired, such as by the ICA system and for use by the MIGM system (e.g., under control of the BAMDM system) to generate and provide one or more corresponding building floor plans (e.g., multiple incremental partial building floor plans) and by the BAMDM system to further use such building information as part of automated building matching determination operations. In particular, FIG. 1 illustrates one story of a multi-story house (or other building) 198 with an interior that was captured at least in part via multiple panorama images, such as by a mobile image acquisition device 185 with image acquisition capabilities and/or one or more associated camera devices 184 as they are moved through the building interior to a sequence of multiple acquisition locations 210 (e.g., starting at acquisition location 210A, moving to acquisition location 210B along travel path 115, etc., and ending at acquisition location 210-0 or 210P outside of the building). An embodiment of the ICA system may automatically perform or assist in the capturing of the data representing the building interior (as well as to further analyze the captured data to generate 360° panorama images to provide a visual representation of the building interior), and an embodiment of the MIGM system may analyze the visual data of the acquired images to generate one or more building floor plans for the house 198 (e.g., multiple incremental building floor plans). While such a mobile image acquisition device may include various hardware components, such as a camera, one or more sensors (e.g., a gyroscope, an accelerometer, a compass, etc., such as part of one or more IMUs, or inertial measurement units, of the mobile device; an altimeter; light detector; etc.), a GPS receiver, one or more hardware processors, memory, a display, a microphone, etc., the mobile device may not in at least some embodiments have access to or use equipment to measure the depth of objects in the building relative to a location of the mobile device, such that relationships between different panorama images and their acquisition locations in such embodiments may be determined in part or in whole based on features in different images but without using any data from any such depth sensors, while in other embodiments such depth data may be used. In addition, while directional indicator 109 is provided in FIG. 1 for reference of the reader relative the example house 198, the mobile device and/or ICA system may not use such absolute directional information and/or absolute locations in at least some embodiments, such as to instead determine relative directions and distances between acquisition locations 210 without regard to actual geographical positions or directions in such embodiments, while in other embodiments such absolute directional information and/or absolute locations may be obtained and used.

In operation, the mobile device 185 and/or camera device(s) 184 arrive at a first acquisition location 210A within a first room of the building interior (in this example, in a living room accessible via an external door 190-1), and captures or acquires a view of a portion of the building interior that is visible from that acquisition location 210A (e.g., some or all of the first room, and optionally small portions of one or more other adjacent or nearby rooms, such as through doorway wall openings, non-doorway wall openings, hallways, stairways or other connecting passages from the first room). The view capture may be performed in various manners as discussed herein, and may include a number of objects or other features (e.g., structural details) that may be visible in images captured from the acquisition location—in the example of FIG. 1, such objects or other features within the building 198 include the doorways 190 (including 190-1 through 190-6, such as with swinging and/or sliding doors), windows 196 (including 196-1 through 196-8), corners or edges 195 (including corner 195-1 in the northwest corner of the building 198, corner 195-2 in the northeast corner of the first room, corner 195-3 in the southwest corner of the first room, corner 195-4 in the southeast corner of the first room, corner 195-5 at the northern edge of the inter-room passage between the first room and a hallway, etc.), furniture 191-193 (e.g., a couch 191; chair 192; table 193; etc.), pictures or paintings or televisions or other hanging objects 194 (such as 194-1 and 194-2) hung on walls, light fixtures (not shown in FIG. 1), various built-in appliances or fixtures or other structural elements (not shown in FIG. 1), etc. The user may also optionally provide a textual or auditory identifier to be associated with an acquisition location and/or a surrounding room, such as "living room" for one of acquisition locations 210A or 210B or for the room including acquisition locations 210A and/or 210B, while in other embodiments the ICA and/or MIGM system may automatically generate such identifiers (e.g., by automatically analyzing images and/or video and/or other recorded information for a building to perform a corresponding automated determination, such as by using machine learning; based at least in part on input from ICA and/or MIGM system operator users; etc.) or the identifiers may not be used.

After the first acquisition location 210A has been captured, the mobile device 185 and/or camera device(s) 184 may move or be moved to a next acquisition location (such as acquisition location 210B), optionally recording images and/or video and/or other data from the hardware components (e.g., from one or more IMUs, from the camera, etc.) during movement between the acquisition locations. At the next acquisition location, the mobile 185 and/or camera device(s) 184 may similarly capture a 360° panorama image and/or other type of image from that acquisition location. This process may repeat for some or all rooms of the building and in some cases external to the building, as illustrated for additional acquisition locations 210C-210P in this example, with the images from acquisition locations 210A to 210-0 being captured in a single image acquisition session in this example (e.g., in a substantially continuous manner, such as within a total of 5 minutes or 15 minutes), and with the image from acquisition location 210P optionally being acquired at a different time (e.g., from a street adjacent to the building or front yard of the building). In this example, multiple of the acquisition locations 210K-210P are external to but associated with the building 198, including acquisition locations 210L and 210M in one or more additional structures on the same property (e.g., an ADU, or accessory dwelling unit; a garage; a shed; etc.), acquisition location 210K on an external deck or patio 186, and acquisition locations 210N-210P at multiple yard locations on the property 241 (e.g., backyard 187, side yard 188, front yard including acquisition location 210P, etc.). The acquired images for each acquisition location may be further analyzed, including in some embodiments to render or otherwise place each panorama image in an equirectangular format, whether at the time of image acquisition or later, as well as further analyzed by the MIGM and/or BAMDM systems in the manners described herein.

Various details are provided with respect to FIG. 1, but it will be appreciated that the provided details are non-exclusive examples included for illustrative purposes, and other embodiments may be performed in other manners without some or all such details.

FIGS. 2A-2J illustrate examples of automatically identifying building floor plans that have attributes satisfying target criteria and subsequently using the identified floor plans in one or more automated manners, such as for the building 198 discussed in FIG. 1B.

Figure 2A:
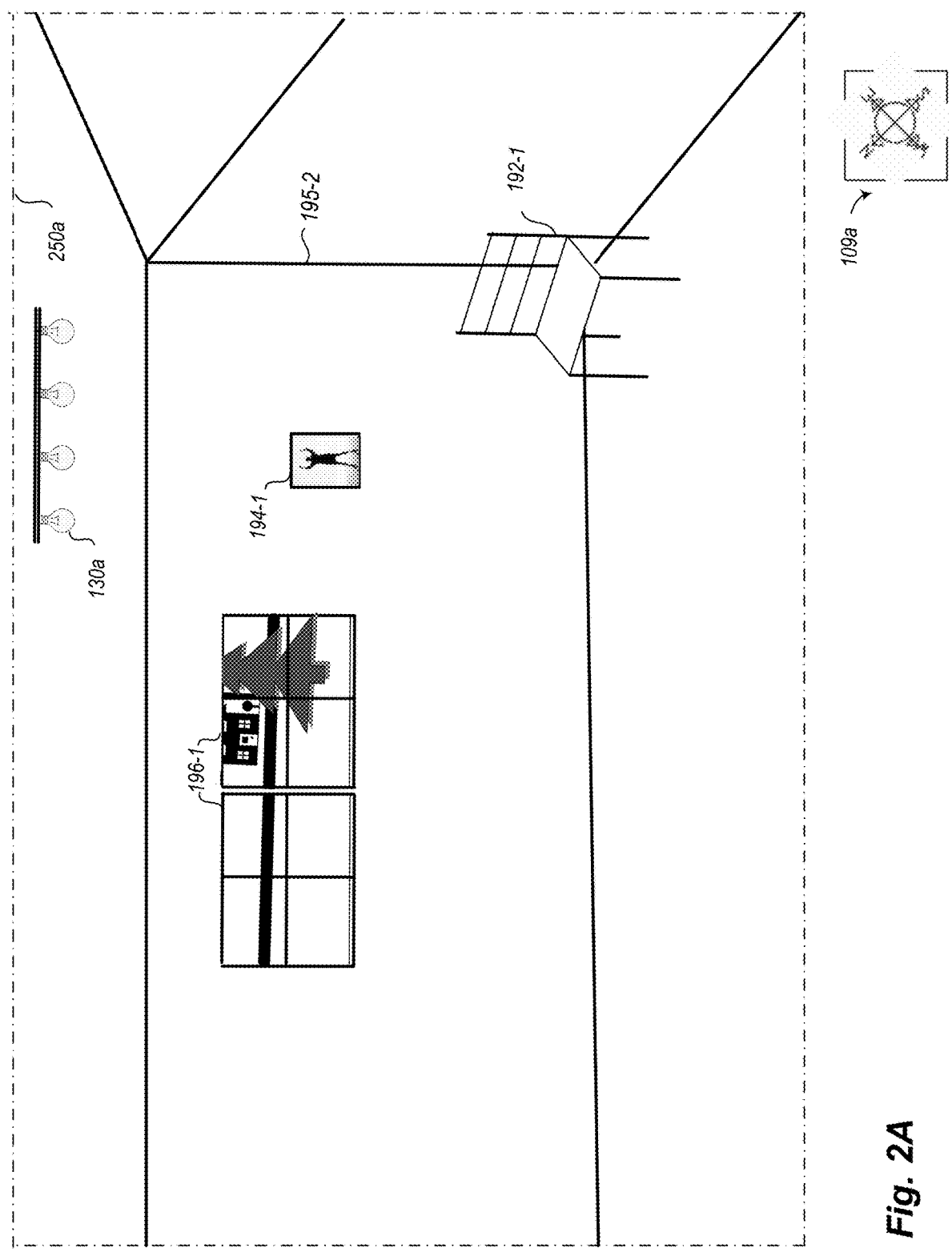

In particular, FIG. 2A illustrates an example image 250a, such as a non-panorama perspective image taken in a northeasterly direction from acquisition location 210B in the living room of house 198 of FIG. 1B (or a northeasterly facing subset view of a 360° panorama image taken from that acquisition location and formatted in a rectilinear manner)—the directional indicator 109a is further displayed in this example to illustrate the northeasterly direction in which the image is taken. In the illustrated example, the displayed image includes built-in elements (e.g., light fixture 130a), furniture (e.g., chair 192-1), two windows 196-1, and a picture 194-1 hanging on the north wall of the living room. No inter-room passages into or out of the living room (e.g., doorways or other wall openings) are visible in this image. However, multiple room borders are visible in the image 250a, including horizontal borders between a visible portion of the north wall of the living room and the living room's ceiling and floor, horizontal borders between a visible portion of the east wall of the living room and the living room's ceiling and floor, and the inter-wall vertical border 195-2 between the north and east walls.

Figure 2B:
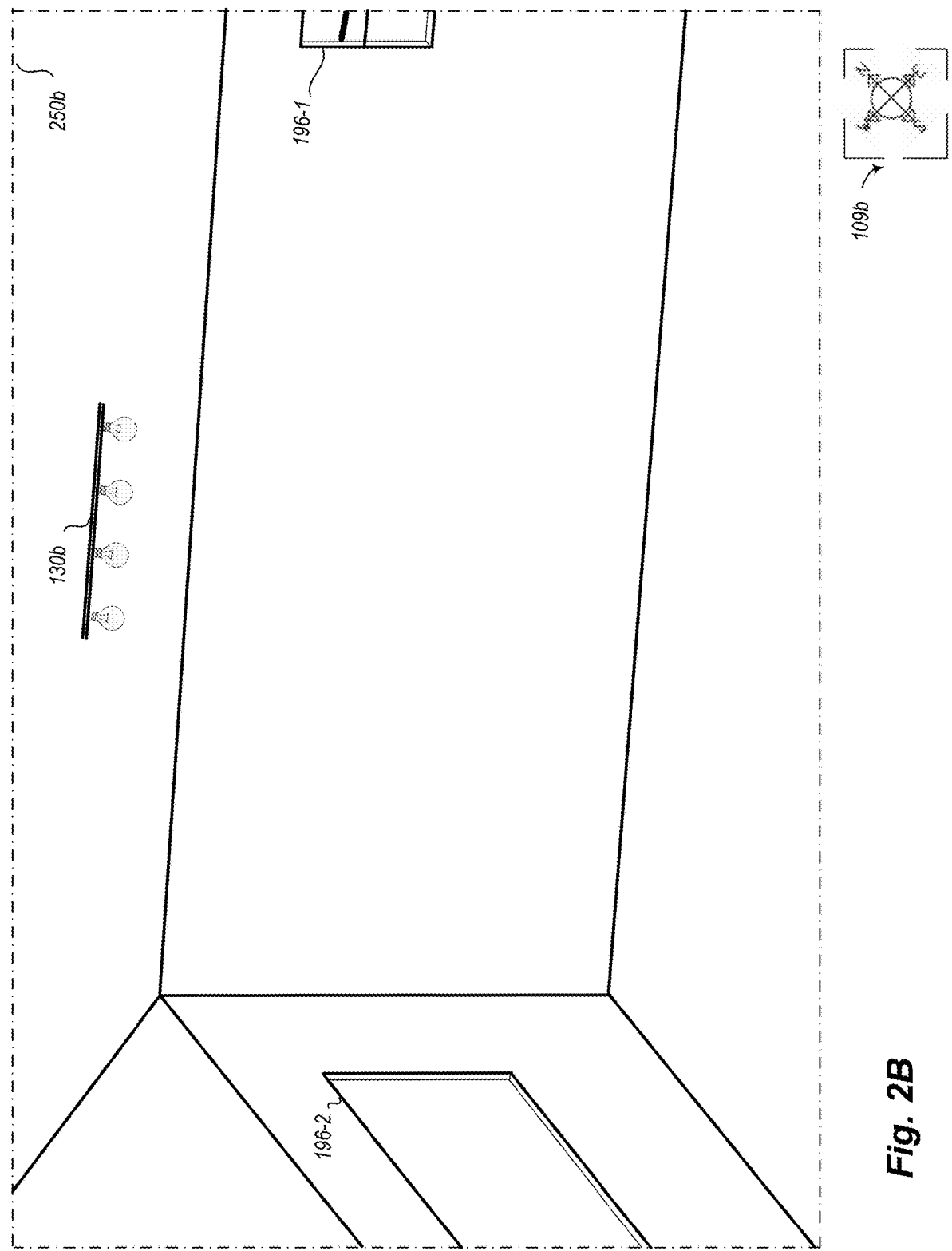

FIG. 2B continues the example of FIG. 2A, and illustrates an additional perspective image 250b taken in a northwesterly direction from acquisition location 210B in the living room of house 198 of FIG. 1B—the directional indicator 109b is further displayed to illustrate the northwesterly direction in which the image is taken. In this example image, a small portion of one of the windows 196-1 continues to be visible, along with a portion of window 196-2 and a new lighting fixture 130b. In addition, horizontal and vertical room borders are visible in image 250b in a manner similar to that of FIG. 2A.

Figure 2C:
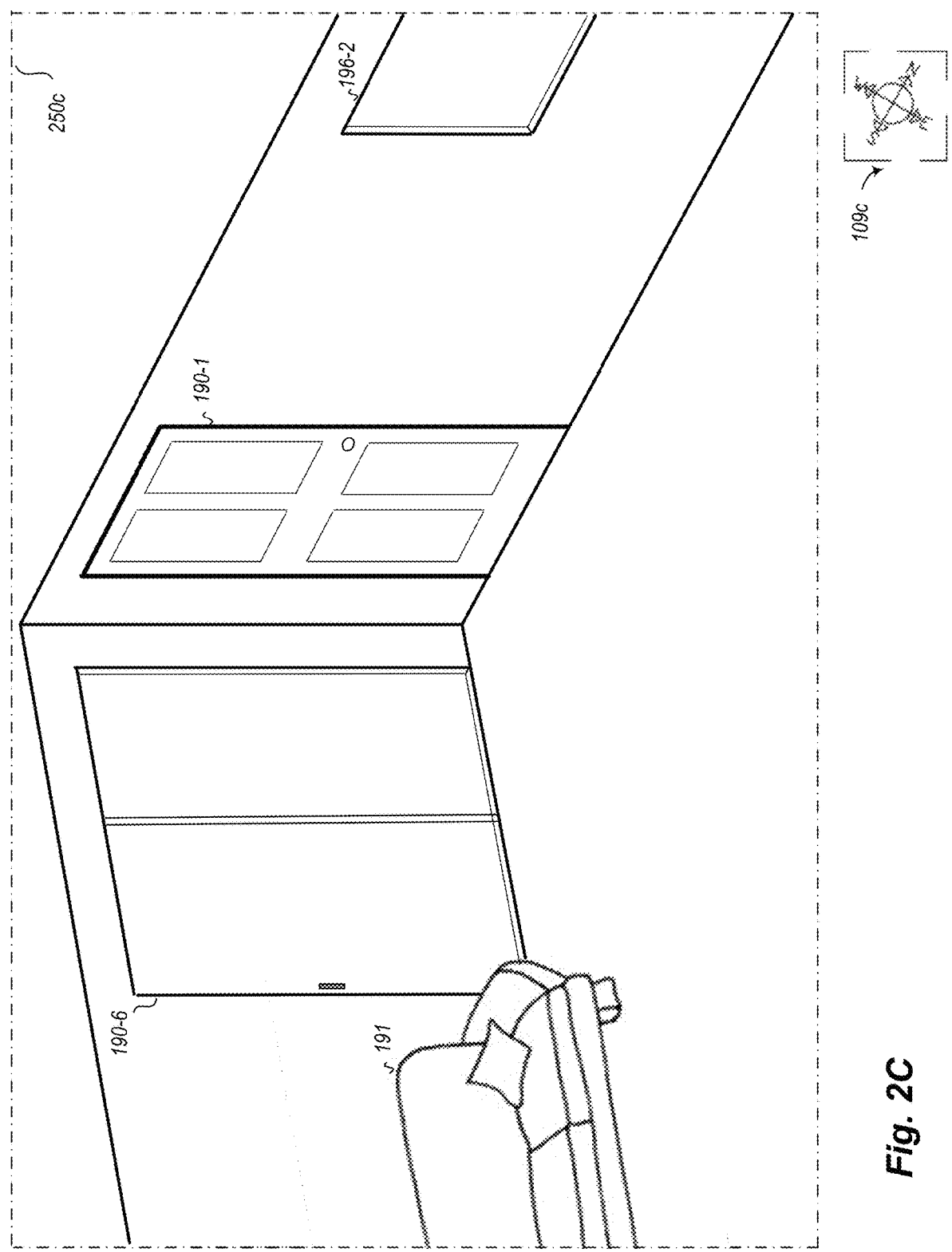

FIG. 2C continues the examples of FIGS. 2A-2B, and illustrates a third perspective image 250c taken in a southwesterly direction in the living room of house 198 of FIG. 1B, such as from acquisition location 210B—the directional indicator 109c is further displayed to illustrate the southwesterly direction in which the image is taken. In this example image, a portion of window 196-2 continues to be visible, as is a couch 191 and visual horizontal and vertical room borders in a manner similar to that of FIGS. 2A and 2B. This example image further illustrates two inter-room passages for the living room, which in this example include a doorway 190-1 with a swinging door to enter and leave the living room (which FIG. 1B identifies as a door to the exterior of the house, such as the front yard), and a doorway 190-6 with a sliding door to move between the living room and side yard 188—as is shown in the information in FIG. 1, an additional non-doorway wall opening 263a exists in the east wall of the living room to move between the living room and hallway, but is not visible in the images 250a-250c. It will be appreciated that a variety of other perspective images may be taken from acquisition location 210B and/or other acquisition locations and displayed in a similar manner.

Figure 2D:
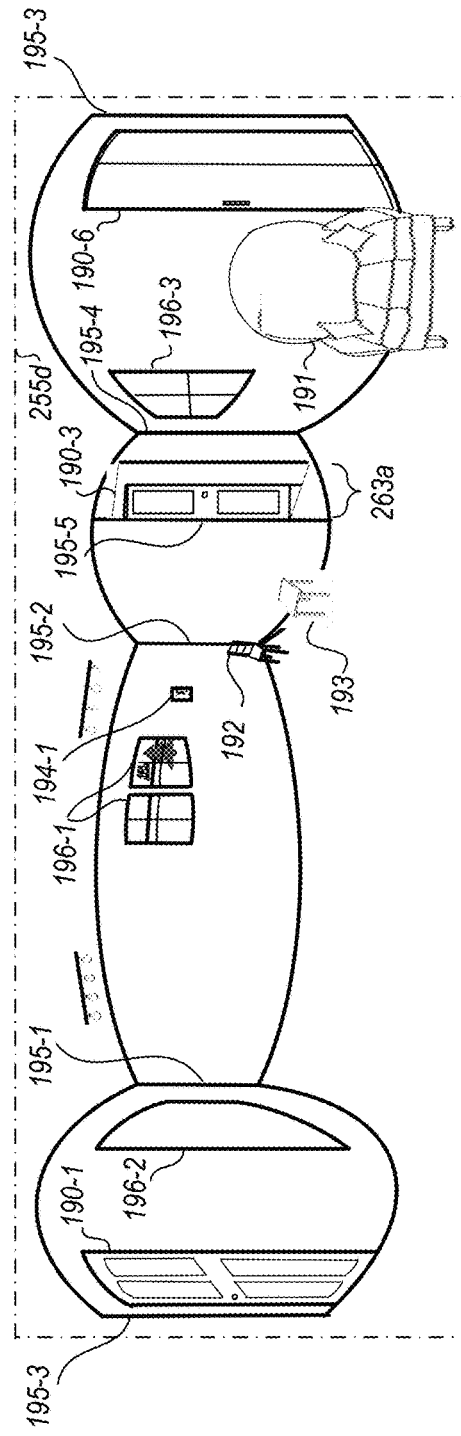
Figure 2D:
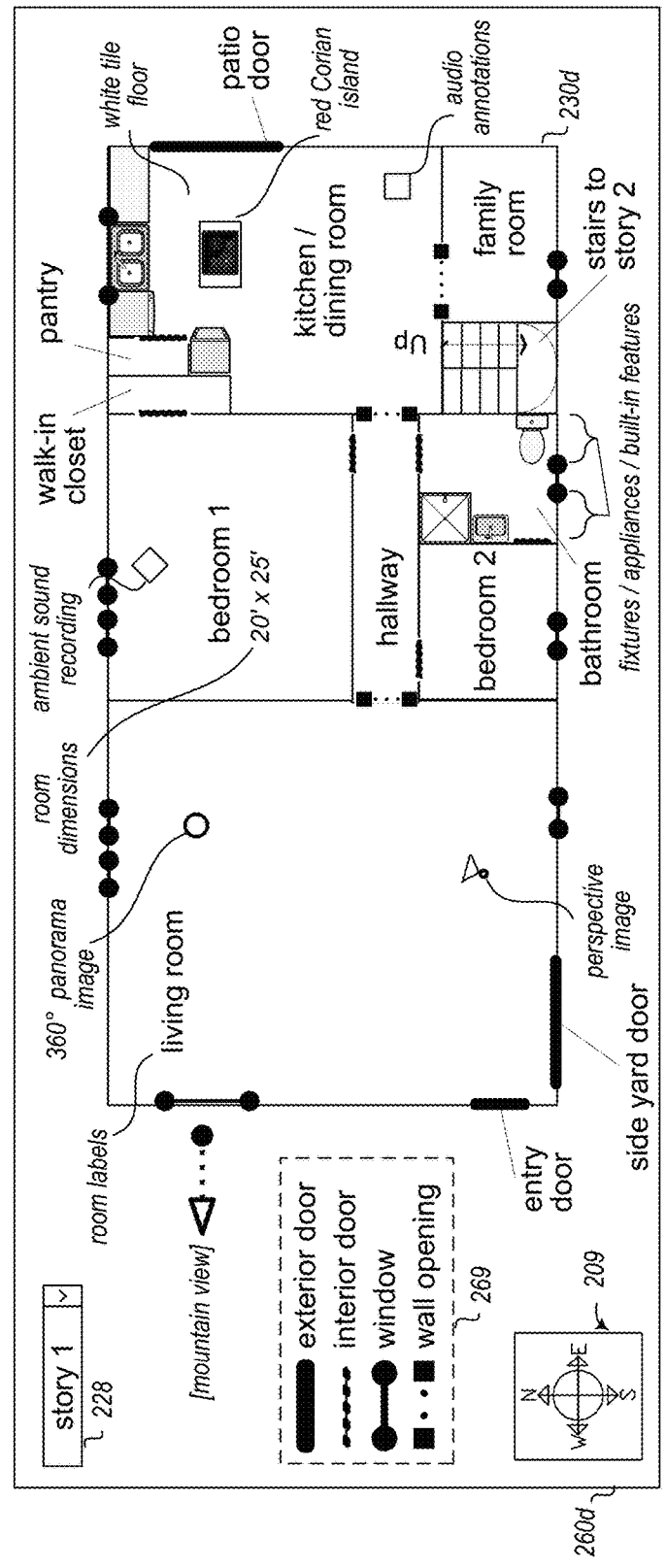

FIG. 2D continues the examples of FIGS. 2A-2C, and illustrates a 360° panorama image 255d (e.g., taken from acquisition location 210B), which displays the entire living room in an equirectangular format—since the panorama image does not have a direction in the same manner as the perspective images of FIGS. 2A-2C, the directional indicator 109 is not displayed in FIG. 2D, although a pose for the panorama image may include one or more associated directions (e.g., a starting and/or ending direction for the panorama image, such as if acquired via rotation). A portion of the visual data of panorama image 255d corresponds to the first perspective image 250a (shown in approximately the center portion of the image 250d), while the left portion of the image 255d and the far-right portion of the image 255d contain visual data corresponding to those of the perspective images 250b and 250c. This example panorama image 255d includes windows 196-1, 196-2 and 196-3, furniture 191-193, doorways 190-1 and 190-6, and non-doorway wall opening 263a to the hallway room (with the opening showing part of a door 190-3 visible in the adjacent hallway). Image 255d further illustrates a variety of room borders in a manner similar to that of the perspective images, but with the horizontal borders being displayed in an increasingly curved manner the farther they are from a horizontal midline of the image—the visible borders include vertical inter-wall borders 195-1 through 195-4, vertical border 195-5 at the north/left side of the hallway opening, vertical borders at the right side of the hallway opening, and horizontal borders between the walls and the floor and between the walls and the ceiling.

FIG. 2D further illustrates one example 260d of a 2D floor plan for the house 198, such as may be presented to an end-user in a GUI, with the living room being the most westward room of the house (as reflected by directional indicator 209)—it will be appreciated that a 3D or 2.5D floor plan with rendered wall height information may be similarly generated and displayed in some embodiments, whether in addition to or instead of such a 2D floor plan. Various types of information are illustrated on the 2D floor plan 260d in this example. For example, such types of information may include one or more of the following: room labels added to some or all rooms (e.g., "living room" for the living room); room dimensions added for some or all rooms; visual indications of features such as installed fixtures or appliances (e.g., kitchen appliances, bathroom items, etc.) or other built-in elements (e.g., a kitchen island) added for some or all rooms; visual indications added for some or all rooms of positions of additional types of associated and linked information (e.g., of other panorama images and/or perspective images that an end-user may select for further display, of audio annotations and/or sound recordings that an end-user may select for further presentation, etc.); visual indications added for some or all rooms of structural features such as doors and windows; visual indications of visual appearance information (e.g., color and/or material type and/or texture for installed items such as floor coverings or wall coverings or surface coverings); visual indications of views from particular windows or other building locations and/or of other information external to the building (e.g., a type of an external space; items present in an external space; other associated buildings or structures, such as sheds, garages, pools, decks, patios, walkways, gardens, etc.); a key or legend 269 identifying visual indicators used for one or more types of information; etc. When displayed as part of a GUI, some or all such illustrated information may be user-selectable controls (or be associated with such controls) that allows an end-user to select and display some or all of the associated information (e.g., to select the 360° panorama image indicator for acquisition location 210B to view some or all of that panorama image (e.g., in a manner similar to that of FIGS. 2A-2D). In addition, in this example a user-selectable control 228 is added to indicate a current story that is displayed for the floor plan, and to allow the end-user to select a different story to be displayed—in some embodiments, a change in stories or other levels may also be made directly from the floor plan, such as via selection of a corresponding connecting passage in the illustrated floor plan (e.g., the stairs to story 2). It will be appreciated that a variety of other types of information may be added in some embodiments, that some of the illustrated types of information may not be provided in some embodiments, and that visual indications of and user selections of linked and associated information may be displayed and selected in other manners in other embodiments.

Additional details related to embodiments of a system providing at least some such functionality of an MIGM system or related system for generating floor plans and associated information and/or presenting floor plans and associated information are included in co-pending U.S. Non-Provisional patent application Ser. No. 16/190,162, filed Nov. 14, 2018 and entitled "Automated Mapping Information Generation From Inter-Connected Images" (which includes disclosure of an example Floor Map Generation Manager, or FMGM, system that is generally directed to automated operations for generating and displaying a floor map or other floor plan of a building using images acquired in and around the building); in U.S. Non-Provisional patent application Ser. No. 16/681,787, filed Nov. 12, 2019 and entitled "Presenting Integrated Building Information Using Three-Dimensional Building Models" (which includes disclosure of an example FMGM system that is generally directed to automated operations for displaying a floor map or other floor plan of a building and associated information); in U.S. Non-Provisional patent application Ser. No. 16/841,581, filed Apr. 6, 2020 and entitled "Providing Simulated Lighting Information For Three-Dimensional Building Models" (which includes disclosure of an example FMGM system that is generally directed to automated operations for displaying a floor map or other floor plan of a building and associated information); in U.S. Provisional Patent Application No. 62/927,032, filed Oct. 28, 2019 and entitled "Generating Floor Maps For Buildings From Automated Analysis Of Video Of The Buildings' Interiors" (which includes disclosure of an example Video-To-Floor Map, or BAMDM, system that is generally directed to automated operations for generating a floor map or other floor plan of a building using video data acquired in and around the building); in U.S. Non-Provisional patent application Ser. No. 16/807,135, filed Mar. 2, 2020 and entitled "Automated Tools For Generating Mapping Information For Buildings" (which includes disclosure of an example MIGM system that is generally directed to automated operations for generating a floor map or other floor plan of a building using images acquired in and around the building); and in U.S. Non-Provisional patent application Ser. No. 17/013,323, filed Sep. 4, 2020 and entitled "Automated Analysis Of Image Contents To Determine The Acquisition Location Of The Image" (which includes disclosure of an example MIGM system that is generally directed to automated operations for generating a floor map or other floor plan of a building using images acquired in and around the building, and an example ILMM system for determining the acquisition location of an image on a floor plan based at least in part on an analysis of the image's contents); each of which is incorporated herein by reference in its entirety.

Figure 2E:
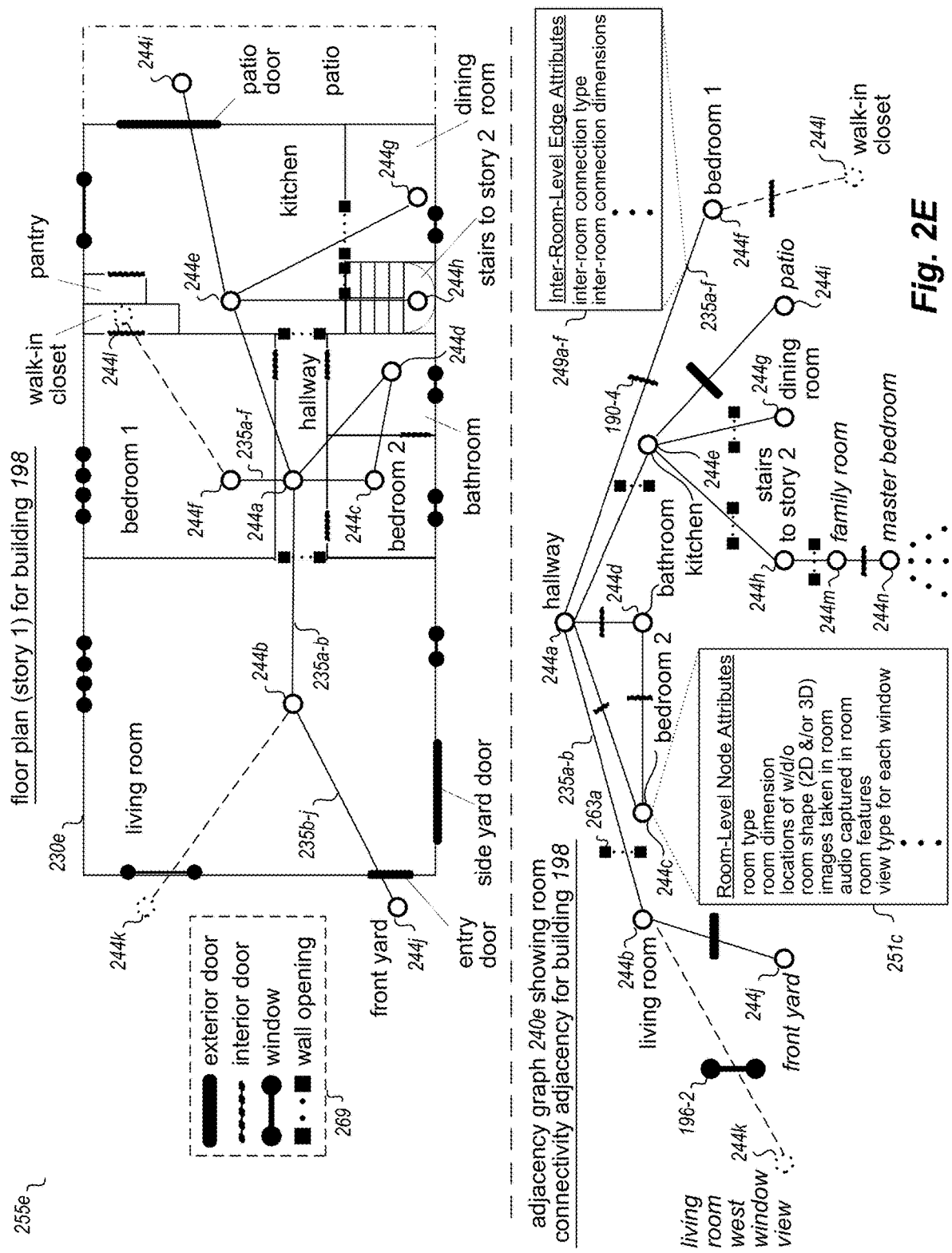

FIG. 2E continues the examples of FIGS. 2A-2D, and illustrates information 255e that includes a representation 230e of the floor plan 230d previously illustrated in FIG. 2D, with the representation 230e lacking some of the details illustrated in floor plan 230d, but further including information to illustrate at least part of an adjacency graph that is generated by the BAMDM system (not shown) for the floor plan and that is overlaid on the view of the floor plan in this example for the sake of illustration. In this example, the adjacency graph includes various nodes 244 that represent at least some rooms of the house (such as node 244b for the living room, node 244a for the hallway, etc.), and edges 235 between various of the nodes (such as an edge 235b-j between nodes 244b and 244j, an edge 235a-b between nodes 244a and 244b, an edge 235a-f between nodes 244a and 244f, etc.) that represent connections between rooms, with the adjacency graph in this example being a sparse graph that includes inter-node edges only between nodes whose rooms are inter-connected via doorways or other non-doorway openings (and do not include edges between nodes whose rooms are adjacent but not inter-connected, such as that share at least one part of at least one wall, but are not connected to allow direct passage between those rooms). While at least some rooms of the house are represented with associated nodes in the adjacency graph, in at least some embodiments, some spaces within the house may not be treated as rooms for the purpose of the adjacency graph (i.e., may not have separate nodes in the adjacency graph), such as for closets, small areas such as a pantry or a cupboard, connecting areas such as stairs and/or hallways, etc.—in this example embodiment, the stairs have a corresponding node 244h and the walk-in closet may optionally have a node 244l, while the pantry does not have a node, although none or all or any combination of those spaces may have nodes in other embodiments. In addition, in this example embodiment, areas outside of the building that are adjacent to building entries/exits also have nodes to represent them, such as node 244j corresponding to the front yard (which is accessible from the building by the entry door), and node 244i corresponding to the patio (which is accessible by the patio door)—in other embodiments, such external areas may not be represented as nodes (and instead may be represented in some embodiments as attributes associated with adjacent exterior doors or other openings and/or with their rooms). Similarly, in this example embodiment, information about areas that are visible from windows or from other building locations may also be represented by nodes, such as optional node 244k corresponding to the view accessible from the western window in the living room, although in other embodiments such views may not be represented as nodes (and instead may be represented in some embodiments as attributes associated with the corresponding window or other building location and/or with their rooms). It will be noted that, while some edges are shown on floor plan representation 230e as passing through walls (such as edge 235a-f between the node 244a for the hallway and node 244f for bedroom 1), the actual connections between the rooms corresponding to the nodes that such an edge connects are based on a doorway or other non-doorway opening connection (e.g., based on the interior doorway 190-4 between the hallway and bedroom 1 that is illustrated near the northeast end of the hallway, as further indicated in FIG. 1). In addition, while not illustrated in information 255e, the adjacency graph for the house may further continue in other areas of the house that are not shown, such as the second story.

FIG. 2E includes an additional illustration 240e of the adjacency graph for the floor plan 230e of building 198 but without the corresponding floor plan being shown, and with additional details illustrated for the adjacency graph. In particular, in this example, the various nodes and edges of the adjacency graph from information 255e are shown, along with additional nodes 244m and 244n corresponding to rooms of the second floor (not shown), and with additional nodes and edges potentially being added to the adjacency graph for further rooms and inter-room connectivity information (or in other embodiments, non-connected adjacency information as well). In the example of adjacency graph 240e, visual indications of the type of inter-room connectivity information are shown for the benefit of the viewer, such as visual indications of wall opening 263a and interior doorway 190-4 (as well as, in this example, window 196-2 between the living room and the westward view from the living room over the front yard), although such information may instead be part of the attributes of the edge and not visually shown. For example, each edge 235 between rooms and/or other areas (e.g., external areas) may include information 249 about attributes of the inter-room connectivity/adjacency represented by the edge, with example information 249a-f corresponding to edge 235a-f being shown, which in this example may include information for attributes such as one or more of the following: an inter-room connection type; inter-room connection dimensions (e.g., width; height and/or depth); etc. Similarly, each room-level node 244 representing a room or other area may include information 251 about attributes of the room or other area represented by the node, with example information 251c corresponding to node 244c being shown, which in this example may include information for attributes such as one or more of the following: room type or other area type; room dimensions or other area dimensions; locations in the room or other area of windows and doors and other inter-room openings; information about a shape of the room or other area (whether about a 2D shape and/or 3D shape); a type of view for each window, and optionally direction information that each window faces; optionally direction information for doorways and other non-doorway openings between rooms and/or other areas; information about other features of the room or other area, such as from analysis of associated images and/or information supplied by end-users who view the floor plan and optionally its associated images (e.g., visual appearance and types of materials used, such as colors and/or textures and/or types for carpets or other floor materials and for wall coverings and for ceilings; etc.; light fixtures or other built-in elements; furniture or other items within the room or other area; etc.); information about and/or copies of images taken in the room or other area (optionally with associated location information within the room or other area for each of the images); information about and/or copies of audio or other data captured in the room or other area (optionally with associated location information within the room or other area for each of the audio clips or other pieces of data); etc.

Figure 2F:
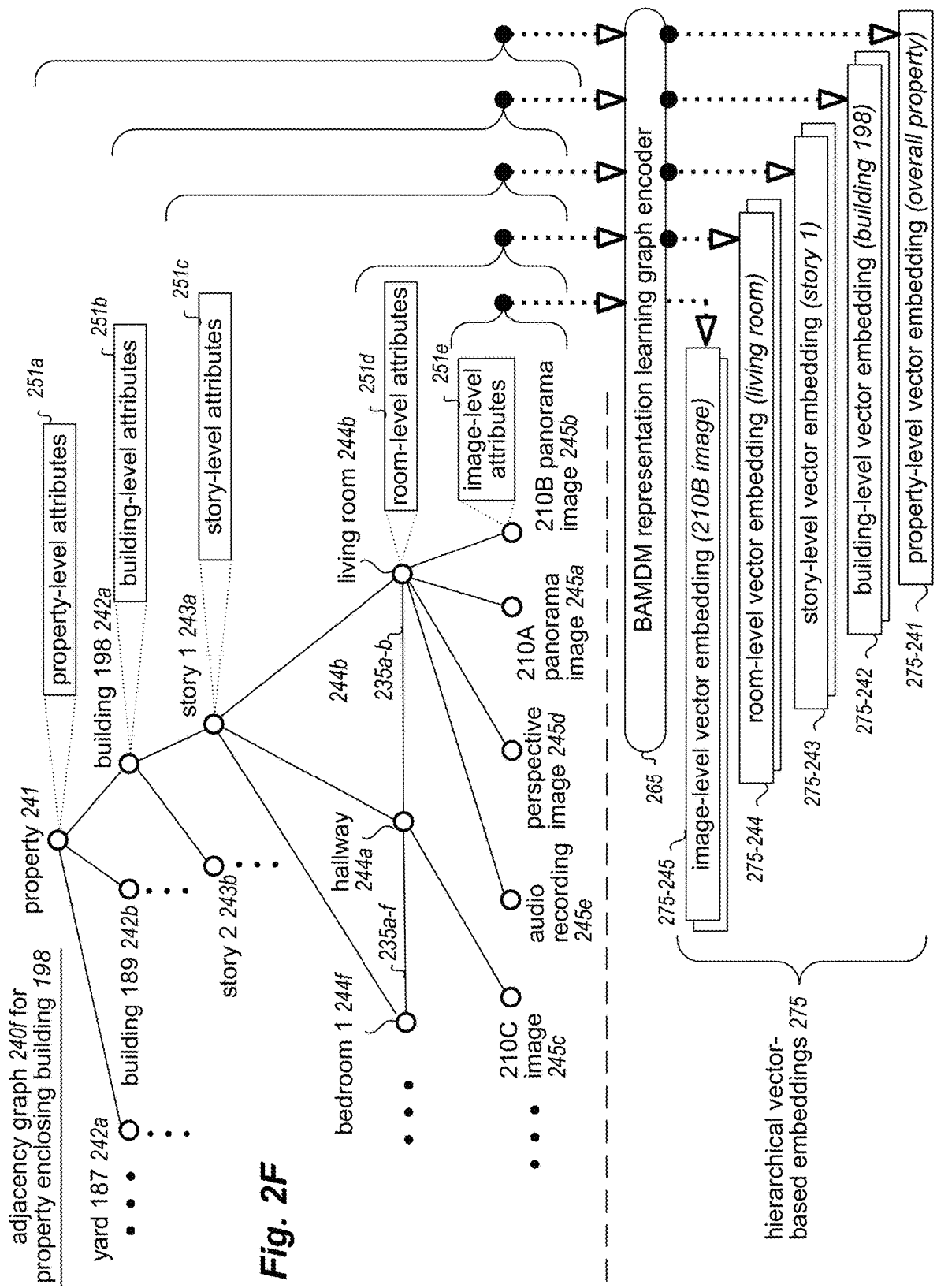

As discussed further with respect to FIG. 2F, an adjacency graph may in some embodiments include nodes at one or more additional levels of a hierarchy (e.g., a property level with each property-level node representing a property having one or more buildings and/or one or more external areas, a building level with each building-level node representing an entire building (optionally within a higher-level property), a story level with each story-level node representing a story or other level within a building and having one or more rooms or other areas, an image level with each image-level node representing a separate image, etc.), and each such node may further contain attributes specific to the entity that it represents. Non-exclusive examples of attributes for an image-level node representing an image may include the following: per-pixel information for the visible element to which the pixel corresponds, such as depth, element type, etc.; features visible in the image (e.g., automatically identified by image analysis), such as objects, appliances, fixtures, surface materials (e.g., for floors, walls, countertops, appliances, etc.); a position at which the image was acquired, optionally within an enclosing room or other area; etc., and some or all such image-level attributes may further be included in a higher-level node in the graph representing a room or other area in which the image was acquired. Non-exclusive examples of attributes for a story-level node representing a story encompassing one or more rooms or other areas may include the following: attributes related to a layout of the encompassed room(s) and/or other area(s) (e.g., subjective attributes determined by one or more trained machine learning models), such as accessibility, walkability, visibility between multiple rooms and/or areas, etc.; lighting information, optionally based in part on geographical location and orientation that affects sunlight at different times of day, month, season and year; etc., as well as optionally some or all room-level attributes for the rooms and/or other areas encompassed by the story, and with some or all such story-level attributes optionally further included in a higher-level node in the graph representing a building enclosing the floor. Non-exclusive examples of attributes for a building-level node representing a building and/or external area may include the following: numbers and types of rooms and/or areas (e.g., number of bedrooms and baths, a main-level master bedroom, a deck or patio or enclosed yard, etc.); floor layout information; age; manufacturer; remodeling status; sewer type; water source type; installed power generation system, such as solar panels and/or wind turbines; types of views; types of water access, such as water front; etc., as well as optionally some or all floor-level attributes for the floors encompassed by the building, and with some or all such building-level attributes optionally further included in a higher-level node in the graph representing a property that includes the building. Non-exclusive examples of attributes for a property-level node representing a property may include the following: numbers and types of buildings and/or external areas (e.g., number of separate units, etc.); etc., as well as optionally some or all building-level attributes for the building(s) and/or external areas that are part of the property.

FIG. 2F continues the examples of FIGS. 2A-2E, and illustrates an expanded version of the adjacency graph 240*e* of FIG. 2E in a hierarchical form in which the room-level nodes 244 of FIG. 2E are part of a room level in the hierarchy and each have room-level attributes 251*d* for the room or other area represented by the respective nodes 244, a higher-level story level with story-level nodes 243 each having story-level attributes 251*c* for the story or other group of rooms and/or other areas represented by the respective nodes 243, a higher-level building level with building-level nodes 242 each having building-level attributes 251*b* for the building or external area represented by the respective nodes 242, a higher-level property level with property-level node 241 having property-level attributes 251*a* for the property represented by the node 241, and an image level below the room level and having with image-level nodes 245 each having image-level attributes 2513 for the image represented by the respective nodes 245—as discussed in greater detail elsewhere herein, in some embodiments and situations, each node will include not only the node attributes for its level but also some or all of the attributes of the child nodes below that node, and in some embodiments and situations, the vector embedding generated to represent a node will include not only the information for that node but also some or all of the information in the vector embeddings generated for the child nodes below that node. FIG. 2F further illustrates the use of a representation learning graph encoder component 265 of the BAMDM system that takes various hierarchical levels of information from the adjacency graph information as input, and that generates resulting hierarchical vector embeddings 275 that represent corresponding information in the adjacency graph 240*e* for the floor plan 230*e*. As discussed in greater detail elsewhere herein, a vector embedding may be a concise representation of some or all of the information included in the corresponding node of the adjacency graph, such as for subsequent use in performing comparisons between floor plans of multiple buildings or for otherwise identifying floor plans matching specified criteria. In this example, an image-level vector embedding 275-245 is generated for each image-level node 245, a higher-level room-level vector embedding 275-244 is generated for each room-level node 244 and its children nodes, a higher-level story-level vector embedding 275-243 is generated for each story-level node 243 and its children and grandchildren nodes, a higher-level building-level vector embedding 275-242 is generated for each building-level node 242 and its children and grandchildren and great-grandchildren nodes, and a higher-level property-level vector embedding 275-241 is generated for the property-level node 241 and its children and grandchildren and great-grandchildren and great-great-grandchildren nodes—thus, the hierarchical vector embeddings 275 may similarly be treated as a hierarchy of vector embeddings based on the information that they encode, although such a hierarchy is not illustrated in this example for the hierarchical vector embeddings 275. In addition, the graph encoder 265 may use various specific algorithms to generate the vector embeddings 275, and in some embodiments the component 265 or an associated component (not shown) of the BAMDM system may automatically learn the types of information of the adjacency graph to include in the resulting vector embeddings, as discussed in greater detail elsewhere herein.

FIG. 2G continues the examples of FIGS. 2A-2F, and illustrates the vector embeddings 275 shown in FIG. 2F for indicated property 241 or building 198 (with either a highest-level vector embedding being vector embedding 275-241 for property 241 or a vector embedding 275-242 for building 198), and a database (or other storage structure) 268 with information about hierarchical vector embeddings 277 for multiple other buildings or properties, and optionally information 276 about hierarchical vector embeddings for one or more other indicated buildings or properties. As discussed in greater detail elsewhere herein, the comparison of two buildings or properties to determine their similarity may include using a component 266 of the BAMDM system to determine the distance (or other measure of difference or similarity) between two vector embeddings representing those two buildings or other properties (e.g., two building-level vector embeddings, two property-level vector embeddings, etc.), such as to produce one or more best match vector embedding results 290 representing one or more corresponding matching buildings or properties (not shown), and in some embodiments to further compare some or all lower-level vector embeddings (e.g., vector embeddings 275-243 and/or 275-244 and/or 275-245 for indicated building 198, or those and vector embeddings 275-242 for indicated property 241) for the two buildings or other properties to determine degrees of matching to corresponding vector embeddings at the same levels for the properties or buildings 231. In this example, the stored information 268 may include a variety of previously generated hierarchical vector embeddings 277a-277x for a variety of corresponding buildings or properties 231a-231x, with the vector embedding 275-241 or 275-242 from the vector embeddings 275 used in this example as a vector embedding for the indicated property 241 or building 198 that is compared to some or all of the vector embeddings in the database 268 at the same building or property levels (whether simultaneously or serially) in order to determine distances between that indicated vector embedding and those other vector embeddings stored in the database. In addition, in at least some embodiments and situations, the determination of the one or more best match floor plan embedding results 290 may be based not only on the indicated vector embeddings 275 but also optionally on one or more other vector embeddings 276 for one or more other indicated buildings or properties, such as to similarly compare each of the one or more other vector embeddings 276 to some or all of the vector embeddings stored in the database 268 (whether simultaneously or serially) in order to determine distances between each of those other vector embedding(s) 276 and those database vector embeddings 277, and with the best match vector embedding results 290 being based on the combination of the distance similarity information for the vector embeddings in the database to the indicated vector embeddings that are used. In other embodiments, the determiner component 266 may instead receive as input one or more indicated vector embeddings and multiple other vector embeddings to which the initial vector embedding(s) are compared, without the use of such a database of previously generated and stored vector embeddings. After the best match floor plan embedding results 290 have been generated, they may be further used in one or more automated manners in various embodiments, such as to provide information about the corresponding best-match property(ies) and/or building(s) (e.g., building floor plans) for the best-match vector embeddings to use in one or more of the following activities: automatically generating explanations or other descriptions of the similarities of the best-match property(ies) and/or building(s) to the indicated property(ies) and/or building(s) represented by the indicated vector embeddings (e.g., to provide reasons for the matching selection, such as further based on degrees of matching between lower-level vector embeddings for the best-match property(ies) and/or building(s) to vector embeddings at corresponding levels for the indicated property(ies) and/or building(s), and as discussed further with respect to FIG. 2H), presentation to an end-user, for use in providing further automated personalized interactions with an end-user (e.g., based on one or more indicated buildings or properties of interest to the end-user, such as from being selected by the end-user or previously identified to be of interest to the end-user), for comparative analysis to each other (e.g., to determine common characteristics, aggregate characteristics, etc.), etc.

Figure 2H:
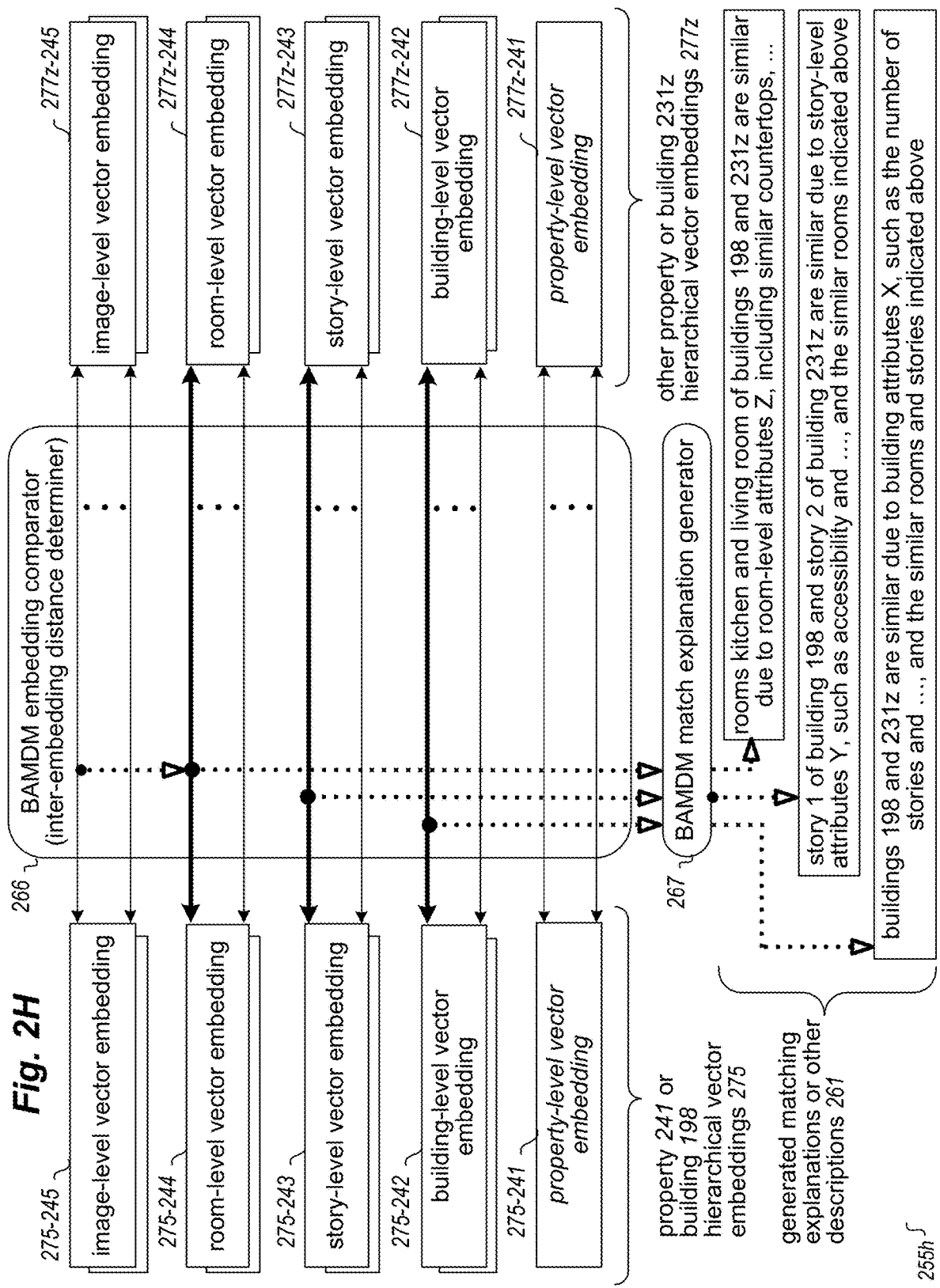

FIG. 2H continues the examples of FIGS. 2A-2G, and illustrates information 255h to demonstrate further automated operations of the BAMDM system to automatically generate explanations or other descriptions of the similarities of a matching property and/or building to an indicated property and/or building, with the hierarchical vector embeddings 275 for indicated property 241 or building 198 being compared in this example to corresponding levels of hierarchical vector embeddings 277z of a corresponding property or building 231z (not shown). In particular, buildings 198 and 231z are compared in this example, with further optional property-level vector embeddings 275-241 and 277z-241 begin shown for reference purposes. In this example, degrees of matching are further determined between not only building-level vector embedding(s) 275-242 and 277z-242, but also between story-level vector embedding(s) 275-243 and 277z-243, between room-level vector embedding(s) 275-244 and 277z-244, and between image-level vector embedding(s) 275-241 and 277z-241, with highest degrees of matching being determined between not only buildings 198 and 231z, but also between particular stories (or other groupings of rooms and/or areas) of those buildings (e.g., story 1 of building 198 and story 2 of building 231z) and between particular rooms or other areas of those stories (e.g., the kitchens and living rooms of buildings 198 and 231z) and between particular images or other captured data of those rooms or other areas. In particular, a BAMDM match explanation generator component 267 is illustrated that takes as input the information about the vector embeddings with the highest degrees of matching, and generates corresponding explanations or other descriptions 261 of the matching determination based on the buildings or external areas and/or stories or other groupings of rooms or other areas and/or rooms or other areas that are represented by those vector embeddings, such as based at least in part on attributes and/or other information associated with those buildings or external areas and/or stories or other groupings of rooms or other areas and/or rooms or other areas (and in other embodiments, properties and/or images)—in this example, the images or other captured data represented by matching image-level vector embeddings are used to determine matching features of the rooms or other areas in which that data is captured, such as features identified from analysis of the visual data of those images, and to include such matching feature attributes in the generated descriptions or other explanations. In other embodiments and situations, the generated explanations or other descriptions may identify the matching properties and/or buildings/external areas and/or stories/groupings of rooms/areas and/or rooms/other areas and/or images/other captured data, without further identification of particular attributes.

Figure 2I:
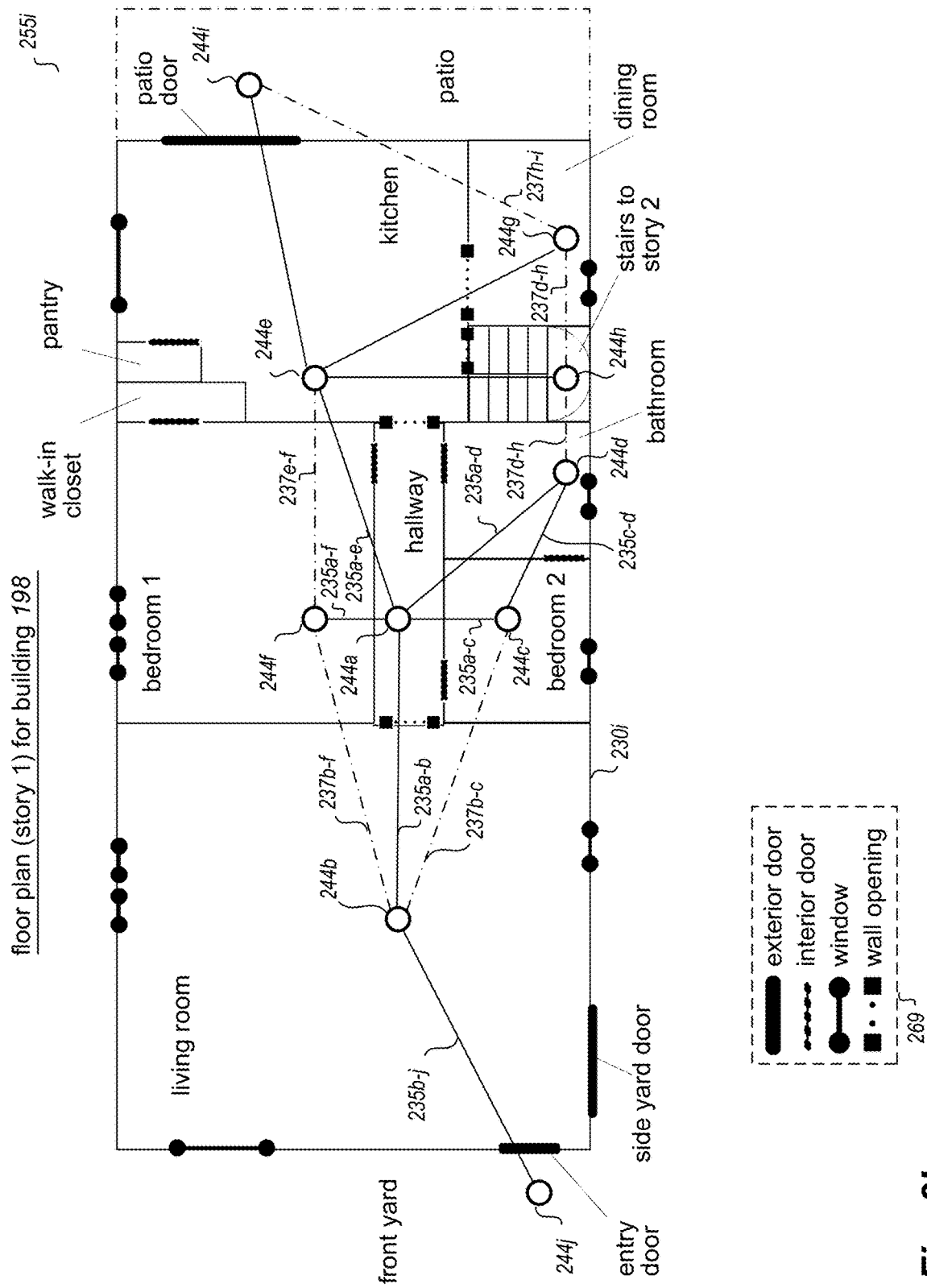

FIG. 2I continues the examples of FIGS. 2A-2H, and illustrates information 255i that includes a floor plan 230i similar to floor plan 230e of FIG. 2E. The floor plan 230i lacks some details of floor plan 230e (e.g., the optional nodes 244k and 244l of the adjacency graph), but with the floor plan 230i being overlaid with adjacency graph information that is fully connected and includes edges 237 that represent inter-room non-connected adjacencies, as well as the previous edges 235 that represent inter-room connection-based adjacencies. For example, bedroom 1 with node 244f previously had only a single edge 235a-f in floor plan 230e to represent the doorway between bedroom 1 and the hallway, but node 244f in floor plan 230i includes two additional adjacency type edges 237b-f and 237e-f to represent the non-connected adjacency of bedroom 1 to the living room and the kitchen, respectively. While connectivity adjacency edges 235 and non-connected adjacency edges 237 are illustrated separately in the adjacency graph shown in floor plan 230h, in other embodiments an initial version of such an adjacency graph may instead have only a single type of edge, such as if the types of inter-room connectivity/adjacencies are not initially known.

Figure 2J:
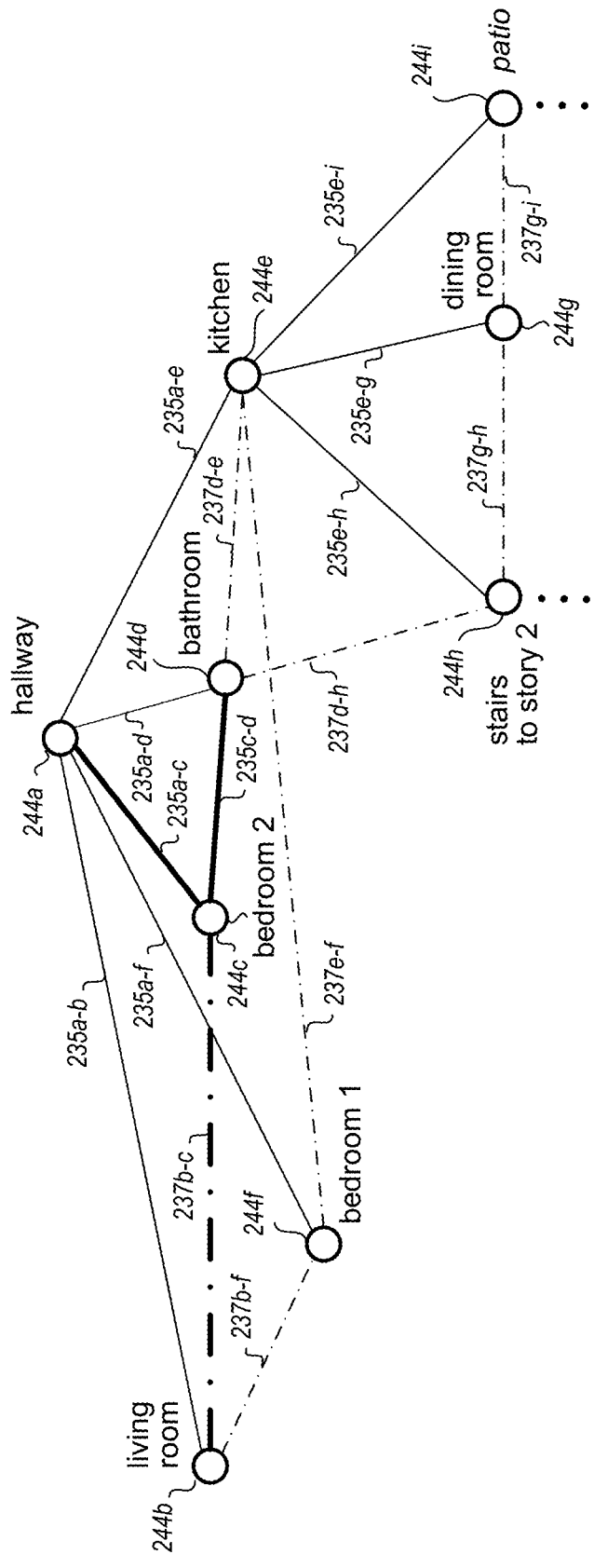

FIG. 2J continues the examples of FIGS. 2A-2I, and illustrates a fully connected adjacency graph 240j corresponding to the floor plan 230i of FIG. 2I. Three edges for bedroom 2 are illustrated in FIG. 2J for the sake of illustration (edge 234a-c to the hallway, edge 235c-d to the bathroom, and edge 237b-c to the living room)—in addition, while the edges are separated into connection edges 235 and non-connection adjacency edges 237 in this example, such edge type information may not be known and/or used for the adjacency graph in at least some embodiments (e.g., may be added after inter-room connection/adjacency type predictions are completed). While any of the node attribute information 247 for any of the nodes 244 and/or edge attribute information 249 for any of the edges 235 and 237 may be used for such inter-room connection/adjacency type predictions, factors that may assist in identifying the edge type for the edge 235a-c between bedroom 2 and the hallway as being of an inter-room connection type (and optionally of a 'door' sub-type within the inter-room connection type) may include, for example, the types of the rooms that the edge connects (e.g., hallway and bedroom), shape, size and/or other visual features of the inter-room connection that are visible from one or both rooms (e.g., from automated analysis of images taken in one or both rooms), an ability to see at least a portion of the adjacent room from an image taken in the other room, etc. Similarly, factors that may assist in identifying the edge type for the edge 235c-d between bedroom 2 and the bathroom as being of an inter-room connection type (and optionally of a 'door' sub-type within the inter-room connection type) may include, for example, the types of the rooms that the edge connects (e.g., bedroom and bathroom), shape, size and/or other visual features of the inter-room connection that are visible from one or both rooms (e.g., from automated analysis of images taken in one or both rooms), an ability to see at least a portion of the adjacent room from an image taken in the other room, etc. In addition, factors that may assist in identifying the edge type for the edge 237b-c between bedroom 2 and the living room as being of an inter-room non-connected adjacency type (and optionally of a 'wall' sub-type within the inter-room non-connected adjacency type) may include, for example, the types of the rooms that the edge connects (e.g., bedroom and living room), shape, size and/or other visual features of the adjacent areas of the rooms that are visible from one or both rooms (e.g., to show solid walls without any openings, such as from automated analysis of images taken in one or both rooms), an inability to see at least a portion of the adjacent room from an image taken in the other room, etc. It will be appreciated that various other information may further be used in at least some embodiments, as discussed in greater detail elsewhere herein.

For example, while not illustrated in FIGS. 2I and 2J, an initial version of an adjacency graph and/or corresponding embedding vectors may be provided as input to a BAMDM component 282 with one or more trained machine learning models (e.g., one or more trained neural network models), which use information in the adjacency graph and/or embedding vectors to predict additional attributes for the building and its rooms—the one or more trained machine learning models may, for example, include at least one machine learning model trained to identify inter-room door connections (and optionally non-door opening connections), at least one machine learning model trained to identify inter-room non-connected adjacencies (e.g., one or more walls between two adjacent rooms), and at least one machine learning model trained to identify types of rooms. The machine learning model(s) then provide output indicating predicted room types of some or all rooms in the building, with that information stored and optionally used to generate an updated version of the adjacency graph, and/or to otherwise update the information about the building (e.g., to update the building's floor plan, vector embedding(s), etc.). In addition, the machine learning model(s) may provide output indicating predicted inter-room doorway connections (and optionally non-doorway opening connections) for at least some inter-room connections/adjacencies of the building, and output indicating predicted inter-room non-connected adjacencies (e.g., one or more walls between two adjacent rooms) for at least some inter-room connections/adjacencies of the building, with that output then aggregated, stored and optionally used to generate an updated version of the adjacency graph, and/or to otherwise update the information about the building (e.g., to update the building's floor plan, vector embedding(s), etc.). In at least some embodiments, the prediction of room type information and inter-room connection/adjacency information includes various automated operations. For example, an adjacency graph may first be constructed for a building's floor plan, in which each node represents a room, and edges represent the connectivity or other adjacency of two rooms. Examples of node features that may be captured and used for the predictions including some or all of the following non-exclusive list: the number of doors, windows, and openings of the room; the room type; the perimeter of the room; the maximum length and width of room; the area of the room; the ratio between the room area and the room's bounding box area; chain code shape descriptors; shape descriptors to represent the centroid distance (e.g., the distance from the shape center to bound point); an order in which one or more images (e.g., panorama images) were captured in the room, relative to that of other rooms; features of the room extracted from analysis of one or more images (e.g., panorama images) captured in the room; center coordinates of the room; etc. In at least some embodiments, both inter-room connection type edges and inter-room non-connection adjacency type edges are predicted at the same time, although in the other embodiments they may instead be predicted at different times, predicted together at the same time, or only have one of the two types predicted. As one example embodiment, an incomplete adjacency graph is first generated, including in some cases by hiding random number of edges. The processing of the edge types may in some embodiments split into two branches, such as to predict inter-room connectivity type edges (e.g., via doors) in a first branch, and to predict inter-room non-connected adjacency type edges (e.g., walls) in a second branch, with the two types of predicted information aggregated together. Additional details regarding one or more example embodiments of performing such predictions are included in in U.S. Non-Provisional patent application Ser. No. 17/472,527, filed Sep. 10, 2021 and entitled "Automated Identification And Use Of Building Floor Plan Information"; which is incorporated herein by reference in its entirety.

Various details have been provided with respect to FIGS. 2A-2J, but it will be appreciated that the provided details are non-exclusive examples included for illustrative purposes, and other embodiments may be performed in other manners without some or all such details.

As noted above, in some embodiments, the described techniques include using machine learning to learn the attributes and/or other characteristics of adjacency graphs to encode in corresponding vector embeddings that are generated, such as the attributes and/or other characteristics that best enable subsequent automated identification of building floor plans having attributes satisfying target criteria, and with the vector embeddings that are used in at least some embodiments to identify target building floor plans being encoded based on such learned attributes or other characteristics. In particular, in at least some such embodiments, graph representation learning is used to search for a mapping function that can map the nodes in a graph to d-dimensional vectors, such that in the learned space similar nodes in the graph have similar embeddings. Unlike traditional methods such as graph kernel methods (see, for example, "Graph Kernels" by S. V. N. Vishwanathan et al., Journal of Machine Learning Research, 11:1201-1242, 2010; and "A Survey On Graph Kernels", Nils M. Kriege et al., arXiv: 1903.11835, 2019), graph neural networks remove the process of hand-engineered features and directly learn the high-level embeddings from the raw features of nodes or the (sub)graph. Various techniques exist for extending and redefining convolutions in the graph domain, which can be categorized into the spectral approach and the spatial approach. The spectral approach employs the spectral representation of a graph, and are specific to a particular graph structure, such that the models trained on one graph are not applicable to a graph with a different structure (see, for example, "Spectral Networks And Locally Connected Networks On Graphs", Joan Bruna et al., International Conference on Learning Representations 2014, 2014; "Convolutional Neural Networks On Graphs With Fast Localized Spectral Filtering", Michael Defferrard et al., Proceedings of Neural Information Processing Systems 2016, 2016, pp. 3844-3852; and "Semi-Supervised Classification With Graph Convolutional Networks", Thomas N. Kipf et al., International Conference on Learning Representations 2017, 2017). The convolution operation for the spectral approach is defined in the Fourier domain by computing the eigen-decomposition of the graph Laplacian, and the filter may be approximated to reduce the expensive eigen-decomposition by Chebyshev expansion of graph Lapacian, generating local filters, with the filters optionally limited to work on neighbors one step away from the current node. With respect to the spatial approach, it includes learning embeddings for a node by recursively aggregating information from its local neighbors. Various amounts of neighboring nodes and corresponding aggregation functions can be handled in various ways. For example, a fixed number of neighbors for each node may be sample, and different aggregation functions such as mean, max and long short term memory networks (LSTM) may be used (see, for example, "Inductive Representation Learning On Large Graphs", Will Hamilton et al., Proceedings of Neural Information Processing Systems 2017, 2017, pp. 1024-1034). Alternatively, each neighboring node may be considered to contribute differently to a central node, with the contribution factors being learnable via self-attention models (see, for example, "Graph Attention Networks", P. Velickovic et al., International Conference on Learning Representations 2018, 2018). Furthermore, each attention head captures feature correlation in a different representation subspace, and may be treated differently, such as by using a convolutional sub-network to weight the importance of each attention head (see, for example, "GaAN: Gated Attention Networks For Learning On Large And Spatiotemporal Graphs", Jiani Zhang et al., Proceedings of Uncertainty in Artificial Intelligence 2018, 2018).

In addition, in some embodiments, the creation of an adjacency graph and/or associated vector embedding for a building may be further based in part on partial information that is provided for the building (e.g., by an operator user of the BAMDM system, by one or more end users, etc.). Such partial information may include, for example, one or more of the following: some or all room names for rooms of the building being provided, with the connections between the rooms to be automatically determined or otherwise established; some or all inter-room connections between rooms of the building being provided, with likely room names for the rooms to be automatically determined or otherwise established; some room names and inter-room connections being provided, with the other inter-room connections and/or likely room names to be automatically determined or otherwise established. In such embodiments, the automated techniques may include using the partial information as part of completing or otherwise generating a floor plan for the building, with the floor plan subsequently used for creating a corresponding adjacency graph and/or vector embedding.

Figure 3:
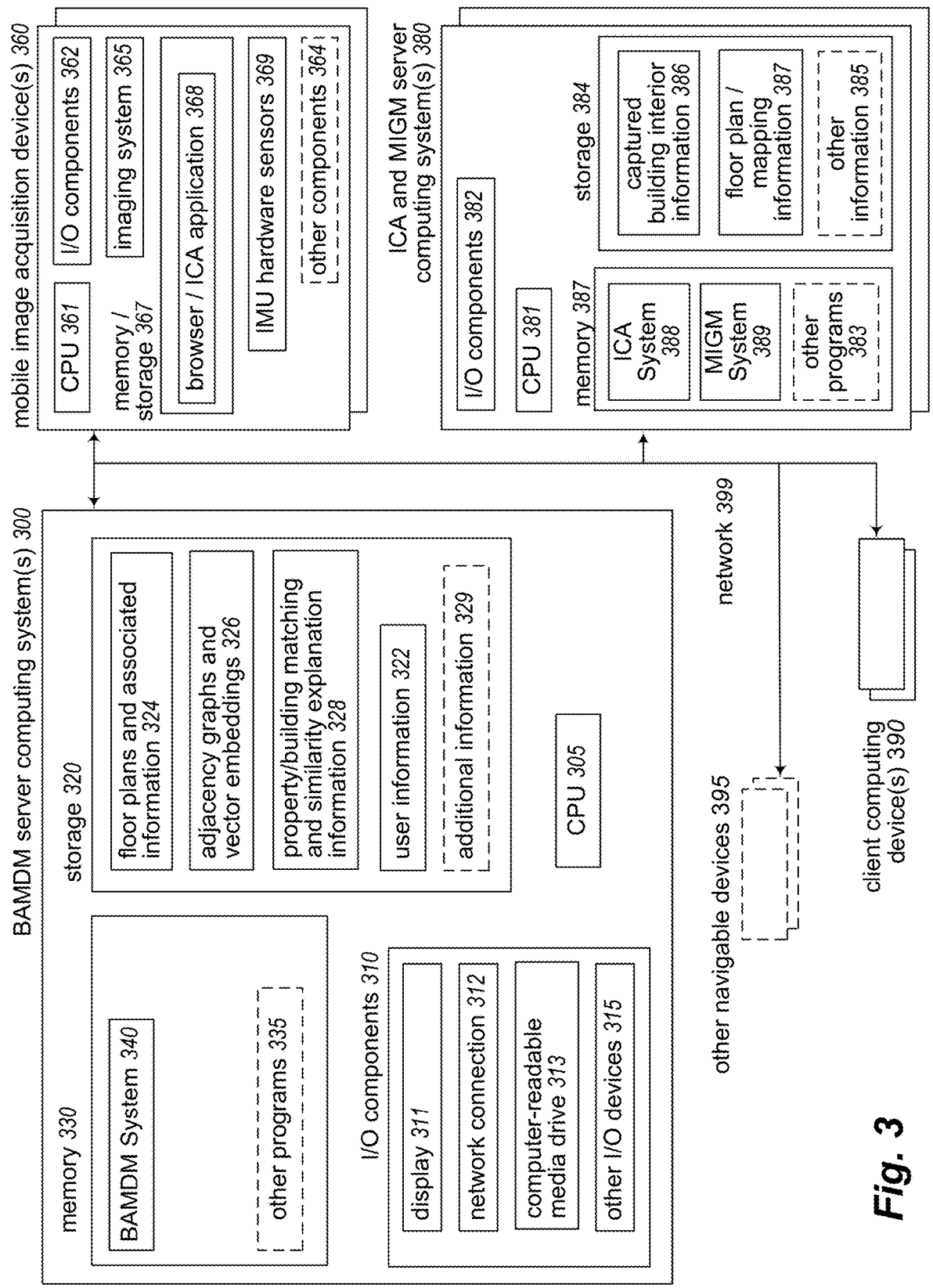
FIG. 3 is a block diagram illustrating computing systems suitable for executing an embodiment of a system that performs at least some of the techniques described in the present disclosure.

FIG. 3 is a block diagram illustrating an embodiment of one or more server computing systems 300 executing an implementation of a BAMDM system 340, and one or more server computing systems 380 executing an implementation of an ICA system 388 and an MIGM system 389—the server computing system(s) and BAMDM and/or ICA and/or MIGM systems may be implemented using a plurality of hardware components that form electronic circuits suitable for and configured to, when in combined operation, perform at least some of the techniques described herein. One or more computing systems and devices may also optionally be executing a Building Information Access system (such as server computing system(s) 300) and/or optional other programs 335 and 383 (such as server computing system(s) 300 and 380, respectively, in this example). In the illustrated embodiment, each server computing system 300 includes one or more hardware central processing units ("CPUs") or other hardware processors 305, various input/output ("I/O")

components 310, storage 320, and memory 330, with the illustrated I/O components including a display 311, a network connection 312, a computer-readable media drive 313, and other I/O devices 315 (e.g., keyboards, mice or other pointing devices, microphones, speakers, GPS receivers, etc.). Each server computing system 380 may have similar components, although only one or more hardware processors 381, memory 387, storage 384 and I/O components 382 are illustrated in this example for the sake of brevity.

The server computing system(s) 300 and executing BAMDM system 340, server computing system(s) 380 and executing ICA and MIGM systems 388-389, and optionally executing Building Information Access system (not shown), may communicate with each other and with other computing systems and devices in this illustrated embodiment, such as via one or more networks 399 (e.g., the Internet, one or more cellular telephone networks, etc.), including to interact with user client computing devices 390 (e.g., used to view floor plans, and optionally associated images and/or other related information, such as by interacting with or executing a copy of the Building Information Access system), and/or mobile image acquisition devices 360 (e.g., used to acquire images and/or other information for buildings or other environments to be modeled), and/or optionally other navigable devices 395 that receive and use floor plans and optionally other generated information for navigation purposes (e.g., for use by semi-autonomous or fully autonomous vehicles or other devices). In other embodiments, some of the described functionality may be combined in less computing systems, such as to combine the BAMDM system 340 and a Building Information Access system in a single system or device, to combine the BAMDM system 340 and the image acquisition functionality of device(s) 360 in a single system or device, to combine the ICA and MIGM systems 388-389 and the image acquisition functionality of device(s) 360 in a single system or device, to combine the BAMDM system 340 and the ICA and MIGM systems 388-389 in a single system or device, to combine the BAMDM system 340 and the ICA and MIGM systems 388-389 and the image acquisition functionality of device(s) 360 in a single system or device, etc.

In the illustrated embodiment, an embodiment of the BAMDM system 340 executes in memory 330 of the server computing system(s) 300 in order to perform at least some of the described techniques, such as by using the processor(s) 305 to execute software instructions of the system 340 in a manner that configures the processor(s) 305 and computing system 300 to perform automated operations that implement those described techniques. The illustrated embodiment of the BAMDM system may include one or more components, not shown, to each perform portions of the functionality of the BAMDM system, such as in a manner discussed elsewhere herein, and the memory may further optionally execute one or more other programs 335—as one specific example, a copy of the ICA and/or MIGM systems may execute as one of the other programs 335 in at least some embodiments, such as instead of or in addition to the ICA and/or MIGM systems 388-389 on the server computing system(s) 380, and/or a copy of a Building Information Access system may execute as one of the other programs 335. The BAMDM system 340 may further, during its operation, store and/or retrieve various types of data on storage 320 (e.g., in one or more databases or other data structures), such as various types of user information 322, floor plans and other associated information 324 (e.g., generated and saved 2.5D and/or 3D models, building and room dimensions for use with associated floor plans, additional images and/or annotation information, etc.), generated floor plan adjacency graph data structures and/or associated vector embedding data structures 326, generated explanation or other description information 328 about matching buildings and/or properties with respect to indicated buildings and/or properties, and/or various types of optional additional information 329 (e.g., various analytical information related to presentation or other use of one or more building interiors or other environments).

In addition, embodiments of the ICA and MIGM systems 388-389 execute in memory 387 of the server computing system(s) 380 in the illustrated embodiment in order to perform techniques related to generating panorama images and floor plans for buildings, such as by using the processor(s) 381 to execute software instructions of the systems 388 and/or 389 in a manner that configures the processor(s) 381 and computing system(s) 380 to perform automated operations that implement those techniques. The illustrated embodiment of the ICA and MIGM systems may include one or more components, not shown, to each perform portions of the functionality of the ICA and MIGM systems, respectively, and the memory may further optionally execute one or more other programs 383. The ICA and/or MIGM systems 388-389 may further, during operation, store and/or retrieve various types of data on storage 384 (e.g., in one or more databases or other data structures), such as video and/or image information 386 acquired for one or more buildings (e.g., 360° video or images for analysis to generate floor plans, to provide to users of client computing devices 390 for display, etc.), floor plans and/or other generated mapping information 387, and optionally other information 385 (e.g., additional images and/or annotation information for use with associated floor plans, building and room dimensions for use with associated floor plans, various analytical information related to presentation or other use of one or more building interiors or other environments, etc.)—while not illustrated in FIG. 3, the ICA and/or MIGM systems may further store and use additional types of information, such as about other types of building information to be analyzed and/or provided to the BAMDM system, about ICA and/or MIGM system operator users and/or end-users, etc.

Some or all of the user client computing devices 390 (e.g., mobile devices), mobile image acquisition devices 360, optional other navigable devices 395 and other computing systems (not shown) may similarly include some or all of the same types of components illustrated for server computing system 300. As one non-limiting example, the mobile image acquisition devices 360 are each shown to include one or more hardware CPU(s) 361, I/O components 362, memory and/or storage 367, one or more imaging systems 365, IMU hardware sensors 369 (e.g., for use in acquisition of video and/or images, associated device movement data, etc.), and optionally other components. In the illustrated example, one or both of a browser and one or more client applications 368 (e.g., an application specific to the BAMDM system and/or to ICA system and/or to the MIGM system) are executing in memory 367, such as to participate in communication with the BAMDM system 340, ICA system 388, MIGM system 389 and/or other computing systems. While particular components are not illustrated for the other navigable devices 395 or other computing devices/systems 390, it will be appreciated that they may include similar and/or additional components.

It will also be appreciated that computing systems 300 and 380 and the other systems and devices included within FIG. 3 are merely illustrative and are not intended to limit the scope of the present invention. The systems and/or devices may instead each include multiple interacting computing systems or devices, and may be connected to other devices that are not specifically illustrated, including via Bluetooth communication or other direct communication, through one or more networks such as the Internet, via the Web, or via one or more private networks (e.g., mobile communication networks, etc.). More generally, a device or other computing system may comprise any combination of hardware that may interact and perform the described types of functionality, optionally when programmed or otherwise configured with particular software instructions and/or data structures, including without limitation desktop or other computers (e.g., tablets, slates, etc.), database servers, network storage devices and other network devices, smart phones and other cell phones, consumer electronics, wearable devices, digital music player devices, handheld gaming devices, PDAs, wireless phones, Internet appliances, and various other consumer products that include appropriate communication capabilities. In addition, the functionality provided by the illustrated BAMDM system 340 may in some embodiments be distributed in various components, some of the described functionality of the BAMDM system 340 may not be provided, and/or other additional functionality may be provided.

It will also be appreciated that, while various items are illustrated as being stored in memory or on storage while being used, these items or portions of them may be transferred between memory and other storage devices for purposes of memory management and data integrity. Alternatively, in other embodiments some or all of the software components and/or systems may execute in memory on another device and communicate with the illustrated computing systems via inter-computer communication. Thus, in some embodiments, some or all of the described techniques may be performed by hardware means that include one or more processors and/or memory and/or storage when configured by one or more software programs (e.g., by the BAMDM system 340 executing on server computing systems 300, by a Building Information Access system executing on server computing systems 300 or other computing systems/devices, etc.) and/or data structures, such as by execution of software instructions of the one or more software programs and/or by storage of such software instructions and/or data structures, and such as to perform algorithms as described in the flow charts and other disclosure herein. Furthermore, in some embodiments, some or all of the systems and/or components may be implemented or provided in other manners, such as by consisting of one or more means that are implemented partially or fully in firmware and/or hardware (e.g., rather than as a means implemented in whole or in part by software instructions that configure a particular CPU or other processor), including, but not limited to, one or more application-specific integrated circuits (ASICs), standard integrated circuits, controllers (e.g., by executing appropriate instructions, and including microcontrollers and/or embedded controllers), field-programmable gate arrays (FPGAs), complex programmable logic devices (CPLDs), etc. Some or all of the components, systems and data structures may also be stored (e.g., as software instructions or structured data) on a non-transitory computer-readable storage mediums, such as a hard disk or flash drive or other non-volatile storage device, volatile or non-volatile memory (e.g., RAM or flash RAM), a network storage device, or a portable media article (e.g., a DVD disk, a CD disk, an optical disk, a flash memory device, etc.) to be read by an appropriate drive or via an appropriate connection. The systems, components and data structures may also in some embodiments be transmitted via generated data signals (e.g., as part of a carrier wave or other analog or digital propagated signal) on a variety of computer-readable transmission mediums, including wireless-based and wired/cable-based mediums, and may take a variety of forms (e.g., as part of a single or multiplexed analog signal, or as multiple discrete digital packets or frames). Such computer program products may also take other forms in other embodiments. Accordingly, embodiments of the present disclosure may be practiced with other computer system configurations.

Figure 4A:
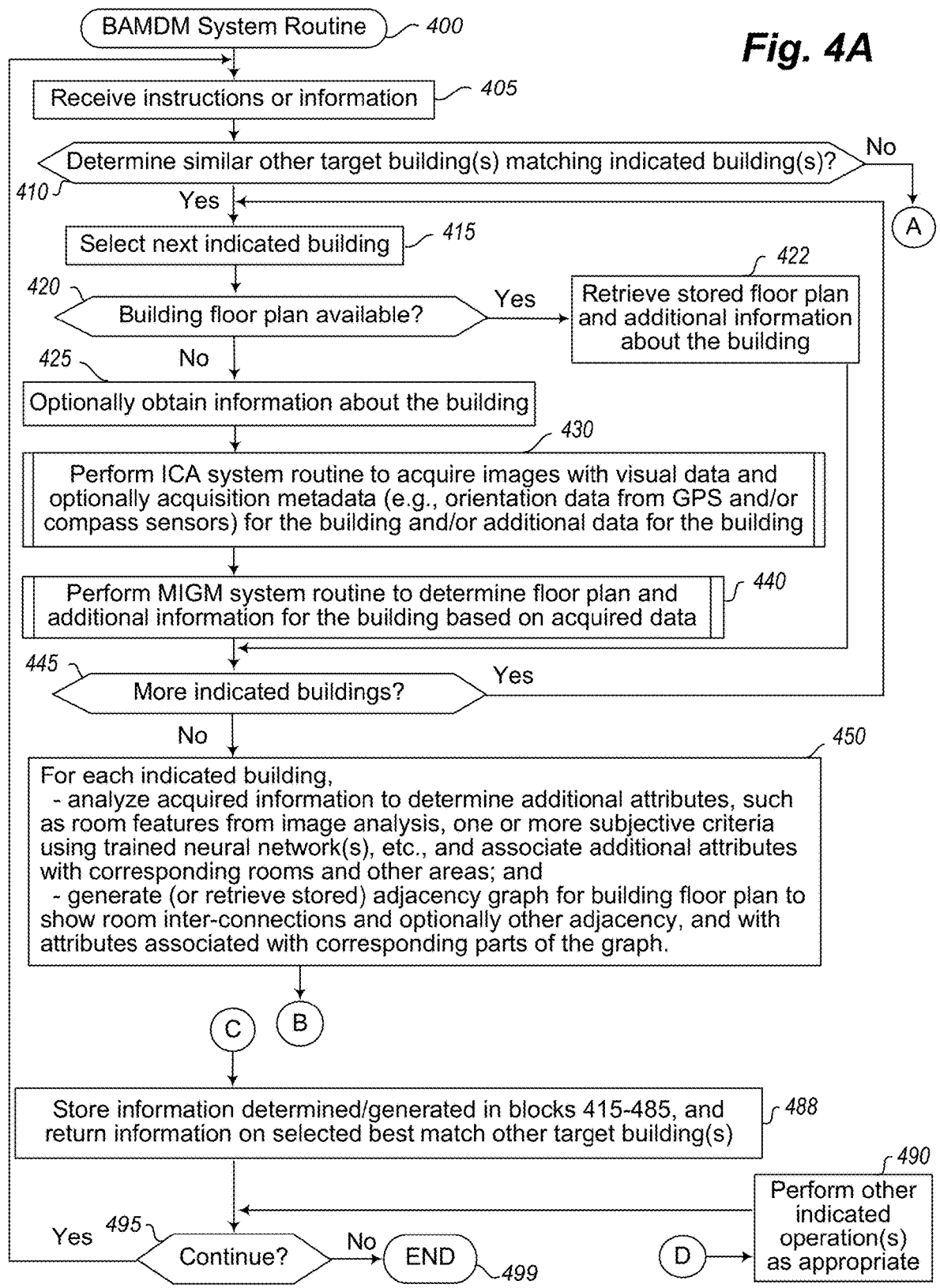
FIGS. 4A-4B illustrate an example embodiment of a flow diagram for a Building Attribute Match Determination Manager (BAMDM) system routine in accordance with an embodiment of the present disclosure.
Figure 4B:
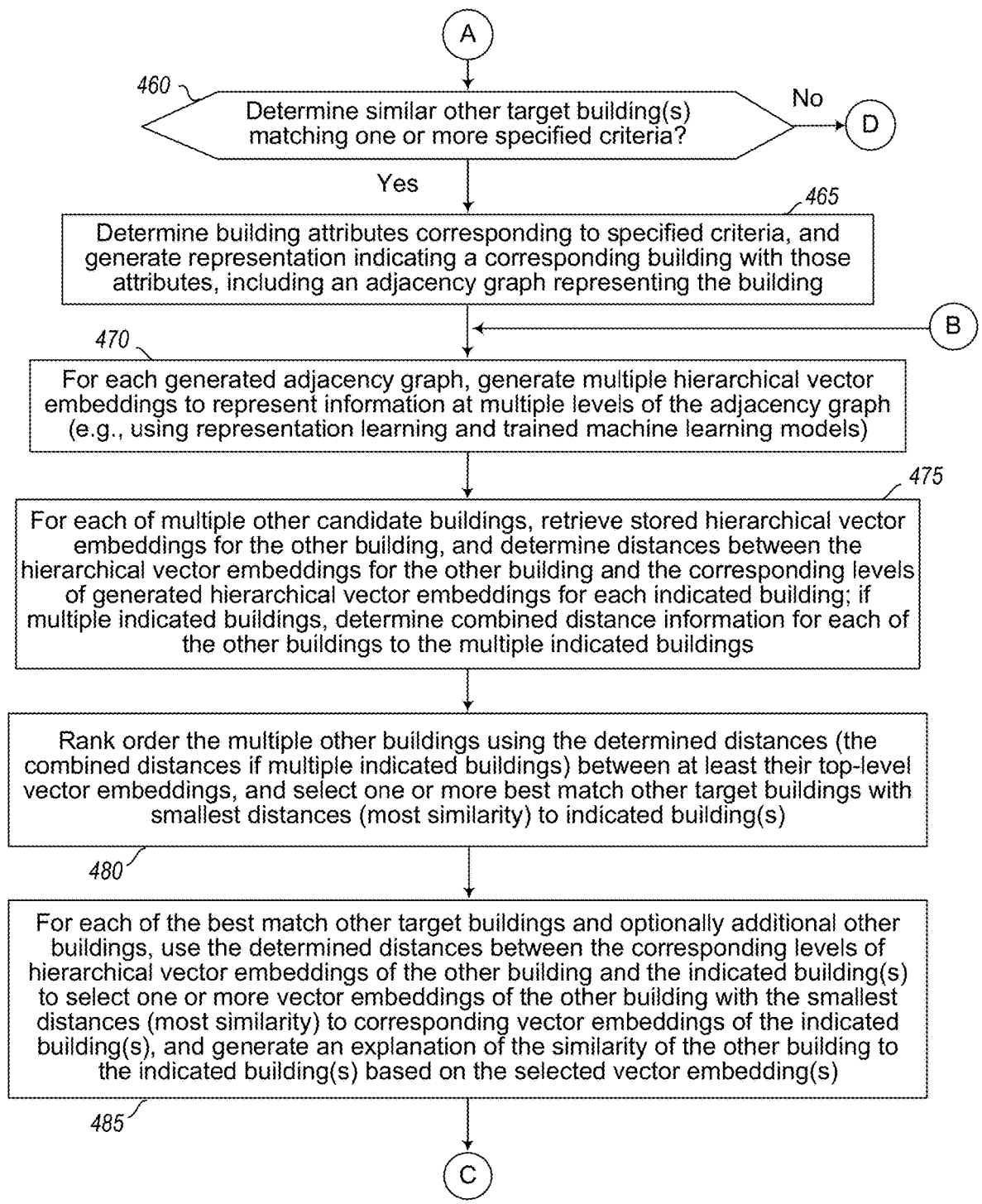

FIGS. 4A-4B illustrate an example embodiment of a flow diagram for a Building Attribute Match Determination Manager (BAMDM) System routine 400. The routine may be performed by, for example, execution of the BAMDM system 140 of FIG. 1, the BAMDM system 340 of FIG. 3, and/or an BAMDM system as described with respect to FIGS. 2D-2J and elsewhere herein, such as to perform automated operations related to identifying buildings that match each other or other indicated criteria and to generating explanations or other descriptions of the matching, and to provide information about the identified buildings (e.g., floor plans of the identified buildings) for subsequent use in one or more automated manners. In the example embodiment of FIGS. 4A-4B, the floor plans are for houses or other buildings, and the analysis of floor plan information includes generating and using corresponding adjacency graphs and vector embeddings, but in other embodiments, other types of data structures and analyses may be used for other types of structures or for non-structure locations, and the identified buildings and/or their floor plans may be used in other manners than those discussed with respect to routine 400, as discussed elsewhere herein. In addition, while the example embodiment of the routine may use adjacency graphs and/or vector embeddings and/or other specified criteria (e.g., search terms) to identify buildings that match or otherwise are similar to that information, other embodiments of the routine may use only one such type of information and/or may use other additional types of information and analyses (e.g., to identify matching properties).

The illustrated embodiment of the routine begins at block 405, where information or instructions are received. The routine continues to block 410 to determine whether the instructions or other information received in block 405 indicate to use one or more indicated buildings to determine one or more other matching target buildings, and if so the routine continues to perform at least blocks 415-450 to do so, and otherwise continues to block 460.

In block 415, the routine selects the next indicated building (e.g., buildings indicated in the information received in block 405), beginning with the first. In block 420, the routine then determines whether a floor plan and optionally associated information (e.g., images acquired in the building) are available, and if so proceeds to block 422 to retrieve such a stored floor plan and optionally associated information for the building. If it is determined in block 420 that the floor plan is not available, the routine instead proceeds to perform blocks 425-440 to generate such a floor plan and associated information, including to optionally obtain available information about the building in block 425 (e.g., building dimensions and/or other information about the size and/or structure of the building; external images of the building, such as from overhead and/or from a nearby street; etc., such as from public sources), to initiate execution of an ICA system routine in block 430 to acquire images and optionally additional data for the building (with one example of such a routine being illustrated in FIG. 5), and to initiate execution of a MIGM system routine in block 440 to use the acquired images from block 430 to generate a floor plan and optionally additional mapping-related data for the building (with one example of such a routine being illustrated in FIGS. 6A-6B), and with the output of block 440 being the floor plan and acquired images and optionally additional mapping-related data. In block 445, the routine then determines if there are more indicated buildings, and if so returns to block 415 to select the next such indicated building, and otherwise continues to block 450.

In blocks 450-485, for each of the one or more indicated buildings (e.g., as identified in the instructions or information received in block 405), the routine performs several activities as part of determining the similarity of those indicated building(s) to various other buildings (e.g., from a database or other group of stored floor plans and associated information for various buildings, which optionally include other initial buildings previously supplied to the routine 400). In the illustrated example, the activities performed by the routine in block 450 for each indicated building include analyzing acquired information to determine additional attributes about the indicated building(s) if not already performed in blocks 430 and/or 440, such as to analyze images to identify features of rooms and other areas of the indicated building(s), and further include generating information (or otherwise obtaining information, such as by retrieving stored information) to represent the building, such as to represent some or all information from a floor plan for the building in an adjacency graph that includes information about room adjacency and/or inter-connectedness and about various other room and building attributes, etc. In particular, if the representative information for the building is not already generated and available for retrieval, the techniques may include obtaining a floor plan for the building that includes information about locations of doorways and other inter-room wall openings, windows, etc., room labels and/or types, and any other available building information that is associated with the floor plan (e.g., images and/or other information acquired in one or more rooms of the building). The activities performed by the routine in block 450 for each indicated building may further include associating the other available building information (if any) with corresponding room(s) and inter-room openings of the floor plan for the building, if not already done, and optionally analyzing the acquired other building information to determine additional attributes for a corresponding room or inter-room opening (or for the building as a whole), with those additional determined attributes then also associated with the building floor plan (e.g., with corresponding rooms or inter-room openings, or with the building as a whole). The activities performed by the routine in block 450 for each indicated building may further include generating an adjacency graph for the building floor plan that includes nodes for at least the rooms (and optionally for other areas, such as adjacent spaces external to the building, including areas outside of doors or other openings from the building to the exterior), and with edges between those nodes representing inter-room connectivity (e.g., based on doors or other inter-room openings between rooms) and/or other inter-room adjacency, and with attributes from the floor plan and its associated additional information being stored with or otherwise associated with the corresponding nodes and edges for the rooms and inter-room connections/adjacencies in the adjacency graph. The adjacency graph for an indicated building may further be structured in a hierarchical form with multiple levels in addition to a room level with the room nodes, such as to have further nodes in an image level that each corresponds to an image or other group of acquired data (and with each image-level node associated with a parent node at the room level for a room or other area in which that image or other group of data is acquired), to have further nodes in a story level that each corresponds to a building story or other group of related rooms and/or other areas (and with each story-level node associated with one or more children nodes at the room level for one or more rooms or other areas that are part of that story or other group, and with each story-level node further associated with a parent node at the building level for a building or other external area that includes that story), to have further nodes in a building level that each corresponds to a building or other external area of a property (and with each building-level node associated with one or more children nodes at the story level for one or more stories or other room/area groupings that are part of that building or external area, and with each building-level node further associated with a parent node at the property level for a property that includes that building or other external area), and to have a further node in a property level that corresponds to a property (and has one or more children nodes at the building level for one or more buildings or external areas that are part of that property). The activities performed by the routine in block 450 for each indicated building may further include optionally providing the adjacency graph for the building to one or more trained classification neural network(s) that each classify the building floor plan according to one or more subjective factors (e.g., accessibility friendly, an open floor plan, an atypical floor plan, etc.), and similarly storing any resulting classification attributes with the floor plan and its adjacency graph. While not illustrated in routine 400, the routine may in some embodiments further generate predictions of one or more types of additional representative information for the indicated buildings, such as to add new information to the indicated buildings' floor plans and/or adjacency graphs, and/or to correct or otherwise supplement existing information in the indicated buildings' floor plans and/or adjacency graphs, such as by providing an indicated building's adjacency graph and/or a subset of information from it to one or more trained machine learning models (e.g., one or more trained neural networks) to obtain predictions about one or more types of information for the indicated building. The predicted information may, for example, include a type of room for some or all rooms in the building and types of inter-room connections between some or all rooms (e.g., connected by a door or other opening, adjacent with an intervening wall but not otherwise connected, not adjacent, etc.), although in other embodiments only one of the two types of information may be predicted, and/or other types of building attribute information may be predicted. After block 450, the routine continues to block 470.

If it is instead determined in block 410 that the instructions or other information received in block 405 are not to determine one or more other target buildings similar to one or more indicated buildings, the routine continues instead to block 460 to determine whether the instructions or other information received in block 405 are to determine one or more other target buildings based on one or more specified criteria, and if not continues to block 490. Otherwise, the routine continues to block 465 to determine building attributes corresponding to the specified criteria, and to generate of a representation of an indicated building that has such building attributes and otherwise corresponds to the specified criteria, and to further generate an adjacency graph for that indicated building in a manner similar to that discussed in block 450.

After blocks 450 or 465, the routine continues to block 470 to, for each indicated initial building, use representation learning to generate hierarchical vector embeddings for the indicated building that concisely represent the information included in the adjacency graph for that indicated building, as discussed in greater detail elsewhere herein. After block 470, the routine continues to block 475 to, for each of multiple other buildings (e.g., all available/known other buildings, a subset of the available other buildings that satisfy one or more defined tests, a group of other buildings supplied or otherwise indicated in the information received in block 405, etc.), determine a value for a distance (or other measure of difference or similarity) between at least a stored building-level vector embedding for the other building (or to optionally dynamically generate and use a new such building-level vector embedding for that other building, if not previously generated and stored) and the building-level vector embedding for each indicated initial building that was generated in block 470—if there are multiple indicated initial buildings, the routine further generates a combined distance value (e.g., an average, a cumulative total, etc.) for each other building by combining the determined distance values between that other building and all of the multiple indicated initial buildings with respect to their building-level vector embeddings. As discussed elsewhere, one or more of various distance metrics may be used to determine the distance values. In the illustrated embodiment, the routine in block 475 further compares lower-level vector embeddings below building level for the indicated building(s) and other building(s) and determines corresponding distances between them in a similar manner, such as story-level and/or room-level and/or image-level vector embeddings, but in other embodiments may later perform such lower-level vector embedding comparisons for one or more best match target buildings after they are selected in block 480. After block 475, the routine continues to block 480, where it rank orders the multiple other buildings using the distance values determined in block 475 (using the combined distance values if there are multiple indicated buildings), and selects one or more best matches to use as the identified target buildings (e.g., all matches above a defined threshold, the single best match, etc., and optionally based on instructions or other information received in block 405), with those selected one or more best matches having the smallest determined distance values (i.e., the highest similarity to the one or more indicated buildings).

After block 480, the routine continues to block 485 where, for each of the one or more other target buildings, it uses the determined distances between the lower-level vector embeddings of the target building with respect to corresponding lower-level vector embeddings of the indicated building(s) to select best matches for each of some or all of the lower levels of vector embeddings (e.g., all matches above a defined threshold, the single best match for each lower level, etc., and optionally based on instructions or other information received in block 405), and then uses the selected vector embedding(s) for the target building to generate explanations or other descriptions of why that target building is selected as matching the indicated building(s), such as in a manner described in greater detail herein.

After block 480, the routine continues to block 488, where it stores some or all of the information determined and generated in blocks 415-485, and returns information about the one or more selected best match target buildings, such as information about their floor plans and/or their generated explanations or other descriptions of matching from block 485.

If it is instead determined in block 460 that the information or instructions received in block 405 are not to determine one or more other target buildings that match one or more specified criteria, the routine continues instead to block 490 to perform one or more other indicated operations as appropriate. Such other operations may include, for example, receiving and responding to requests for previously identified building floor plan information (e.g., requests for such information for display on one or more client devices, requests for such information to provide it to one or more other devices for use in automated navigation, etc.), training one or more neural networks or other machine learning models to recognize and predict types of floor plan information (e.g., room types, types of inter-room connections, etc.), training one or more neural networks or other machine learning models to recognize similarities between buildings based on similarities in the buildings' information (e.g., floor plans, adjacency graphs, encoding vectors, etc.), training one or more classification neural networks or other machine learning models to classify building floor plans according to one or more subjective factors (e.g., accessibility friendly, an open floor plan, an atypical floor plan, a non-standard floor plan, etc.), using machine learning techniques to learn the attributes and/or other characteristics of adjacency graphs to encode in corresponding vector embeddings that are generated (e.g., the best attributes and/or other characteristics to allow subsequent automated identification of building floor plans that have attributes satisfying target criteria), generating and storing representative information for buildings (e.g., floor plans, adjacency graphs, vector embeddings, etc.) for later use, obtaining and storing information about users of the routine (e.g., search and/or selection preferences of a current user), etc.

After blocks 488 or 490, the routine continues to block 495 to determine whether to continue, such as until an explicit indication to terminate is received, or instead only if an explicit indication to continue is received. If it is determined to continue, the routine returns to block 405 to wait for and receive additional instructions or information, and otherwise continues to block 499 and ends.

Figure 5:
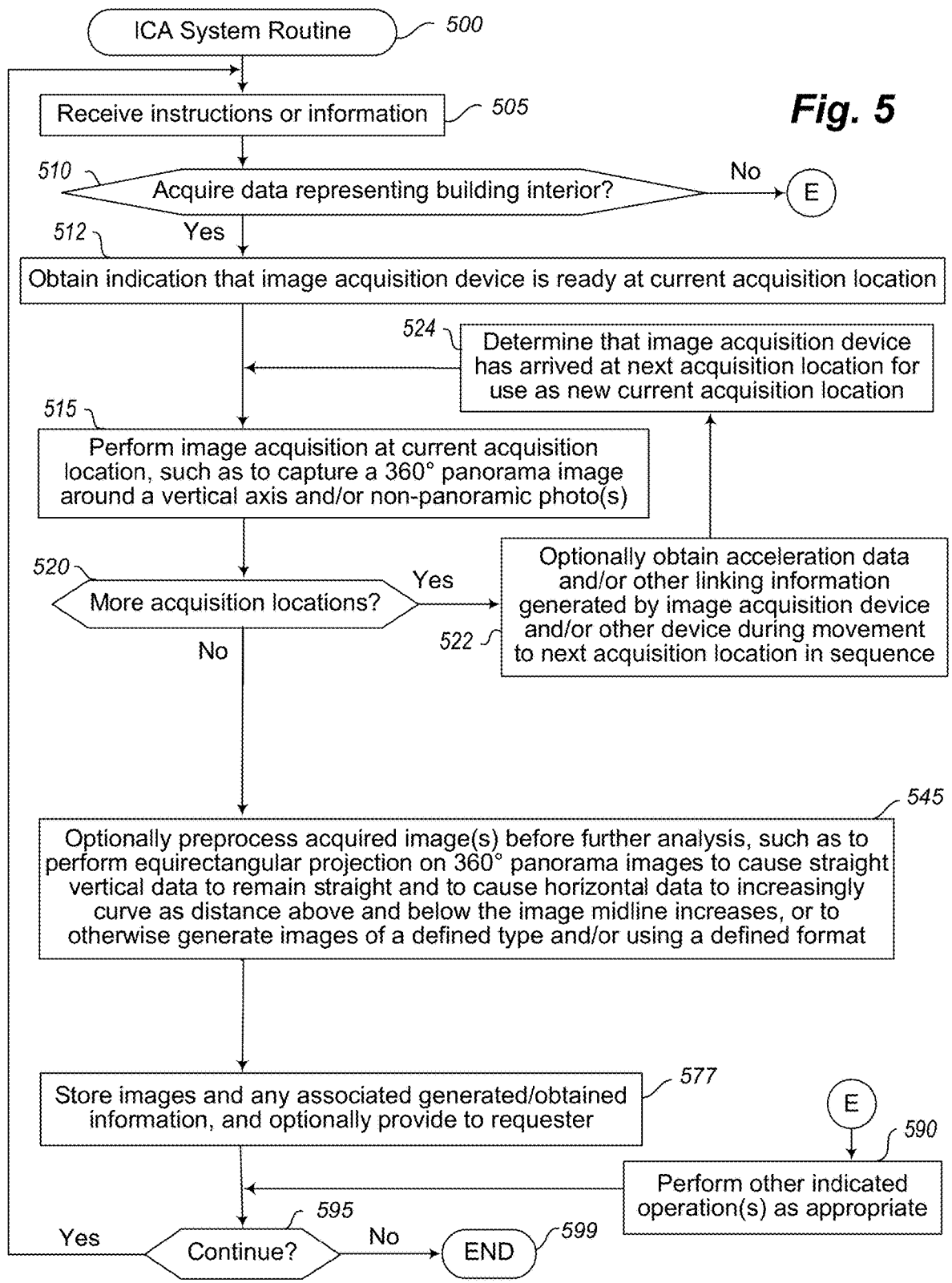
FIG. 5 illustrates an example embodiment of a flow diagram for an Image Capture and Analysis (ICA) system routine in accordance with an embodiment of the present disclosure.

FIG. 5 illustrates an example flow diagram of an embodiment of an ICA (Image Capture & Analysis) system routine 500. The routine may be performed by, for example, the ICA system 160 of FIG. 1, the ICA system 388 of FIG. 3, and/or an ICA system as described with respect to FIGS. 2A-2J and elsewhere herein, such as to acquire 360° panorama images and/or other images at acquisition locations within buildings or other structures, such as for use in subsequent generation of related floor plans and/or other mapping information. While portions of the example routine 500 are discussed with respect to acquiring particular types of images at particular acquisition locations, it will be appreciated that this or a similar routine may be used to acquire video (with video frame images) and/or other data (e.g., audio), whether instead of or in addition to such panorama images or other perspective images. In addition, while the illustrated embodiment acquires and uses information from the interior of a target building, it will be appreciated that other embodiments may perform similar techniques for other types of data, including for non-building structures and/or for information external to one or more target buildings of interest. Furthermore, some or all of the routine may be executed on a mobile device used by a user to acquire image information, and/or by a system remote from such a mobile device. In at least some embodiments, the routine 500 may be invoked from block 430 of routine 400 of FIG. 4, with corresponding information from routine 500 provided to routine 400 as part of implementation of that block 430, and with processing control returned to routine 400 after blocks 577 and/or 599 in such situations—in other embodiments, the routine 400 may proceed with additional operations in an asynchronous manner without waiting for such processing control to be returned (e.g., to proceed with other processing activities while waiting for the corresponding information from the routine 500 to be provided to routine 400).

The illustrated embodiment of the routine begins at block 505, where instructions or information are received. At block 510, the routine determines whether the received instructions or information indicate to acquire visual data and/or other data representing a building interior (optionally in accordance with supplied information about one or more additional acquisition locations and/or other guidance acquisition instructions), and if not continues to block 590. Otherwise, the routine proceeds to block 512 to receive an indication to begin the image acquisition process at a first acquisition location (e.g., from a user of a mobile image acquisition device that will perform the acquisition process). After block 512, the routine proceeds to block 515 in order to perform acquisition location image acquisition activities for acquiring a 360° panorama image for the acquisition location in the interior of the target building of interest, such as via one or more fisheye lenses and/or non-fisheye rectilinear lenses on the mobile device and to provide horizontal coverage of at least 360° around a vertical axis, although in other embodiments other types of images and/or other types of data may be acquired. As one non-exclusive example, the mobile image acquisition device may be a rotating (scanning) panorama camera equipped with a fisheye lens (e.g., with 180° degrees of horizontal coverage) and/or other lens (e.g., with less than 180° degrees of horizontal coverage, such as a regular lens or wide-angle lens or ultrawide lens). The routine may also optionally obtain annotation and/or other information from the user regarding the acquisition location and/or the surrounding environment, such as for later use in presentation of information regarding that acquisition location and/or surrounding environment.

After block 515 is completed, the routine continues to block 520 to determine if there are more acquisition locations at which to acquire images, such as based on corresponding information provided by the user of the mobile device and/or received in block 505—in some embodiments, the ICA routine will acquire only a single image and then proceed to block 577 to provide that image and corresponding information (e.g., to return the image and corresponding information to the BAMDM system and/or MIGM system for further use before receiving additional instructions or information to acquire one or more next images at one or more next acquisition locations). If there are more acquisition locations at which to acquire additional images at the current time, the routine continues to block 522 to optionally initiate the capture of linking information (e.g., acceleration data) during movement of the mobile device along a travel path away from the current acquisition location and towards a next acquisition location within the building interior. The captured linking information may include additional sensor data (e.g., from one or more IMU, or inertial measurement units, on the mobile device or otherwise carried by the user) and/or additional visual information (e.g., images, video, etc.) recorded during such movement. Initiating the capture of such linking information may be performed in response to an explicit indication from a user of the mobile device or based on one or more automated analyses of information recorded from the mobile device. In addition, the routine may further optionally monitor the motion of the mobile device in some embodiments during movement to the next acquisition location, and provide one or more guidance cues (e.g., to the user) regarding the motion of the mobile device, quality of the sensor data and/or visual information being captured, associated lighting/environmental conditions, advisability of capturing a next acquisition location, and any other suitable aspects of capturing the linking information. Similarly, the routine may optionally obtain annotation and/or other information from the user regarding the travel path, such as for later use in presentation of information regarding that travel path or a resulting inter-panorama image connection link. In block 524, the routine determines that the mobile device has arrived at the next acquisition location (e.g., based on an indication from the user, based on the forward movement of the mobile device stopping for at least a predefined amount of time, etc.), for use as the new current acquisition location, and returns to block 515 in order to perform the acquisition location image acquisition activities for the new current acquisition location.

Figure 6A:
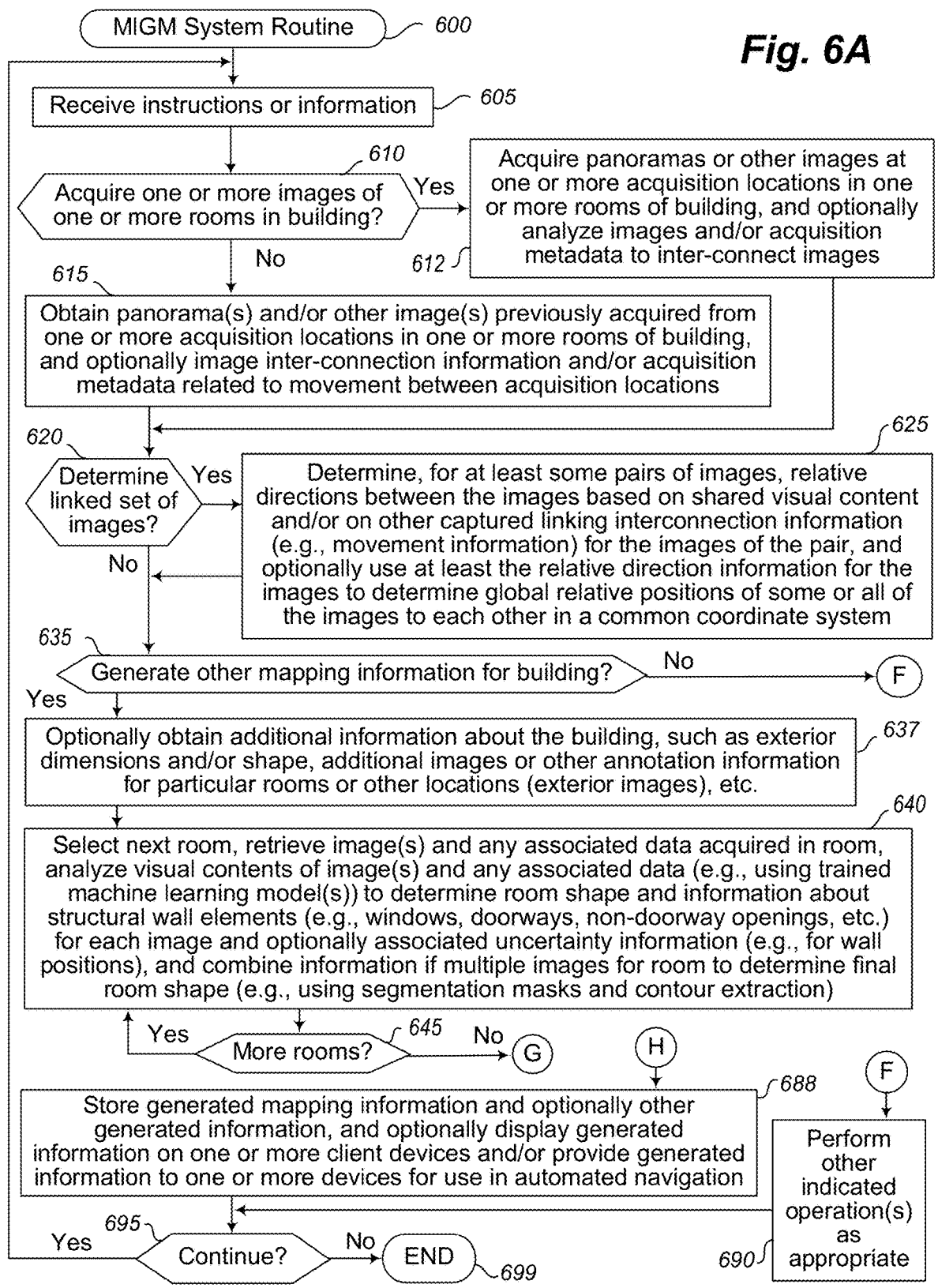
FIGS. 6A-6B illustrate an example embodiment of a flow diagram for a Mapping Information Generation Manager (MIGM) system routine in accordance with an embodiment of the present disclosure.
Figure 6B:
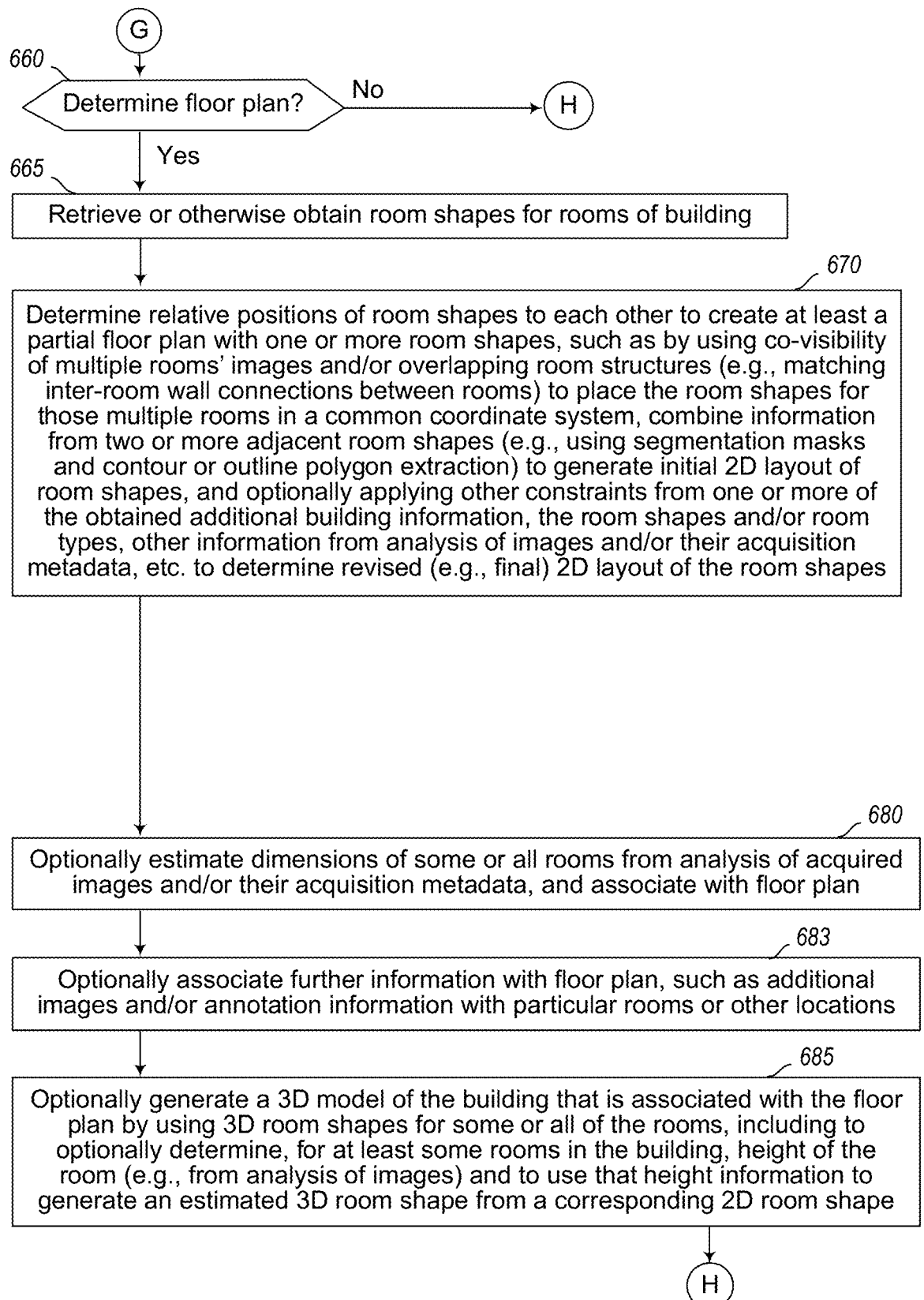

If it is instead determined in block 520 that there are not any more acquisition locations at which to acquire image information for the current building or other structure at the current time, the routine proceeds to block 545 to optionally preprocess the acquired 360° panorama images before their subsequent use (e.g., for generating related mapping information, for providing information about features of rooms or other enclosing areas, etc.), such as to produce images of a particular type and/or in a particular format (e.g., to perform an equirectangular projection for each such image, with straight vertical data such as the sides of a typical rectangular door frame or a typical border between 2 adjacent walls remaining straight, and with straight horizontal data such as the top of a typical rectangular door frame or a border between a wall and a floor remaining straight at a horizontal midline of the image but being increasingly curved in the equirectangular projection image in a convex manner relative to the horizontal midline as the distance increases in the image from the horizontal midline). In block 577, the images and any associated generated or obtained information is stored for later use, and optionally provided to one or more recipients (e.g., to block 430 of routine 400 if invoked from that block). FIGS. 6A-6B illustrate one example of a routine for generating a floor plan representation of a building interior from the generated panorama information.

If it is instead determined in block 510 that the instructions or other information received in block 505 are not to acquire images and other data representing a building interior, the routine continues instead to block 590 to perform any other indicated operations as appropriate, such as to configure parameters to be used in various operations of the system (e.g., based at least in part on information specified by a user of the system, such as a user of a mobile device who captures one or more building interiors, an operator user of the ICA system, etc.), to respond to requests for generated and stored information (e.g., to identify one or more groups of inter-connected linked panorama images each representing a building or part of a building that match one or more specified search criteria, one or more panorama images that match one or more specified search criteria, etc.), to generate and store inter-panorama image connections between panorama images for a building or other structure (e.g., for each panorama image, to determine directions within that panorama image toward one or more other acquisition locations of one or more other panorama images, such as to enable later display of an arrow or other visual representation with a panorama image for each such determined direction from the panorama image to enable an end-user to select one of the displayed visual representations to switch to a display of the other panorama image at the other acquisition location to which the selected visual representation corresponds), to obtain and store other information about users of the system, to perform any housekeeping tasks, etc.

Following blocks 577 or 590, the routine proceeds to block 595 to determine whether to continue, such as until an explicit indication to terminate is received, or instead only if an explicit indication to continue is received. If it is determined to continue, the routine returns to block 505 to await additional instructions or information, and if not proceeds to step 599 and ends.

FIGS. 6A-6B illustrate an example embodiment of a flow diagram for a MIGM (Mapping Information Generation Manager) system routine 600. The routine may be performed by, for example, execution of the MIGM system 160 of FIG. 1, the MIGM system 389 of FIG. 3, and/or a MIGM system as described with respect to FIGS. 2A-2J and elsewhere herein, such as to determine a room shape for a room (or other defined area) by analyzing information from one or more images acquired in the room (e.g., one or more 360° panorama images), to generate a partial or complete floor plan for a building or other defined area based at least in part on one or more images of the area and optionally additional data captured by a mobile computing device, and/or to generate other mapping information for a building or other defined area based at least in part on one or more images of the area and optionally additional data captured by a mobile computing device. In the example of FIGS. 6A-6B, the determined room shape for a room may be a 2D room shape to represent the locations of the walls of the room or a 3D fully closed combination of planar surfaces to represent the locations of walls and ceiling and floor of the room, and the generated mapping information for a building (e.g., a house) may include a 2D floor plan and/or 3D computer model floor plan, but in other embodiments, other types of room shapes and/or mapping information may be generated and used in other manners, including for other types of structures and defined areas, as discussed elsewhere herein. In at least some embodiments, the routine 600 may be invoked from block 440 of routine 400 of FIG. 4, with corresponding information from routine 600 provided to routine 400 as part of implementation of that block 440, and with processing control returned to routine 400 after blocks 688 and/or 699 in such situations—in other embodiments, the routine 400 may proceed with additional operations in an asynchronous manner without waiting for such processing control to be returned (e.g., to proceed to block 445 once the corresponding information from routine 600 is provided to routine 400, to proceed with other processing activities while waiting for the corresponding information from the routine 600 to be provided to routine 400, etc.).

The illustrated embodiment of the routine begins at block 605, where information or instructions are received. The routine continues to block 610 to determine whether image information is already available to be analyzed for one or more rooms (e.g., for some or all of an indicated building, such as based on one or more such images received in block 605 as previously generated by the ICA routine), or if such image information instead is to be currently acquired. If it is determined in block 610 to currently acquire some or all of the image information, the routine continues to block 612 to acquire such information, optionally waiting for one or more users or devices to move throughout one or more rooms of a building and acquire panoramas or other images at one or more acquisition locations in one or more of the rooms (e.g., at multiple acquisition locations in each room of the building), optionally along with metadata information regarding the acquisition and/or interconnection information related to movement between acquisition locations, as discussed in greater detail elsewhere herein—implementation of block 612 may, for example, include invoking an ICA system routine to perform such activities, with FIG. 5 providing one example embodiment of an ICA system routine for performing such image acquisition. If it is instead determined in block 610 not to currently acquire the images, the routine continues instead to block 615 to obtain one or more existing panoramas or other images from one or more acquisition locations in one or more rooms (e.g., multiple images acquired at multiple acquisition locations that include at least one image and acquisition location in each room of a building), optionally along with metadata information regarding the acquisition and/or interconnection information related to movement between the acquisition locations, such as may in some situations have been supplied in block 605 along with the corresponding instructions.

After blocks 612 or 615, the routine continues to block 620, where it determines whether to generate mapping information that includes a linked set of target panorama images (or other images) for a building or other group of rooms (referred to at times as a 'virtual tour', such as to enable an end user to move from any one of the images of the linked set to one or more other images to which that starting current image is linked, including in some embodiments via selection of a user-selectable control for each such other linked image that is displayed along with a current image, optionally by overlaying visual representations of such user-selectable controls and corresponding inter-image directions on the visual data of the current image, and to similarly move from that next image to one or more additional images to which that next image is linked, etc.), and if so continues to block 625. The routine in block 625 selects pairs of at least some of the images (e.g., based on the images of a pair having overlapping visual content), and determines, for each pair, relative directions between the images of the pair based on shared visual content and/or on other captured linking interconnection information (e.g., movement information) related to the images of the pair (whether movement directly from the acquisition location for one image of a pair to the acquisition location of another image of the pair, or instead movement between those starting and ending acquisition locations via one or more other intermediary acquisition locations of other images). The routine in block 625 may further optionally use at least the relative direction information for the pairs of images to determine global relative positions of some or all of the images to each other in a common coordinate system, and/or generate the inter-image links and corresponding user-selectable controls as noted above. Additional details are included elsewhere herein regarding creating such a linked set of images.

After block 625, or if it is instead determined in block 620 that the instructions or other information received in block 605 are not to determine a linked set of images, the routine continues to block 635 to determine whether the instructions received in block 605 indicate to generate other mapping information for an indicated building (e.g., a floor plan), and if so the routine continues to perform some or all of blocks 637-685 to do so, and otherwise continues to block 690. In block 637, the routine optionally obtains additional information about the building, such as from activities performed during acquisition and optionally analysis of the images, and/or from one or more external sources (e.g., online databases, information provided by one or more end users, etc.)— such additional information may include, for example, exterior dimensions and/or shape of the building, additional images and/or annotation information acquired corresponding to particular locations external to the building (e.g., surrounding the building and/or for other structures on the same property, from one or more overhead locations, etc.), additional images and/or annotation information acquired corresponding to particular locations within the building (optionally for locations different from acquisition locations of the acquired panorama images or other images), etc.

After block 637, the routine continues to block 640 to select the next room (beginning with the first) for which one or more images (e.g., 360° panorama images) acquired in the room are available, and to analyze the visual data of the image(s) for the room to determine a room shape (e.g., by determining at least wall locations), optionally along with determining uncertainty information about walls and/or other parts of the room shape, and optionally including identifying other wall and floor and ceiling elements (e.g., wall structural elements/features, such as windows, doorways and stairways and other inter-room wall openings and connecting passages, wall borders between a wall and another wall and/or ceiling and/or floor, etc.) and their positions within the determined room shape of the room. In some embodiments, the room shape determination may include using boundaries of the walls with each other and at least one of the floor or ceiling to determine a 2D room shape (e.g., using one or trained machine learning models), while in other embodiments the room shape determination may be performed in other manners (e.g., by generating a 3D point cloud of some or all of the room walls and optionally the ceiling and/or floor, such as by analyzing at least visual data of the panorama image and optionally additional data captured by an image acquisition device or associated mobile computing device, optionally using one or more of SfM (Structure from Motion) or SLAM (Simultaneous Location And Mapping) or MVS (Multi-View Stereo) analysis). In addition, the activities of block 645 may further optionally determine and use initial pose information for each of those panorama images (e.g., as supplied with acquisition metadata for the panorama image), and/or obtain and use additional metadata for each panorama image (e.g., acquisition height information of the camera device or other image acquisition device used to acquire a panorama image relative to the floor and/or the ceiling). Additional details are included elsewhere herein regarding determining room shapes and identifying additional information for the rooms. After block 640, the routine continues to block 645, where it determines whether there are more rooms for which to determine room shapes based on images acquired in those rooms, and if so returns to block 640 to select the next such room for which to determine a room shape.

If it is instead determined in block 645 that there are not more rooms for which to generate room shapes, the routine continues to block 660 to determine whether to further generate at least a partial floor plan for the building (e.g., based at least in part on the determined room shape(s) from block 640, and optionally further information regarding how to position the determined room shapes relative to each other). If not, such as when determining only one or more room shapes without generating further mapping information for a building (e.g., to determine the room shape for a single room based on one or more images acquired in the room by the ICA system), the routine continues to block 688. Otherwise, the routine continues to block 665 to retrieve one or more room shapes (e.g., room shapes generated in block 645) or otherwise obtain one or more room shapes (e.g., based on human-supplied input) for rooms of the building, whether 2D or 3D room shapes, and then continues to block 670. In block 670, the routine uses the one or more room shapes to create an initial floor plan (e.g., an initial 2D floor plan using 2D room shapes and/or an initial 3D floor plan using 3D room shapes), such as a partial floor plan that includes one or more room shapes but less than all room shapes for the building, or a complete floor plan that includes all room shapes for the building. If there are multiple room shapes, the routine in block 670 further determines positioning of the room shapes relative to each other, such as by using visual overlap between images from multiple acquisition locations to determine relative positions of those acquisition locations and of the room shapes surrounding those acquisition locations, and/or by using other types of information (e.g., using connecting inter-room passages between rooms, optionally applying one or more constraints or optimizations, etc.). In at least some embodiments, the routine in block 670 further refines some or all of the room shapes by generating a binary segmentation mask that covers the relatively positioned room shape(s), extracting a polygon representing the outline or contour of the segmentation mask, and separating the polygon into the refined room shape(s). Such a floor plan may include, for example, relative position and shape information for the various rooms without providing any actual dimension information for the individual rooms or building as a whole, and may further include multiple linked or associated sub-maps (e.g., to reflect different stories, levels, sections, etc.) of the building. The routine further optionally associates positions of the doors, wall openings and other identified wall elements on the floor plan.

After block 670, the routine optionally performs one or more steps 680-685 to determine and associate additional information with the floor plan. In block 680, the routine optionally estimates the dimensions of some or all of the rooms, such as from analysis of images and/or their acquisition metadata or from overall dimension information obtained for the exterior of the building, and associates the estimated dimensions with the floor plan—it will be appreciated that if sufficiently detailed dimension information were available, architectural drawings, blueprints, etc. may be generated from the floor plan. After block 680, the routine continues to block 683 to optionally associate further information with the floor plan (e.g., with particular rooms or other locations within the building), such as additional existing images with specified positions and/or annotation information. In block 685, if the room shapes from block 645 are not 3D room shapes, the routine further optionally estimates heights of walls in some or all rooms, such as from analysis of images and optionally sizes of known objects in the images, as well as height information about a camera when the images were acquired, and uses that height information to generate 3D room shapes for the rooms. The routine further optionally uses the 3D room shapes (whether from block 640 or block 685) to generate a 3D computer model floor plan of the building, with the 2D and 3D floor plans being associated with each other—in other embodiments, only a 3D computer model floor plan may be generated and used (including to provide a visual representation of a 2D floor plan if so desired by using a horizontal slice of the 3D computer model floor plan).

After block 685, or if it is instead determined in block 660 not to determine a floor plan, the routine continues to block

688 to store the determined room shape(s) and/or generated mapping information and/or other generated information, to optionally provide some or all of that information to one or more recipients (e.g., to block 440 of routine 400 if invoked from that block), and to optionally further use some or all of the determined and generated information, such as to provide the generated 2D floor plan and/or 3D computer model floor plan for display on one or more client devices and/or to one or more other devices for use in automating navigation of those devices and/or associated vehicles or other entities, to similarly provide and use information about determined room shapes and/or a linked set of panorama images and/or about additional information determined about contents of rooms and/or passages between rooms, etc.

If it is instead determined in block 635 that the information or instructions received in block 605 are not to generate mapping information for an indicated building, the routine continues instead to block 690 to perform one or more other indicated operations as appropriate. Such other operations may include, for example, receiving and responding to requests for previously generated floor plans and/or previously determined room shapes and/or other generated information (e.g., requests for such information for display on one or more client devices, requests for such information to provide it to one or more other devices for use in automated navigation, etc.), obtaining and storing information about buildings for use in later operations (e.g., information about dimensions, numbers or types of rooms, total square footage, adjacent or nearby other buildings, adjacent or nearby vegetation, exterior images, etc.), etc.

After blocks 688 or 690, the routine continues to block 695 to determine whether to continue, such as until an explicit indication to terminate is received, or instead only if an explicit indication to continue is received. If it is determined to continue, the routine returns to block 605 to wait for and receive additional instructions or information, and otherwise continues to block 699 and ends.

While not illustrated with respect to the automated operations shown in the example embodiment of FIGS. 6A-6B, in some embodiments human users may further assist in facilitating some of the operations of the MIGM system, such as for operator users and/or end users of the MIGM system to provide input of one or more types that is further used in subsequent automated operations. As non-exclusive examples, such human users may provide input of one or more types as follows: to provide input to assist with the linking of a set of images, such as to provide input in block 625 that is used as part of the automated operations for that block (e.g., to specify or adjust initial automatically determined directions between one or more pairs of images, to specify or adjust initial automatically determined final global positions of some or all of the images relative to each other, etc.); to provide input in block 637 that is used as part of subsequent automated operations, such as one or more of the illustrated types of information about the building; to provide input with respect to block 640 that is used as part of subsequent automated operations, such as to specify or adjust initial automatically determined element locations and/or estimated room shapes and/or to manually combine information from multiple estimated room shapes for a room (e.g., separate room shape estimates from different images acquired in the room) to create a final room shape for the room and/or to specify or adjust initial automatically determined information about a final room shape, etc.; to provide input with respect to block 670, that is used as part of subsequent operations, such as to specify or adjust initial automatically determined positions of room shapes within a floor plan being generated and/or to specify or adjust initial automatically determined room shapes themselves within such a floor plan; to provide input with respect to one or more of blocks 680 and 683 and 685 that is used as part of subsequent operations, such as to specify or adjust initial automatically determined information of one or more types discussed with respect to those blocks; and/or to specify or adjust initial automatically determined pose information (whether initial pose information or subsequent updated pose information) for one or more of the panorama images; etc. Additional details are included elsewhere herein regarding embodiments in which one or more human users provide input that is further used in additional automated operations of the BAMDM system.

FIG. 7 illustrates an example embodiment of a flow diagram for a Building Information Access system routine 700. The routine may be performed by, for example, execution of a building information access client computing device 175 and its software system(s) (not shown) of FIG. 1, a client computing device 390 of FIG. 3, and/or a building information access viewer or presentation system as described elsewhere herein, such as to receive and display generated floor plans and/or other mapping information (e.g., determined room structural layouts/shapes, etc.) for a defined area that optionally includes visual indications of one or more determined image acquisition locations, to obtain and display information about images matching one or more indicated target images, to display additional information (e.g., images) associated with particular acquisition locations in the mapping information, to obtain and display guidance acquisition instructions provided by the BAMDM system and/or other sources (e.g., with respect to other images acquired during that acquisition session and/or for an associated building, such as part of a displayed GUI), to obtain and display explanations or other descriptions of matching between two or more buildings or properties, etc. In the example of FIG. 7, the presented mapping information is for a building (such as an interior of a house), but in other embodiments, other types of mapping information may be presented for other types of buildings or environments and used in other manners, as discussed elsewhere herein.

The illustrated embodiment of the routine begins at block 705, where instructions or information are received. At block 710, the routine determines whether the received instructions or information in block 705 are to display determined information for one or more target buildings, and if so continues to block 715 to determine whether the received instructions or information in block 705 are to select one or more target buildings using specified criteria (e.g., based at least in part on an indicated building), and if not continues to block 720 to obtain an indication of a target building to use from the user (e.g., based on a current user selection, such as from a displayed list or other user selection mechanism; based on information received in block 705; etc.). Otherwise, if it is determined in block 715 to select one or more target buildings from specified criteria (e.g., based at least in part on an indicated building), the routine continues instead to block 725, where it obtains indications of one or more search criteria to use, such as from current user selections or as indicated in the information or instructions received in block 705, and then searches stored information about buildings to determine one or more of the buildings that satisfy the search criteria or otherwise obtains indications of one or more such matching buildings, such as information that is currently or previously generated by the BAMDM system (with one example of operations of such a system being further discussed with respect to FIGS. 4A-4B, and with the BAMDM system optionally invoked in block 720 to obtain such information). In the illustrated embodiment, the routine then further selects a best match target building from the one or more returned buildings (e.g., the returned other building with the highest similarity or other matching rating for the specified criteria, or using another selection technique indicated in the instructions or other information received in block 705), while in other embodiments the routine may instead present multiple candidate buildings that satisfy the search criteria (e.g., in a ranked order based on degree of match) and receive a user selection of the target building from the multiple candidates.

After blocks 720 or 725, the routine continues to block 735 to retrieve a floor plan for the target building and/or other generated mapping information for the building (e.g., a group of inter-linked images for use as part of a virtual tour), and optionally indications of associated linked information for the building interior and/or a surrounding location external to the building, and/or information about one or more generated explanations or other descriptions of why the target building is selected as matching specified criteria (e.g., based in part or in whole on one or more other indicated buildings), and selects an initial view of the retrieved information (e.g., a view of the floor plan, a particular room shape, a particular image, etc., optionally along with generated explanations or other descriptions of why the target building is selected to be matching if such information is available). In block 740, the routine then displays or otherwise presents the current view of the retrieved information, and waits in block 745 for a user selection. After a user selection in block 745, if it is determined in block 750 that the user selection corresponds to adjusting the current view for the current target building (e.g., to change one or more aspects of the current view), the routine continues to block 755 to update the current view in accordance with the user selection, and then returns to block 740 to update the displayed or otherwise presented information accordingly. The user selection and corresponding updating of the current view may include, for example, displaying or otherwise presenting a piece of associated linked information that the user selects (e.g., a particular image associated with a displayed visual indication of a determined acquisition location, such as to overlay the associated linked information over at least some of the previous display; a particular other image linked to a current image and selected from the current image using a user-selectable control overlaid on the current image to represent that other image; etc.), and/or changing how the current view is displayed (e.g., zooming in or out; rotating information if appropriate; selecting a new portion of the floor plan to be displayed or otherwise presented, such as with some or all of the new portion not being previously visible, or instead with the new portion being a subset of the previously visible information; etc.). If it is instead determined in block 750 that the user selection is not to display further information for the current target building (e.g., to display information for another building, to end the current display operations, etc.), the routine continues instead to block 795, and returns to block 705 to perform operations for the user selection if the user selection involves such further operations.

If it is instead determined in block 710 that the instructions or other information received in block 705 are not to present information representing a building, the routine continues instead to block 760 to determine whether the instructions or other information received in block 705 correspond to identifying other images (if any) corresponding to one or more indicated target images, and if so continues to blocks 765-770 to perform such activities. In particular, the routine in block 765 receives the indications of the one or more target images for the matching (such as from information received in block 705 or based on one or more current interactions with a user) along with one or more matching criteria (e.g., an amount of visual overlap), and in block 770 identifies one or more other images (if any) that match the indicated target image(s), such as by interacting with the ICA and/or MIGM systems to obtain the other image(s). The routine then displays or otherwise provides information in block 770 about the identified other image(s), such as to provide information about them as part of search results, to display one or more of the identified other image(s), etc. If it is instead determined in block 760 that the instructions or other information received in block 705 are not to identify other images corresponding to one or more indicated target images, the routine continues instead to block 775 to determine whether the instructions or other information received in block 705 correspond to obtaining and providing guidance acquisition instructions during an image acquisition session with respect to one or more indicated target images (e.g., a most recently acquired image), and if so continues to block 780, and otherwise continues to block 790. In block 780, the routine obtains information about guidance acquisition instructions of one or more types, such as by interacting with the ICA system, and displays or otherwise provides information in block 780 about the guidance acquisition instructions, such as by overlaying the guidance acquisition instructions on a partial floor plan and/or recently acquired image in manners discussed in greater detail elsewhere herein.

In block 790, the routine continues instead to perform other indicated operations as appropriate, such as to configure parameters to be used in various operations of the system (e.g., based at least in part on information specified by a user of the system, such as a user of a mobile device who acquires one or more building interiors, an operator user of the BAMDM and/or MIGM systems, etc., including for use in personalizing information display for a particular user in accordance with his/her preferences), to obtain and store other information about users of the system, to respond to requests for generated and stored information, to perform any housekeeping tasks, etc.

Following blocks 770 or 780 or 790, or if it is determined in block 750 that the user selection does not correspond to the current building, the routine proceeds to block 795 to determine whether to continue, such as until an explicit indication to terminate is received, or instead only if an explicit indication to continue is received. If it is determined to continue (including if the user made a selection in block 745 related to a new building to present), the routine returns to block 705 to await additional instructions or information (or to continue directly on to block 735 if the user made a selection in block 745 related to a new building to present), and if not proceeds to step 799 and ends.

Aspects of the present disclosure are described herein with reference to flowchart illustrations and/or block diagrams of methods, apparatus (systems), and computer program products according to embodiments of the present disclosure. It will be appreciated that each block of the flowchart illustrations and/or block diagrams, and combinations of blocks in the flowchart illustrations and/or block diagrams, can be implemented by computer readable program instructions. It will be further appreciated that in some implementations the functionality provided by the routines discussed above may be provided in alternative ways, such as being split among more routines or consolidated into fewer routines. Similarly, in some implementations illustrated routines may provide more or less functionality than is described, such as when other illustrated routines instead lack or include such functionality respectively, or when the amount of functionality that is provided is altered. In addition, while various operations may be illustrated as being performed in a particular manner (e.g., in serial or in parallel, or synchronous or asynchronous) and/or in a particular order, in other implementations the operations may be performed in other orders and in other manners. Any data structures discussed above may also be structured in different manners, such as by having a single data structure split into multiple data structures and/or by having multiple data structures consolidated into a single data structure. Similarly, in some implementations illustrated data structures may store more or less information than is described, such as when other illustrated data structures instead lack or include such information respectively, or when the amount or types of information that is stored is altered.

From the foregoing it will be appreciated that, although specific embodiments have been described herein for purposes of illustration, various modifications may be made without deviating from the spirit and scope of the invention. Accordingly, the invention is not limited except as by corresponding claims and the elements recited by those claims. In addition, while certain aspects of the invention may be presented in certain claim forms at certain times, the inventors contemplate the various aspects of the invention in any available claim form. For example, while only some aspects of the invention may be recited as being embodied in a computer-readable medium at particular times, other aspects may likewise be so embodied.

What is claimed is:

1. A computer-implemented method comprising:
   receiving, by one or more computing devices, one or more search criteria that indicate a house with multiple rooms;
   obtaining, by the one or more computing devices, information about the indicated house that includes a floor plan for the indicated house having information about at least two-dimensional room shapes and relative positions of the multiple rooms, and that further includes a plurality of attributes associated with the indicated house;
   generating, by the one or more computing devices and using the obtained information about the indicated house, an adjacency graph that represents the indicated house and stores the plurality of attributes, the adjacency graph having multiple hierarchical levels including a building level representing all of the indicated house and further including a room level that is below the building level and that has multiple nodes each associated with one of the multiple rooms and storing information about one or more of the attributes that correspond to the associated room, and the adjacency graph further having multiple edges between the multiple nodes that are each between two nodes and represent an adjacency in the indicated house of the associated rooms for those two nodes;
   generating, by the one or more computing devices and using representation learning, a hierarchy of multiple vector embeddings for the indicated house that represent information from the multiple hierarchical levels of the adjacency graph and that encode information in a vector format including at least some of the plurality of attributes of the indicated house, wherein the multiple vector embeddings include multiple room-level vector embeddings that each corresponds to one of the nodes at the room level of the adjacency graph and encodes information about the associated room for that node, and that further include a building-level vector embedding corresponding to the building level of the adjacency graph and representing all of the indicated house and that is above the multiple room-level vector embeddings in the hierarchy and is based at least in part on a combination of the multiple room-level vector embeddings;
   determining, by the one or more computing devices, search results for the one or more indicated criteria that include at least one other house matching the indicated house, including:
      obtaining, by the one or more computing devices, and for each of a plurality of other houses, multiple additional hierarchical vector embeddings for that other house that encode information in a vector format including multiple additional attributes of that other house, the multiple additional hierarchical vector embeddings including multiple additional room-level vector embeddings each encoding information about one of multiple additional rooms of that other house, and further including an additional building-level vector embedding representing all of that other house and that is based at least in part on a combination of the multiple additional room-level vector embeddings;
      determining, by the one or more computing devices, and for each of the plurality of other houses, an overall degree of matching for that other house to the indicated house by comparing the building-level vector embedding for the indicated house and the additional building-level vector embedding for that other house, and further degrees of matching of the additional room-level vector embeddings for that other house to the room-level vector embeddings for the indicated house; and
      selecting, by the one or more computing devices, one or more of the plurality of other houses whose determined overall degrees of matching to the indicated house are above a defined threshold, and using the selected one or more other houses as the determined at least one other house;
   determining, by the one or more computing devices and for each of the determined at least one other houses, an explanation of the matching for that other house to the indicated house, including selecting one or more of the additional room-level vector embeddings of that other house having determined further degrees of matching above a further determined threshold, and using at least some of the multiple additional attributes for that other house that are associated with the selected one or more additional room-level vector embeddings as part of the explanation of the matching for that other house to the indicated house; and
   presenting, by the one or more computing devices, the determined search results with information about each of the determined at least one other houses that includes attributes of that determined at least one other house and that further includes the determined explanation of the matching for that determined at least one other house to the indicated house.

2. The computer-implemented method of claim 1 wherein the obtaining of the information about the indicated house includes analyzing, by the one or more computing devices, visual data of a plurality of images acquired in the multiple rooms of the indicated house to identify features in the multiple rooms of the indicated house that include at least appliances and fixtures and surface materials;

wherein the plurality of attributes includes individual characteristics of each of the multiple rooms from the floor plan including at least a room type, and further includes the identified features in the multiple rooms, and further includes overall characteristics of the indicated house including at least a building layout characteristic that is based at least in part on adjacency information from the multiple edges of the adjacency graph; and wherein the generating of the hierarchy of the multiple vector embeddings for the indicated house includes:

encoding, by the one or more computing devices and for each of the multiple room-level vector embeddings corresponding to one of the nodes associated with one of the multiple rooms, information in that room-level vector embedding including the individual characteristics of that one room and further including at least one of the identified features that is associated with that one room; and encoding, by the one or more computing devices and for the building-level vector embedding, information in the building-level vector embedding including the overall characteristics of the indicated house and further including at least some of the individual characteristics of each of the multiple rooms and at least some of identified features.

3. The computer-implemented method of claim 2 wherein the indicated house has multiple stories each having a subset of the multiple rooms, wherein the generating of the hierarchy of the multiple vector embeddings for the indicated house further includes:

generating, by the one or more computing devices, multiple story-level vector embeddings that are between the building-level vector embedding and the multiple room-level vector embeddings in the hierarchy and that each represents one of the multiple stories, and wherein each of story-level vector embeddings has multiple children vector embeddings that are each one of the room-level vector embeddings for one of the multiple rooms in the subset for the story represented by that story-level vector embedding and is based at least in part information encoded in the multiple children vector embeddings; and generating, by the one or more computing devices, multiple image-level vector embeddings that are below the multiple room-level vector embeddings in the hierarchy and that each represents one of the plurality of images, wherein each of the room-level vector embeddings has one or more further children vector embeddings that are each one of the image-level vector embeddings representing one of the plurality of images that is acquired in the room represented by that room-level vector embedding, and is based at least in part on information encoded in the one or more further children vector embeddings for that room-level vector embedding;

wherein the obtaining of the multiple additional hierarchical vector embeddings for each of the other houses further includes obtaining multiple additional story-level vector embeddings each encoding information about one of multiple additional stories of that other house, and that further includes multiple additional image-level vector embeddings each encoding information about one of multiple additional images acquired in that other house;

wherein the determining of the overall degree of matching for each of the plurality of other houses includes further comparing, by the one or more computing devices, the story-level vector embeddings for the indicated house to the additional story-level vector embeddings for that other house, and the room-level vector embeddings for the indicated house to the additional room-level vector embeddings for that other house, and the image-level vector embeddings for the indicated house to the additional image-level vector embeddings for that other house, and combining information from the further comparing with the comparing; and wherein the determining of the explanation of matching for each of the determined at least one other houses to the indicated house further includes using information from one or more of the additional story-level vector embeddings and additional image-level vector embeddings for that other house that have degrees of matching to the story-level vector embeddings and image-level vector embeddings for the indicated house above the further determined threshold.

4. The computer-implemented method of claim 2 wherein the at least some attributes of the indicated house include objective attributes about the indicated house that are able to be independently verified and further include one or more subjective attributes for the indicated house that are predicted by one or more trained machine learning models, wherein the multiple additional attributes of each of the plurality of other houses include objective attributes about that other house that are able to be independently verified and further include one or more additional subjective attributes for that other house that are predicted by the one or more trained machine learning models, wherein the one or more subjective attributes and the one or more additional subjective attributes include at least one of an atypical floor plan that differs from typical floor plans, or an open floor plan, or an accessible floor plan, or a non-standard floor plan, and wherein the at least some additional attributes of each of the determined at least one other buildings includes at least one of the objective attributes about that other house and further includes at least one of the subjective attributes about that other house.

5. A computer-implemented method comprising:

obtaining, by one or more computing devices, information about an indicated building with multiple rooms, including a floor plan for the indicated building having information about the multiple rooms that includes at least two-dimensional room shapes and relative positions of the multiple rooms;

generating, by the one or more computing devices and using at least the floor plan, a graph that represents the indicated building and that stores a plurality of attributes associated with the indicated building including information about room adjacencies between the multiple rooms, wherein the graph includes a building node representing all of the indicated building and further includes multiple room nodes that are below the building node and are each associated with one of the multiple rooms and each store information about one or more of the attributes corresponding to the associated room for that room node;

generating, by the one or more computing devices, a hierarchy of multiple vector embeddings for the indicated building that represent information from the graph, wherein the multiple vector embeddings include multiple room-level vector embeddings that each corresponds to one of the room nodes and encodes information about the associated room for that node including a room shape of that associated room and one or more of the plurality of attributes corresponding to that associated room, and further include a building-level vector embedding that is above the multiple room-level vector embeddings in the hierarchy and corresponds to the building node and encodes information about the indicated building including the information about the room adjacencies and at least some of the plurality of attributes and is based at least in part on information from the multiple room-level vector embeddings;

determining, by the one or more computing devices, at least one other building matching the indicated building, including:

obtaining, by the one or more computing devices, and for each of a plurality of other buildings, multiple additional vector embeddings for that other building including multiple additional room-level vector embeddings each encoding information about one of multiple additional rooms of that other building, and further including an additional building-level vector embedding that encodes information about additional attributes of that other building and is based at least in part on the multiple additional room-level vector embeddings for that other building;

determining, by the one or more computing devices, and for each of the plurality of other buildings, an overall degree of matching between the building-level vector embedding for the indicated building and the additional building-level vector embedding for that other building, and further degrees of matching between the room-level vector embeddings for the indicated building and the additional room-level vector embeddings for that other building; and selecting, by the one or more computing devices, one or more of the plurality of other buildings having additional building-level vector embeddings with determined overall degrees of matching to the building-level vector embedding for the indicated building that are above a determined threshold, and using the selected one or more other buildings as the determined at least one other building;

determining, by the one or more computing devices and for each of the determined at least one other buildings, an explanation of matching for that other building to the indicated building, including, for one or more of the additional room-level vector embeddings of that other building that are selected based at least in part on their determined further degrees of matching to the room-level vector embeddings of the indicated building, using attributes for that other building associated with the selected one or more additional room-level vector embeddings as part of the explanation of matching for that other building; and presenting, by the one or more computing devices, information about the determined at least one other buildings that includes at least some of the additional attributes of each of the determined at least one other buildings and the determined explanation of matching for each of the determined at least one other buildings.

6. The computer-implemented method of claim 5 wherein the obtaining of the information about the indicated building includes receiving one or more search criteria, wherein the determining of the at least one other building matching the indicated building is performed as part of determining search results that satisfy the one or more search criteria and include the determined at least one other building, and wherein the presenting of the information about the determined at least one other buildings includes transmitting, by the one or more computing devices and over one or more computer networks, the determined search results to one or more client devices for display on the one or more client devices.

7. The computer-implemented method of claim 5 wherein the obtaining of the information about the indicated building includes analyzing, by the one or more computing devices, visual data of a plurality of images acquired in the multiple rooms of the indicated building to identify features in the multiple rooms of the indicated building that include at least appliances and fixtures and surface materials;

wherein the plurality of attributes includes individual characteristics of each of the multiple rooms from the floor plan including at least a room type, and further includes the identified features in the multiple rooms, and further includes overall characteristics of the indicated building including at least a building layout characteristic that is based at least in part on the room adjacencies between the multiple rooms; and wherein the generating of the hierarchy of the multiple vector embeddings for the indicated building includes:

encoding, by the one or more computing devices and for each of the multiple room-level vector embeddings corresponding to one of the nodes associated with one of the multiple rooms, information in that room-level vector embedding including the individual characteristics of that one room and further including at least one of the identified features that is associated with that one room; and encoding, by the one or more computing devices and for the building-level vector embedding, information in the building-level vector embedding including the overall characteristics of the indicated building and further including at least some of the individual characteristics of each of the multiple rooms and at least some of identified features.

8. The computer-implemented method of claim 5 wherein the indicated building has multiple stories each having a subset of the multiple rooms, wherein the generating of the hierarchy of the multiple vector embeddings for the indicated building further includes:

generating, by the one or more computing devices, multiple story-level vector embeddings that are between the building-level vector embedding and the multiple room-level vector embeddings in the hierarchy and that each represents one of the multiple stories and encodes information about that one story, and wherein each of story-level vector embeddings has multiple children vector embeddings that are each one of the room-level vector embeddings for one of the multiple rooms in the subset for the story represented by that story-level vector embedding; and generating, by the one or more computing devices, multiple image-level vector embeddings that are below the multiple room-level vector embeddings in the hierarchy and that each represents one of the plurality of images and encodes information about the indicated building from the visual data of that one image, wherein each of the room-level vector embeddings has one or more further children vector embeddings that are each one of the image-level vector embeddings representing one of the plurality of images that is acquired in the room represented by that room-level vector embedding;

wherein the obtaining of the multiple additional vector embeddings for each of the other buildings further includes obtaining multiple additional story-level vector embeddings each encoding information about one of multiple additional stories of that other building, and that further includes multiple additional image-level vector embeddings each encoding information from one of multiple additional images acquired in that other building;

wherein the determining of the overall degree of matching for each of the plurality of other buildings includes comparing, by the one or more computing devices, the multiple vector embeddings for the indicated building to the multiple additional vector embeddings for that other building and combining information from the comparing, wherein the comparing includes comparing the building-level vector embedding for the indicated building to the additional building-level vector embedding for that other building, and the story-level vector embeddings for the indicated building to the additional story-level vector embeddings for that other building, and the room-level vector embeddings for the indicated building to the additional room-level vector embeddings for that other building, and the image-level vector embeddings for the indicated building to the additional image-level vector embeddings for that other building; and wherein the determining of the explanation of matching for each of the determined at least one other buildings to the indicated building further includes using information from one or more of the additional story-level vector embeddings and additional image-level vector embeddings for that other building that have degrees of matching to the story-level vector embeddings and image-level vector embeddings for the indicated building above the further determined threshold.

9. A system comprising:
one or more hardware processors of one or more computing devices; and
one or more memories with stored instructions that, when executed by at least one of the one or more hardware processors, cause at least one computing device of the one or more computing devices to perform automated operations including at least:
  obtaining information about an indicated building having multiple rooms, including multiple room-level vector embeddings each representing a respective one of the multiple rooms and encoding information about a room shape of that one room and about one or more of a plurality of attributes of the indicated building that correspond to that one room, and including a building-level vector embedding that represents the indicated building and encodes information about room adjacencies between at least some of the multiple rooms and about at least some of the plurality of attributes and is further based at least in part on information from the multiple room-level vector embeddings;
  determining, from a plurality of other buildings, at least one other building that matches the indicated building, including:
    determining, for each of the plurality of other buildings, a degree of matching for that other building that is between the building-level vector embedding for the indicated building and an additional building-level vector embedding representing that other building and encoding information about additional attributes of that other building including additional adjacencies between additional rooms of that other building, and further degrees of matching between the room-level vector embeddings for the indicated building and additional room-level vector embeddings for that other building that encode information about the additional rooms of that other building; and
    selecting one or more of the plurality of other buildings based at least in part on the determined degree of matching for that other building, and using the selected one or more other buildings as the determined at least one other building;
  determining, for each of the determined at least one other buildings, an explanation of matching for that other building to the indicated building, including, for one or more of the additional room-level vector embeddings of that other building that are selected based at least in part on their determined further degrees of matching to the room-level vector embeddings of the indicated building, using one or more of the additional attributes for that other building that are associated with the selected one or more additional room-level vector embeddings as part of the explanation of the matching for that other building; and
  providing information about the determined at least one other buildings that includes at least the determined explanation of the matching for each of the determined at least one other buildings to the indicated building, to enable a comparison of the indicated building to the determined at least one other buildings.

10. The system of claim 9 wherein the plurality of attributes include information about the room adjacencies and further include other characteristics of the indicated building and further include characteristics of the multiple rooms, and wherein the obtaining of the information about the indicated building includes:
  obtaining information about the indicated building that includes a floor plan determined for the indicated building based at least in part on analysis of visual data of a plurality of images acquired at multiple acquisition locations within the building, wherein the floor plan has information about the multiple rooms including at least room shapes and relative positions of the multiple rooms and further including the information about the room adjacencies;
  generating, using at least the floor plan, a graph that represents the indicated building and that stores the plurality of attributes associated with the indicated building, wherein the graph includes a building node representing all of the indicated building and further includes multiple room nodes that are each associated with one of the multiple rooms and store information about one or more of the attributes corresponding to the associated one room; and generating, using at least the graph, a hierarchy of multiple vector embeddings for the indicated building that represent information from the graph and include the multiple room-level vector embeddings and the building-level vector embedding, wherein the building-level vector embedding is above the multiple room-level vector embeddings in the hierarchy and is based at least in part on a combination of the multiple room-level vector embeddings.

11. The system of claim 9 wherein the obtaining of the information about the indicated building includes analyzing visual data of a plurality of images acquired in the multiple rooms of the indicated building to identify features in the multiple rooms of the indicated building that include at least appliances and fixtures and surface materials;
  wherein the plurality of attributes includes individual characteristics of each of the multiple rooms from the floor plan including at least a room type, and further includes the identified features in the multiple rooms, and further includes overall characteristics of the indicated building including at least a building layout characteristic that is based at least in part on the room adjacencies between the multiple rooms;
  wherein the automated operations further include generating a hierarchy of multiple vector embeddings for the indicated building that include the multiple room-level vector embeddings and the building-level vector embedding and multiple story-level vector embeddings each representing one of multiple stories of the indicated building and multiple image-level vector embeddings each representing one of the plurality of images, wherein the building-level vector embedding is above the multiple story-level vector embeddings in the hierarchy, wherein the multiple story-level vector embeddings are above the multiple room-level vector embeddings in the hierarchy, and wherein the multiple room-level vector embeddings are above the multiple image-level vector embeddings in the hierarchy;
  wherein the obtaining of the multiple additional vector embeddings for each of the other buildings further includes obtaining multiple additional story-level vector embeddings each encoding information about one of multiple additional stories of that other building, and that further includes multiple additional image-level vector embeddings each encoding information from one of multiple additional images acquired in that other building;
  wherein the determining of the further degrees of matching for each of the plurality of other buildings includes comparing the story-level vector embeddings for the indicated building to additional story-level vector embeddings for that other building, and the room-level vector embeddings for the indicated building to the additional room-level vector embeddings for that other building, and the image-level vector embeddings for the indicated building to additional image-level vector embeddings for that other building; and
  wherein the determining of the explanation of matching for each of the determined at least one other buildings to the indicated building further includes using information from one or more of the additional story-level vector embeddings and additional image-level vector embeddings for that other building that are selected based at least in part on the determined further degrees of matching.

12. The system of claim 9 wherein the at least one computing device includes a server computing device and wherein the one or more computing devices further include a client computing device of a user, and wherein the stored instructions include software instructions that, when executed by the one or more computing devices, cause the one or more computing devices to perform further automated operations including:
  receiving, by the server computing device, one or more search criteria from the client computing device;
  performing, by the server computing device, the determining of the at least one other building that matches the indicated building as part of determining search results that satisfy the one or more search criteria and include the determined at least one other building;
  performing, by the server computing device, the providing of the information about the determined at least one other buildings by transmitting the information about the determined at least one other buildings over one or more computer networks to the client computing device, the transmitted information including the determined search results; and
  receiving, by the client computing device, the transmitted information including the determined search results, and displaying the determined search results on the client computing device.

13. A non-transitory computer-readable medium having stored contents that cause one or more computing devices to perform automated operations, the automated operations including at least:
  generating, by the one or more computing devices and for an indicated building having multiple rooms, information about the indicated building that includes multiple first vector embeddings each representing a respective one of the multiple rooms and encoding information about a room shape of that one room and about one or more of a plurality of attributes of the indicated building that correspond to that one room, and that further includes a second vector embedding that represents the indicated building and encodes information about at least some of the plurality of attributes including indications of room adjacencies between at least some of the multiple rooms and is further based at least in part on information from the multiple first vector embeddings;
  determining, by the one or more computing devices, at least one other building that matches the indicated building, including comparing the second vector embedding for the indicated building to an additional second vector embedding that represents the at least one other building and encodes information about additional attributes of the at least one other building including additional adjacencies between additional rooms of the at least one other building, and comparing the first vector embeddings for the indicated building to additional first vector embeddings for the at least one other building that encode information about the additional rooms of the at least one other building;
  determining, by the one or more computing devices, an explanation of matching of the at least one other building to the indicated building, including, for one or more of the additional first vector embeddings of the at least one other building that are selected based at least in part on the comparing of the first vector embeddings for the indicated building to the additional first vector embeddings, using one or more of the additional attributes for the at least one other building that are associated with the selected one or more additional first vector embeddings as part of the explanation of the matching for the at least one other building; and providing information about the determined at least one other building that includes at least the determined explanation of the matching of the at least one other building to the indicated building.

14. The non-transitory computer-readable medium of claim 13 wherein the plurality of attributes include the information about the room adjacencies and further include other characteristics of the indicated building and further include characteristics of the multiple rooms, and wherein the generating of the information about the indicated building includes:

obtaining, by the one or more computing devices, information about the indicated building that includes a floor plan determined for the indicated building based at least in part on analysis of visual data of a plurality of images acquired at multiple acquisition locations within the building, wherein the floor plan has information about the multiple rooms including at least room shapes and relative positions of the multiple rooms;

generating, by the one or more computing devices and using at least the floor plan, a graph that represents the indicated building and that stores the plurality of attributes associated with the indicated building, wherein the graph includes a building node representing all of the indicated building and further includes multiple room nodes that are each associated with one of the multiple rooms and store information about the one or more of the attributes corresponding to the associated one room; and generating, by the one or more computing devices and using at least the graph, a hierarchy of multiple vector embeddings for the indicated building that represent information from the graph and include the multiple first vector embeddings and the second vector embedding, wherein the second vector embedding is above the multiple first vector embeddings in the hierarchy and is based at least in part on a combination of the multiple first vector embeddings.

15. The non-transitory computer-readable medium of claim 13 wherein the generating of the information about the indicated building includes analyzing visual data of a plurality of images acquired in the multiple rooms of the indicated building to identify features in the multiple rooms of the indicated building that include at least appliances and fixtures and surface materials;

wherein the plurality of attributes includes individual characteristics of each of the multiple rooms from the floor plan including at least a room type, and further includes the identified features in the multiple rooms, and further includes overall characteristics of the indicated building including at least a building layout characteristic that is based at least in part on the room adjacencies between the at least some of the multiple rooms;

wherein the automated operations further include generating a hierarchy of multiple vector embeddings for the indicated building that include the multiple first vector embeddings and the second vector embedding and one or more third vector embeddings each representing a respective one of one or more stories of the indicated building and multiple fourth vector embeddings each representing one of the plurality of images, wherein the second vector embedding is above the one or more third vector embeddings in the hierarchy, wherein the one or more third vector embeddings are above the multiple first vector embeddings in the hierarchy, and wherein the multiple first vector embeddings are above the multiple fourth vector embeddings in the hierarchy;

wherein the determining of the at least one other building includes further comparing the one or more third vector embeddings for the indicated building to one or more additional third vector embeddings for the at least one other building each encoding information about one of one or more additional stories of the at least one other building, and the fourth vector embeddings for the indicated building to additional fourth vector embeddings for the at least one other building each encoding information from one of multiple additional images acquired in the at least one other building; and wherein the determining of the explanation of matching for the at least one other building to the indicated building further includes using information from one or more of the additional third vector embeddings and additional fourth vector embeddings for the at least one other building that are selected based at least in part on the further comparing.

16. The non-transitory computer-readable medium of claim 15 wherein the second vector embedding is a building-level embedding that uses a vector format to represent information about all of the indicated building, wherein the one or more third vector embeddings are story-level embeddings that each uses a vector format to represent information about all of the respective story for that story-level vector embedding, wherein the first vector embeddings are room-level embeddings that each uses a vector format to represent information about all of the respective room for that room-level vector embedding, and wherein the fourth vector embeddings are image-level embeddings that each uses a vector format to represent information about all of the respective image for that image-level vector embedding.

17. The non-transitory computer-readable medium of claim 13 wherein the one or more computing devices include at least one server computing device, and wherein the automated operations further include performing, by the at least one server computing device, the providing of the information about the determined at least one other building by transmitting the information about the determined at least one other building over one or more computer networks to a client computing device, the transmitted information including the determined search results.

18. The non-transitory computer-readable medium of claim 17 wherein the one or more computing devices further include the client computing device, and wherein the automated operations further include receiving, by the client computing device, the transmitted information and displaying the transmitted information on the client computing device.

19. The non-transitory computer-readable medium of claim 13 wherein the determining of the at least one other building further includes:

determining, by the one or more computing devices and for each of a plurality of other buildings, a degree of matching for that other building that is between the second vector embedding for the indicated building and an additional second vector embedding representing that other building and encoding information about additional attributes of that other building including additional adjacencies between additional rooms of that other building, and further degrees of matching between the first vector embeddings for the indicated building and additional first vector embeddings for that other building that encode information about the additional rooms of that other building; and selecting one or more of the plurality of other buildings based at least in part on the determined degree of matching for that other building, and using the selected one or more other buildings as the determined at least one other building.

20. The non-transitory computer-readable medium of claim 13 wherein the indicated building is located on a property having one or more further buildings and one or more external areas, wherein the automated operations further include generating, by the one or more computing devices, information about the property that includes multiple further second vector embeddings each representing a respective one of the one or more further buildings or of the one or more external areas and encoding information about that respective one further building or external area;

wherein the at least one other building is located on an additional property having one or more additional buildings and one or more additional external areas, and has multiple further additional second vector embeddings each representing a respective one of the one or more additional buildings or of the one or more additional external areas and encoding information about that respective one additional building or additional external area;

wherein the determining of the at least one other building is performed as part of determining that the additional property matches the property by further comparing the further second vector embeddings for the indicated building to the further additional second vector embeddings for the additional property, and by combining information from the further comparing and the comparing of the second vector embedding for the indicated building to the additional second vector embedding for the at least one other building;

wherein the determining of the explanation of matching for the at least one other building is performed as part of determining a further explanation of matching of the additional property to the property that is based in part on the explanation of matching for the at least one other building and is further based in part on at least one of the one or more further buildings or of the one or more external areas; and wherein the providing of the information about the determined at least one other building is performed as part of providing information about the additional property that includes the determined further explanation of the matching for the additional property.

21. The non-transitory computer-readable medium of claim 13 wherein the stored contents include software instructions that, when executed by the one or more computing devices, cause the one or more computing devices to perform further automated operations including:

receiving, by the one or more computing devices, one or more search criteria from a client computing device; and identifying, by the one or more computing devices, the indicated building based at least in part on the one or more search criteria, and wherein the determining of the at least one other building that matches the indicated building is performed as part of determining search results that satisfy the one or more search criteria and include the determined at least one other building, and wherein the providing of the information about the determined at least one other building includes providing the determined search results.

22. The non-transitory computer-readable medium of claim 13 wherein the automated operations further include receiving, by the one or more computing devices, information about the indicated building being associated with a user, wherein the determining of the at least one other building is performed in response to the receiving of the information and includes determining information about attributes of the determined at least one other building that are personalized to the user, and wherein the providing of the information about the determined at least one other building includes presenting to the user the information about the attributes of the determined at least other building.

23. The non-transitory computer-readable medium of claim 13 wherein the automated operations further include:

receiving, by the one or more computing devices, information about a group of multiple attributes;

generating, by the one or more computing devices, a representation of a building that has the multiple attributes of the group; and using, by the one or more computing devices, the generated representation of the building as the indicated building.

24. The non-transitory computer-readable medium of claim 13 wherein the automated operations further include:

receiving, by the one or more computing devices, information about a group of multiple buildings that includes the indicated building and one or more additional buildings and that share one or more common characteristics;

performing, by the one or more computing devices, the generating of the information for each of the one or more additional buildings, to generate multiple further first vector embeddings and a further second vector embedding for each of the one or more additional buildings;

determining, by the one or more computing devices, that the at least one other building further matches each of the one or more additional buildings based at least in part on the multiple further first vector embeddings and the further second vector embedding for each of the one or more additional buildings; and performing, by the one or more computing devices, the determining of the explanation of matching of the at least one other building to the indicated building as part of explaining matching of the at least one other building to the multiple buildings of the group based at least in part on the at least one other building including at least some of the shared common characteristics.

25. The non-transitory computer-readable medium of claim 13 wherein the determining of the at least one other building that matches the indicated building includes determining a group of multiple other buildings that each matches the indicated building, wherein the determining of the explanation of matching to the indicated building is performed for each of the multiple other buildings, and wherein the providing of the information about the determined at least one other building includes providing information about the multiple other buildings in a format to enable comparison of the multiple other buildings.

26. The non-transitory computer-readable medium of claim 13 wherein the one or more additional attributes used as part of the explanation of the matching for the at least one other building include one or more subjective attributes generated by one or more trained machine learning models from analysis of at least one of a floor plan for the indicated building as part of the explanation of the matching for the at least one other building or an adjacency graph for the indicated building as part of the explanation of the matching for the at least one other building, the one or more subjective attributes including at least one of an open floor plan, or an accessible floor plan, or a non-standard floor plan.

27. The non-transitory computer-readable medium of claim 13 wherein the one or more additional attributes used as part of the explanation of the matching for the at least one other building include one or more local attributes that are associated with one or more of the additional rooms and are generated based at least in part on one or more other global attributes associated with the at least one other building.

28. The non-transitory computer-readable medium of claim 13 wherein the stored contents include one or more data structures, the one or more data structures including the multiple first vector embeddings for the indicated building and the second vector embedding for the indicated building.

29. The non-transitory computer-readable medium of claim 13 wherein the stored contents include one or more data structures, the one or more data structures including, for each of the determined at least one other buildings, the multiple additional first vector embeddings for that other building and the additional second vector embedding for that other building.

\* \* \* \* \*